US006887650B2

(12) United States Patent
Shimoda et al.

(10) Patent No.: US 6,887,650 B2
(45) Date of Patent: May 3, 2005

(54) TRANSFER METHOD, METHOD OF MANUFACTURING THIN FILM DEVICES, METHOD OF MANUFACTURING INTEGRATED CIRCUITS, CIRCUIT BOARD AND MANUFACTURING METHOD THEREOF, ELECTRO-OPTICAL APPARATUS AND MANUFACTURING METHOD THEREOF, IC CARD, AND ELECTRONIC APPLIANCE

(75) Inventors: Tatsuya Shimoda, Nagano-ken (JP); Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 10/201,268

(22) Filed: Jul. 24, 2002

(65) Prior Publication Data

US 2003/0022403 A1 Jan. 30, 2003

(30) Foreign Application Priority Data

Jul. 24, 2001 (JP) .......................................... 2001-223433
Sep. 17, 2001 (JP) .......................................... 2001-282423
Sep. 17, 2001 (JP) .......................................... 2001-282424

(51) Int. Cl.$^7$ .............................................. H01L 21/78
(52) U.S. Cl. ..................... 430/311; 430/319; 430/320; 438/458; 438/464; 438/149; 438/155; 427/596
(58) Field of Search ................................ 430/311, 319, 430/320; 438/458, 464, 149, 155; 427/596

(56) References Cited

U.S. PATENT DOCUMENTS

| 6,057,067 | A | | 5/2000 | Isberg et al. |
| 6,063,527 | A | | 5/2000 | Nishikawa et al. |
| 6,177,151 | B1 | * | 1/2001 | Chrisey et al. ............. 427/596 |
| 6,372,608 | B1 | | 4/2002 | Shimoda et al. |
| 6,521,511 | B1 | * | 2/2003 | Inoue et al. ................ 438/458 |
| 2003/0224582 | A1 | | 12/2003 | Shimoda et al. |

FOREIGN PATENT DOCUMENTS

| EP | 0 882 999 A1 | 12/1998 |
| EP | 1 017 100 A1 | 7/2000 |
| JP | A 10-12531 | 1/1993 |
| JP | A 10-12529 | 1/1998 |
| JP | A 10-12530 | 1/1998 |
| JP | 10-125929 A | 5/1998 |
| JP | 10-125930 A | 5/1998 |
| JP | A 10-125931 | 5/1998 |
| JP | A 10-177187 | 6/1998 |
| JP | A 10-206896 | 8/1998 |
| JP | 11-20360 | 1/1999 |
| JP | A 11-20360 | 1/1999 |
| JP | A 11-24106 | 1/1999 |
| JP | A 11-26733 | 1/1999 |
| JP | A 11-26734 | 1/1999 |
| JP | A 11-74533 | 3/1999 |
| JP | A 11-97556 | 4/1999 |
| JP | 11-142878 | 5/1999 |
| JP | A 11-243209 | 9/1999 |
| JP | A 11-251517 | 9/1999 |
| JP | 11-251518 | 9/1999 |
| JP | A 11-251518 | 9/1999 |
| JP | A 11-312811 | 11/1999 |
| JP | A 2000-133809 | 5/2000 |
| JP | A 2000-235348 | 8/2000 |
| JP | 2001-7340 A | 1/2001 |
| JP | A 2001-166301 | 6/2001 |
| JP | A 2001-189460 | 7/2001 |
| WO | WO 98/19188 | 5/1998 |
| WO | WO 99/45593 | 9/1999 |

OTHER PUBLICATIONS

U.S. Appl. No. 10/420,840 (corresponds to US 2003–0224582A—Reference No. 2above).
Drobac, "Fluidic Self–Assembly Could Change the Way FPDs Are Made", Information Display, vol. 15, No. 11, pp. 12–16, Nov. 1999.

* cited by examiner

Primary Examiner—John A. McPherson
Assistant Examiner—Daborah Chacko-Davis
(74) Attorney, Agent, or Firm—Oliff & Berridge, PLC

(57) ABSTRACT

A transfer method comprising a step of forming a plurality of transferred bodies on a transfer origin substrate, and a step of applying energy to partial regions corresponding to the transferred bodies to be transferred, and transferring these transferred bodies corresponding to the partial regions onto a transfer destination substrate. A plurality of transferred bodies such as devices or circuits that are to be disposed on a transfer destination substrate with spaces therebetween can be manufactured integrated together on a transfer origin substrate, and hence compared with the case that the transferred bodies are formed on the transfer destination substrate directly, the amount of materials used in the manufacture of the transferred bodies can be reduced, the area efficiency can be greatly improved, and a transfer destination substrate on which a large number of devices or circuits are disposed in scattered locations can be manufactured efficiently and cheaply.

35 Claims, 27 Drawing Sheets

PARTIAL IRRADIATION

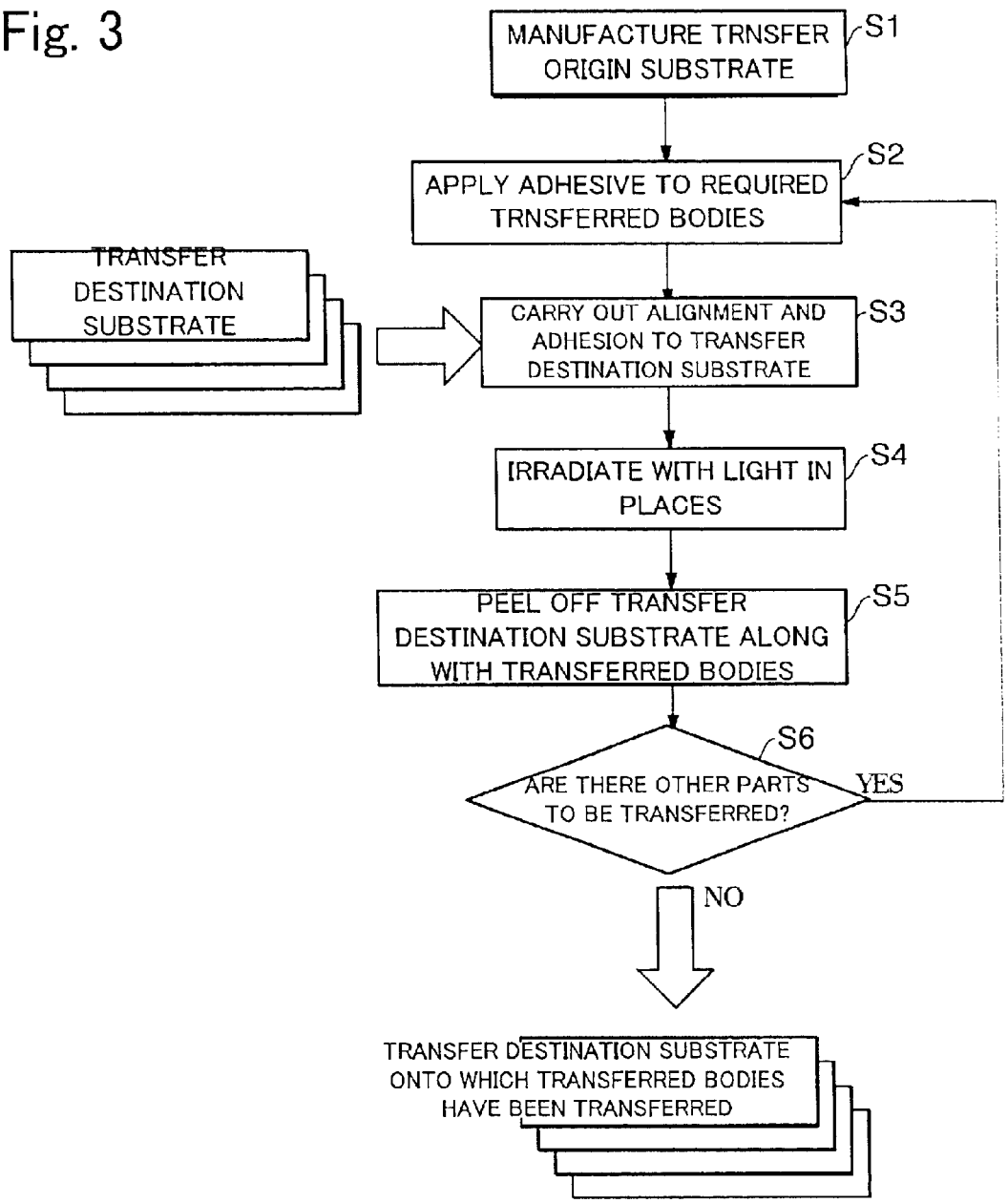

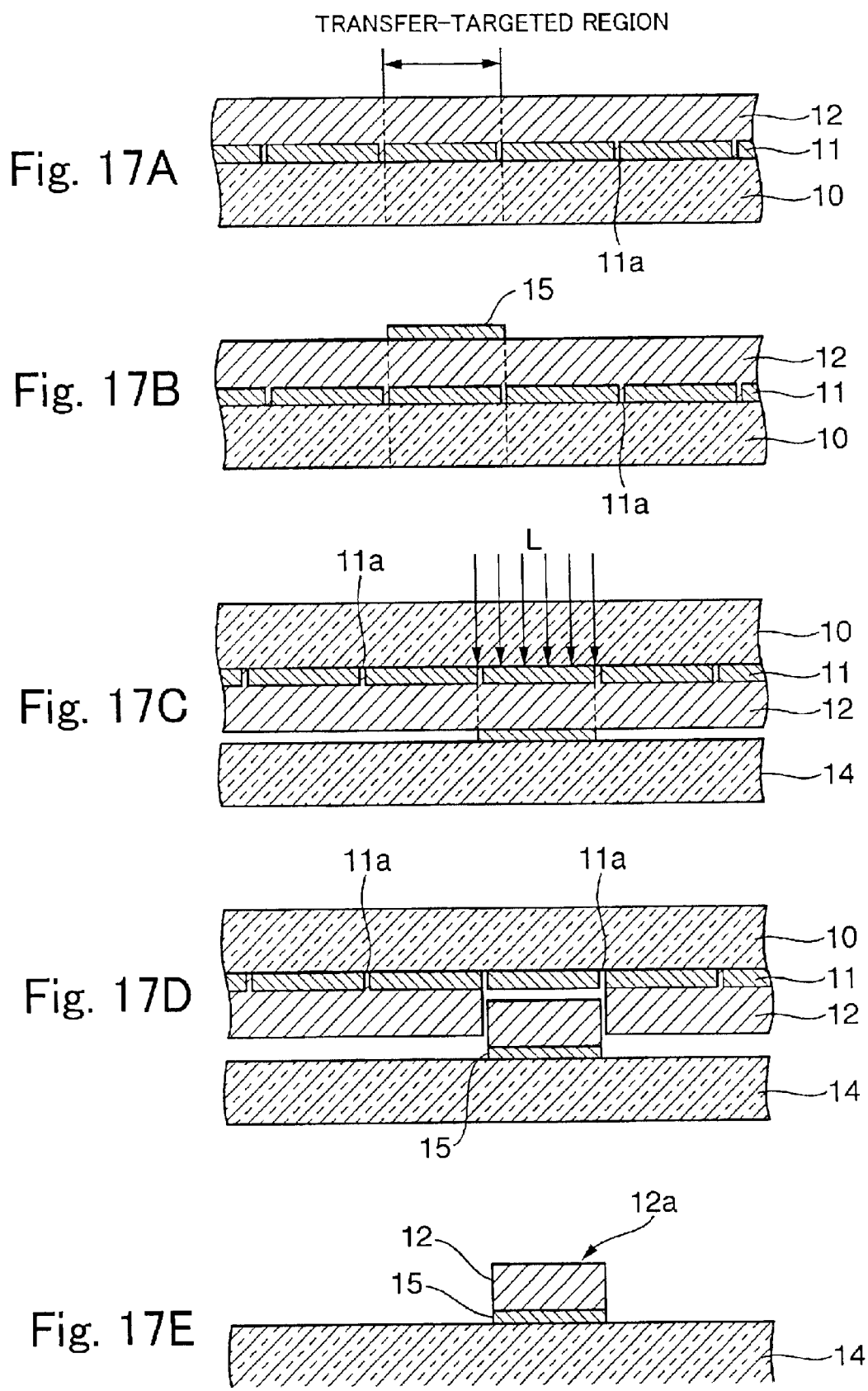

Fig. 20A
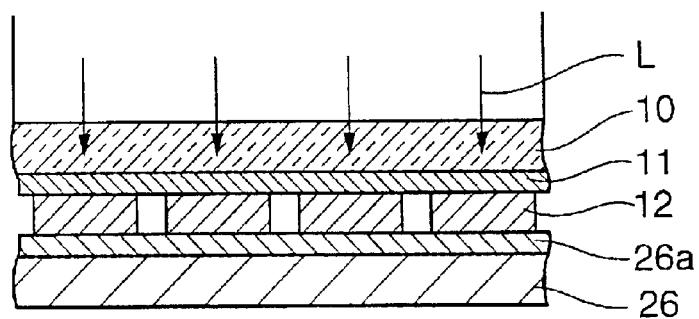
Fig. 20B
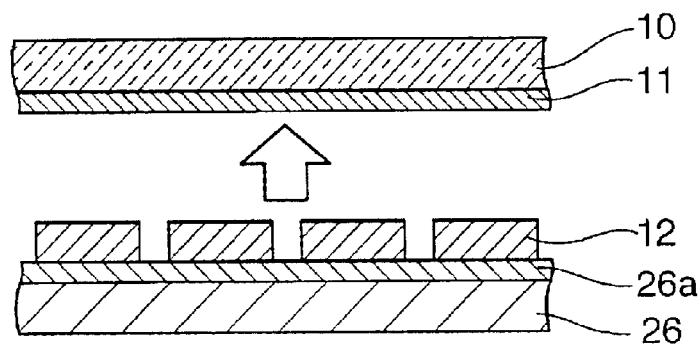
Fig. 20C
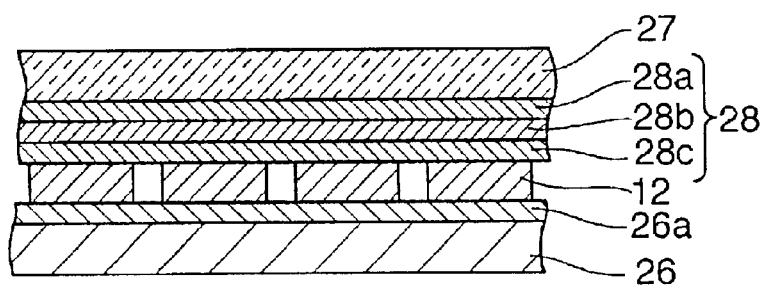
Fig. 20D
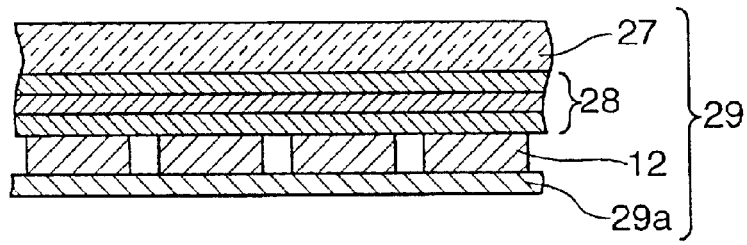
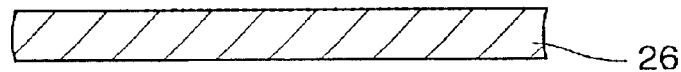

TRANSFER METHOD, METHOD OF MANUFACTURING THIN FILM DEVICES, METHOD OF MANUFACTURING INTEGRATED CIRCUITS, CIRCUIT BOARD AND MANUFACTURING METHOD THEREOF, ELECTRO-OPTICAL APPARATUS AND MANUFACTURING METHOD THEREOF, IC CARD, AND ELECTRONIC APPLIANCE

BACKGROUND OF THE INVENTION

1. Field of the Invention

The present invention relates to a transfer method for devices or circuits, and a circuit board, an electro-optical apparatus, an IC card and an electronic appliance manufactured using the transfer method.

2. Description of the Related Art

Recently, with regard to the manufacture of electro-optical apparatuses such as liquid crystal electro-optical apparatuses having thin film devices such as thin film transistors (TFTs) or thin film diodes (TFDs), there has been research into various art for reducing the amount of thin film device-constituting material discarded through etching and thus greatly reducing the manufacturing cost of the electro-optical apparatuses.

Conventionally, a method developed by Alien Technology called the microstructure technique is known as art for disposing, on a separate substrate, LSI circuits that have been manufactured on a silicon wafer (Information Display, Vol. 15, No. 11 (November 1999)). This microstructure technique is characterized in that the LSI circuits that have been manufactured on the silicon wafer are separated to form microchips (i.e. microstructures), and then a solvent in which the microstructures have been dispersed is made to flow over a substrate in which a pattern of holes for embedding has been formed in advance, thus disposing the microstructures in specific positions on the substrate. According to this microstructure technique, a large number of microstructures that have been formed in advance on a silicon wafer can be disposed in scattered locations on a substrate.

However, with this microstructure technique, there is a drawback in that disposing the microstructures on the substrate with certainty and carrying out accurate alignment are difficult. Furthermore, the directions in which the microstructures are disposed are random, and hence it has been necessary to provide special circuits on the microstructures, for example circuits having symmetry.

Moreover, in the case of the manufacture of color filters for liquid crystal displays, a method in which a transfer technique is used is disclosed in U.S. Pat. No. 6,057,067.

Furthermore, the present applicants have developed, as a method of transferring, onto a transfer body, thin film devices such as TFTs that have been formed on a substrate, a transfer method in which a transferred layer is formed on the substrate via a peeling layer, this is all joined to the transfer body, and then the peeling layer is irradiated with light to bring about peeling, and the substrate is separated away from the peeling layer, and have already filed a patent application (Japanese Patent Application Laid-open No. 10-125931). Similarly, the present applicants have developed a transfer method in which the whole of a transferred layer is joined to a primary transfer body, and then transfer is further carried out onto a secondary transfer body, and have already filed a patent application (Japanese Patent Application Laid-open No. 11-26733).

According to these transfer techniques, functional devices that require a high-temperature process during manufacture can be transferred onto desired substrates, including ones that cannot withstand such high temperatures.

However, with the conventional transfer techniques described above, there have been problems such as the following.

With the above transfer techniques, if an apparatus substrate is formed by transferring onto a transfer destination substrate the whole of a thin film device layer that has been formed on a transfer origin substrate, then, as with conventionally, a process in which the transfer destination substrate is divided into pieces of the required chip size (or small substrate size) by dicing or the like is still necessary. Moreover, in the process of assembling on the final substrate, it is necessary to accurately arrange on the final substrate chips or the like that have become scattered about. This is surprisingly troublesome, and hence there has been a problem that the manufacturing efficiency is prone to dropping.

Moreover, with the above transfer techniques, all of the thin film devices such as TFTs formed on the transfer origin substrate are transferred onto the transfer destination substrate, and hence the larger the area of the substrate, the better the properties, i.e. the higher the output power, the uniformity and so on, required of the laser light irradiated, and hence it becomes difficult to obtain a laser light source that meets the required performance, and moreover large, high-accuracy irradiation equipment becomes necessary for the laser light irradiation. Furthermore, if laser light of high output power is irradiated, then there is a risk that the thin film devices may be heated to a temperature above the limit of heat resistance thereof, resulting in the functions of the thin film devices themselves being lost, and hence there has been a problem that the transfer process itself becomes difficult.

Consequently, it is an object of the present invention to provide a transfer method according to which some only of a plurality of devices or circuits can be transferred between substrates during thin film apparatus manufacture, without it being necessary to carry out a step of dividing (dicing) into chips or the like.

Moreover, it is an object of the present invention to provide a transfer method according to which some of a plurality of devices or circuits formed on a substrate can be transferred directly from the substrate to another transferred body such as a circuit board.

SUMMARY OF THE INVENTION

In the present invention, a transfer method for transferring transferred bodies comprises: a step of forming a plurality of transferred bodies on a transfer origin substrate; and a step of applying energy to partial regions corresponding to the transferred bodies to be transferred, and transferring the transferred bodies corresponding to the partial regions onto a transfer destination substrate.

According to the transfer method of the present invention, a plurality of transferred bodies such as devices or circuits that are to be disposed on a transfer destination substrate with spaces therebetween can be manufactured integrated together on a transfer origin substrate, and hence compared with the case that the transferred bodies are formed on the transfer destination substrate directly, the amount of materials used in the manufacture of the transferred bodies can be reduced, the area efficiency can be greatly improved, and a transfer destination substrate on which a large number of devices or circuits are disposed in scattered locations can be manufactured efficiently and cheaply.

Moreover, according to the transfer method of the present invention, it becomes easy to carry out selection and elimination before transfer on a large number of devices or circuits that have been manufactured concentrated together on a transfer origin substrate, and hence the product yield can be improved.

Furthermore, according to the transfer method of the present invention, devices or circuits that are either the same as or different to one another can be built up on one another and combined, and hence by combining devices that are manufactured under different process conditions to one another, it is possible to provide devices or circuits having a layered structure for which manufacture has been difficult hitherto, and moreover devices or circuits having a three-dimensional structure can be manufactured easily.

Here, in the present invention, 'transferred bodies' refers to TFTs, diodes, resistors, inductors, capacitors, and other single devices that may be either active or passive, circuits (chips) such as integrated circuits in which devices are integrated and wired together so as to achieve a specific function, circuit parts comprising a combination of a plurality of devices, and whole apparatuses or apparatus parts that are constituted by combining one or more circuits such as integrated circuits so as to achieve a specific function. There are thus no limitations on the constitution, shape or size of the 'transferred bodies'.

Moreover, 'transfer origin substrate' refers to a substrate on which a plurality of transferred bodies are formed integrated together, and does not necessarily have to be flat. For example, the transfer origin substrate may be such that the transferred bodies are formed on a spherical surface, or may be a substrate that does not have a fixed rigidity, for example a flexible film.

Furthermore 'transfer destination substrate' refers to a target on which some of the transferred bodies are to be disposed ultimately, and does not necessarily have to be flat. For example, the transfer destination substrate may be such that the transferred bodies are formed on a spherical surface, or may be a substrate that does not have a fixed rigidity, for example a flexible film.

Furthermore, a 'partial region' may be a region corresponding to one of the transferred bodies, or may be a region corresponding to a plurality of the transferred bodies.

Moreover, in the present invention, a transfer method for transferring transferred bodies comprises: a step of forming a plurality of transferred bodies on a transfer origin substrate; and a step of applying energy to partial regions corresponding to the transferred bodies to be transferred, and transferring the transferred bodies corresponding to the partial regions onto transfer destination substrates; wherein, in the step of transferring onto the transfer destination substrates, after transferring the transferred bodies onto one of the transfer destination substrates, a step of applying energy to other partial regions corresponding to other transferred bodies on the transfer origin substrate, and transferring the other transferred bodies corresponding to the other partial regions onto another transfer destination substrates is repeated.

According to the present invention, transferred bodies that have been manufactured integrated together on a transfer origin substrate can be transferred partial region by partial region onto one transfer destination substrate after another, and hence on a production line it becomes possible to dispose the same transferred bodies onto a large number of transfer destination substrates efficiently and continuously. The amount of work required per transfer destination substrate can thus be reduced, and it becomes possible to greatly reduce the manufacturing cost due to manufacturing the transferred bodies integrated together on the transfer origin substrate.

Furthermore, in the present invention, a transfer method for transferring transferred bodies comprises: a step of forming a plurality of transferred bodies on a transfer origin substrate; a step of making the transfer origin substrate face an intermediate transfer substrate, and transferring the transferred bodies onto the intermediate transfer substrate; and a step of making the intermediate transfer substrate face a transfer destination substrate, and transferring the transferred bodies onto the transfer destination substrate; wherein, in at least either the step of transferring the transferred bodies onto the intermediate transfer substrate or the step of transferring the transferred bodies onto the transfer destination substrate, energy is applied to partial regions corresponding to the transferred bodies to be transferred, and the transferred bodies formed in the partial regions are transferred.

According to the transfer method of the present invention, a plurality of transferred bodies such as devices or circuits that are to be disposed on a transfer destination substrate with spaces therebetween can be manufactured integrated together on a transfer origin substrate, and hence compared with the case that the transferred bodies are formed on the transfer destination substrate directly, the amount of materials used in the manufacture of the transferred bodies can be reduced, the area efficiency can be greatly improved, and a transfer destination substrate on which a large number of devices or circuits are disposed in scattered locations can be manufactured efficiently and cheaply.

Moreover, according to the transfer method of the present invention, it becomes easy to carry out selection and elimination before transfer on a large number of devices or circuits that have been manufactured concentrated together on a transfer origin substrate, and hence the product yield can be improved.

Furthermore, according to the transfer method of the present invention, devices or circuits that are either the same as or different to one another can be built up on one another and combined, and hence by combining devices that are manufactured under different process conditions to one another, it is possible to provide devices or circuits having a layered structure for which manufacture has been difficult hitherto, and moreover devices or circuits having a three-dimensional structure can be manufactured easily.

In particular, according to the transfer method of the present invention, transferred bodies whose orientation has been reversed through being transferred onto an intermediate transfer substrate are further transferred onto a transfer destination substrate, and hence there is an advantage that the orientation of the transferred bodies on the transfer destination substrate can be made to be the same as the orientation of the transferred bodies on the transfer origin substrate. According to the transfer method of the present invention, transferred bodies such as devices or circuits that have been manufactured using a normal manufacturing method and have a normal constitution can thus be used on a transfer destination substrate with wiring carried out as normal and other layers formed as normal.

Note that transfer onto an intermediate transfer substrate may be carried out not only once but also a plurality of times. Each time the number of times that transfer is carried out onto an intermediate transfer substrate is increased by one, the orientation of the transferred bodies on the transfer destination substrate is reversed, and hence the number of times that transfer is carried out onto an intermediate transfer substrate can be set so as to achieve the desired orientation.

Moreover, in the present invention, a transfer method for transferring transferred bodies comprises: a step of forming a plurality of transferred bodies on a transfer origin substrate; a step of transferring the transferred bodies from the transfer origin substrate onto an intermediate transfer substrate; and a step of transferring the transferred bodies from the intermediate transfer substrate onto transfer destination substrates; wherein, in at least either the step of transferring the transferred bodies onto the intermediate transfer substrate or the step of transferring the transferred bodies onto the transfer destination substrates, energy is applied to partial regions corresponding to the transferred bodies to be transferred, and the transferred bodies formed in the partial regions are transferred; and wherein, in the step of transferring onto the transfer destination substrates, after transferring the transferred bodies onto one of the transfer destination substrates, a step of applying energy to other partial regions corresponding to other transferred bodies on the transfer origin substrate, and transferring the other transferred bodies corresponding to the other partial regions onto another one of the transfer destination substrates is repeated.

According to the present invention, transferred bodies that have been manufactured integrated together on a transfer origin substrate and transferred onto an intermediate transfer substrate can be transferred partial region by partial region onto one transfer destination substrate after another, and hence on a production line it becomes possible to dispose similar transferred bodies onto a large number of transfer destination substrates efficiently and continuously. The amount of work required per transfer destination substrate can thus be reduced, and it becomes possible to greatly reduce the manufacturing cost due to manufacturing the transferred bodies integrated together on the transfer origin substrate.

In the transfer methods of the present invention, the transferred bodies are constituted so as to be dividable into a plurality of regions, and in the step(s) of transferring, the energy is applied to one or more of the plurality of regions. Because the transferred bodies are constituted so as to be dividable, it becomes that, by applying the energy to any one or more of the regions, it is easy to carry out transfer on only the region(s) to which the energy has been applied.

Here 'dividable' includes cases such as the transferred bodies being separated at the boundaries therebetween by grooves, or being partitioned by other members through an undulating structure, and also cases such as the transferred bodies being formed with margins left therebetween so that there will be no adverse effects on the functioning of the transferred bodies even when breakage occurs in the vicinity of the boundaries.

In the transfer methods of the present invention, the step of transferring the transferred bodies onto the intermediate transfer substrate or the transfer destination substrate comprises a step of making the transfer origin substrate face the intermediate transfer substrate or making the intermediate transfer substrate face the transfer destination substrate, and forming an adhesive layer on at least one of the transferred bodies and the intermediate transfer substrate or the transfer destination substrate. The transferred bodies to be transferred are connected to the intermediate transfer substrate or the transfer destination substrate by forming the adhesive layer, and hence by releasing the connection between the transfer origin substrate or the intermediate transfer substrate and the transferred bodies to be transferred by applying the energy, the transferred bodies for which the connection has been released can be transferred onto the intermediate transfer substrate or the transfer destination substrate.

Here, regarding the 'adhesive layer', any of various publicly known adhesives can be used, and it is also possible to use a photo-curing resin, a photo-plasticizing resin, a thermosetting resin or a thermoplastic resin in accordance with the manufacturing conditions.

The transfer methods of the present invention further comprise: before the step of forming the transferred bodies, a step of forming a peeling layer on the transfer origin substrate; and, after the step of forming the transferred bodies, a step of dividing at least one of the transferred bodies and the peeling layer into a plurality of regions. Because the transferred bodies are formed via a peeling layer, by bringing about peeling through the energy at partial regions of the peeling layer, the transferred bodies formed in these partial regions can easily be peeled off, and hence can be transferred onto the transfer destination substrate or the intermediate transfer substrate.

Here the 'peeling layer' should be formed from a material for which the bonding strength to the substrate or the transferred bodies weakens upon the application of the energy; for example, amorphous silicon, hydrogen-containing amorphous silicon, nitrogen-containing amorphous silicon, hydrogen-containing alloys, nitrogen-containing alloys, multi-layer films, ceramics, metals, organic macromolecular materials, and so on can be used.

In the transfer methods of the present invention, light is irradiated as the energy. By using light, application of energy to any chosen regions can be carried out, and moreover accurate alignment is possible, and hence using light is advantageous in particular in the case that the transferred bodies are minute.

Here, there are no limitations on the 'light', but if, for example, laser light is used, then because laser light is coherent, the energy can be applied efficiently, and moreover in precise positions.

In the transfer methods of the present invention, in one or more of the steps, there are: a step of shifting the relative position between nozzles that discharge a material and the substrate; and a step of discharging the material from the nozzles. Because the material is applied by discharging from nozzles, a desired layer can be formed precisely in desired positions and without wasting the material. Note that for such discharging of a material, the so-called ink jet coating method or a method in which the material is discharged by forming bubbles through heat can be used.

In the transfer methods of the present invention, in the step of forming the transferred bodies, region dividing means is formed that guides during the transfer such that the transferred bodies are divided along outer peripheries of the partial regions. By forming the region dividing means, it becomes possible to cleanly separate a transferred body away from the other transferred bodies along the shape of the region of this transferred body, and hence it becomes possible to prevent the transferred bodies from being damaged during the separation.

In the transfer methods of the present invention, in the step of forming the transferred bodies, a projecting structure that demarcates the regions of the transferred bodies is formed as the region dividing means. Because a projecting structure that makes division of the transferred bodies easy is formed in advance, it becomes possible to carry out the peeling off of each of the transferred bodies easily and reliably.

In the transfer methods of the present invention, in the step of forming the transferred bodies, grooves formed at boundaries between the regions of the transferred bodies are formed as the region dividing means. Because grooves that make division of the transferred bodies easy are formed in advance, the film thickness in the vicinity of the boundaries between the regions of the transferred bodies can be made thin. It thus becomes possible to carry out the peeling off of each of the transferred bodies easily and reliably.

In the transfer methods of the present invention, in the step of forming the transferred bodies, devices or circuits having the same constitution as one another are formed as the transferred bodies. By adopting such a constitution, it becomes possible to transfer transferred bodies onto transfer destination substrates one after another without distinguishing between the transferred bodies, and hence the manufacturing efficiency can be improved.

In the transfer methods of the present invention, in the step of forming the transferred bodies, devices or circuits having a different constitution to one another are formed as the transferred bodies. This is because, depending on the number of devices or circuits required, devices or circuits that are different to one another may be formed on a single transfer origin substrate, and depending on the number produced, it may be most efficient to form a plurality of transferred bodies that are different to one another on a single transfer origin substrate.

The present invention also provides a circuit board manufactured using a transfer method of the present invention. It may be the case that the circuit board functions independently when alone, or it may be the case that independent functioning is attained when the circuit board is combined with other circuit boards.

According to the circuit board of the present invention, a circuit board can be manufactured at low cost through use of the transfer method of the present invention, and hence electronic circuitry can be provided more cheaply than conventionally. An example of the circuit board is an active matrix board. According to this active matrix board, a large number of devices or circuits that are to be disposed on a transfer destination substrate in scattered locations with spaces therebetween can be manufactured concentrated together on a transfer origin substrate, and these devices or circuits can be transferred precisely into prescribed positions on the transfer destination substrate; compared with a conventional active matrix board that is manufactured by forming the devices directly on the substrate, the area efficiency in the manufacture of the devices such as TFTs can be greatly improved, and a large active matrix board in particular can be provided cheaply.

Moreover, because manufacture is carried out by manufacturing a large number of devices or circuits concentrated together on a transfer origin substrate and then transferring the devices or circuits onto a transfer destination substrate, it is possible to ultimately mount on a transfer destination substrate devices or circuits that have already been manufactured, without damaging the devices or circuits through a manufacturing process involving heat or the like; the performance of the circuit board can thus be improved. Furthermore, it becomes easy to carry out selection and elimination before the transfer of the devices or circuits, and hence the product yield can be improved.

Moreover, due to accurately disposing the minute devices or circuits in prescribed positions on the final transfer destination substrate, the ability to follow curvature of the substrate is improved, and by using a flexible transfer destination substrate, an active matrix type display apparatus that is flexible, light, and strong against impact when dropped can be provided. Furthermore, a circuit board having a curved surface such as that of a curved display can be provided.

It is preferable, for example, to form memory circuitry on the circuit board. Specifically, memory parts are formed on the final transfer destination substrate, and then devices or circuits are transferred onto the rear surfaces of the memory parts using a transfer method according to the present invention, thus constituting a memory. An example of the memory is a FeRAM. A FeRAM has ferroelectric films of PZT, SBT or the like which require a high temperature for deposition, and hence hitherto it has been difficult to manufacture an embedded structure in which the memory devices are disposed on top of the circuitry for memory reading/writing; however, by using the present invention, it is possible to manufacture the FeRAM on the transfer destination substrate, and then dispose the devices or circuits for reading/writing on the rear surface thereof. According to the present invention, a memory having an embedded structure for which manufacture has been difficult hitherto can be manufactured easily.

A circuit board according to the present invention is a circuit board in which a plurality of transferred bodies that have been transferred onto a transfer destination substrate using a transfer method according to the present invention are electrically connected to one another. According to the circuit board of the present invention, the circuit board can be manufactured at low cost through use of the transfer method of the present invention, and hence electronic circuitry can be provided more cheaply than conventionally, i.e. there are advantages similar to those of the active matrix board described above.

In particular, by carrying out the electrical connection through a step in which a coating liquid comprising fine metallic particles dispersed in a solvent is applied using an ink jet coating method, conductors can be drawn on efficiently in desired positions, even if there is somewhat of a level difference.

Another circuit board according to the present invention is a circuit board in which a plurality of transferred bodies are transferred in staggered fashion onto a transfer destination substrate using a transfer method according to the present invention, and then the transferred bodies are electrically connected to one another. According to the circuit board of the present invention, there are advantages similar to those of the active matrix board described above. The transferred bodies may have the same structure as one another, or may have different functions to one another.

Another circuit board according to the present invention is a circuit board in which at least one second transferred body is transferred onto and thus disposed on top of a first transferred body that has been transferred onto a transfer destination substrate using a transfer method according to the present invention, the second transferred body having a smaller area than the first transferred body, and then the first and second transferred bodies are electrically connected to one another. According to the circuit board of the present invention, there are advantages similar to those of the active matrix board described above. The transferred bodies may have the same structure as one another, or may have different functions to one another.

By placing transferred bodies such as devices or circuits on top of one another and electrically connecting the transferred bodies together in this way, transferred bodies that are the same as or different to one another can be built up on one another and combined, and hence devices or circuits that are manufactured under different process conditions to one another can be combined. It is thus possible to provide devices having a layered structure for which manufacture has been difficult hitherto, and moreover devices having a three-dimensional structure can be manufactured easily.

The present invention also provides an electro-optical apparatus manufactured using a transfer method according to the present invention. Here, 'electro-optical apparatus' refers to any apparatus having electro-optical devices that generate light or change the state of light from the outside through an electrical operation, and includes both apparatuses that generate light themselves and apparatuses that control the passage of light from the outside. The term refers, for example, to active matrix type displays and so on having, as electro-optical devices, electrophoretic devices, EL (electroluminescence) devices, or electron emitting devices that generate light by firing at a light-generating plate electrons that have been generated by applying an electric field.

For example, in the case of an electro-optical apparatus using EL devices, the EL devices can be mounted on by transfer, and hence there is no thermal damage to the luminescent layers or antireflection layers during manufacture of the EL devices; moreover, unlike in the case that the devices are formed between the substrate and the luminescent layers as conventionally, the devices do not obstruct the display, and hence the display performance is improved.

The present invention also provides an electronic appliance manufactured using a transfer method according to the present invention. According to the electronic appliance of the present invention, a large number of devices or circuits that are to be disposed on a transfer destination substrate in scattered locations with spaces therebetween and used in the electronic appliance can be manufactured concentrated together on a transfer origin substrate, and these devices or circuits can be transferred precisely into prescribed positions on the transfer destination substrate; compared with a conventional electronic appliance that is manufactured by forming the devices directly on the substrate, the area efficiency in the manufacture of the devices such as TFTs can thus be greatly improved.

Moreover, because manufacture is carried out by manufacturing a large number of devices or circuits concentrated together on a transfer origin substrate and then transferring the devices or circuits onto a transfer destination substrate, it is possible to ultimately mount on a transfer destination substrate devices or circuits that have already been manufactured, without damaging the devices or circuits through a manufacturing process involving heat or the like; the performance of the electronic appliance can thus be improved.

Furthermore, it becomes easy to carry out selection and elimination before the transfer of the devices or circuits, and hence the product yield can be improved.

Moreover, due to accurately disposing the minute devices or circuits in prescribed positions on the final transfer destination substrate, the ability to follow curvature of the substrate is improved, and by using a flexible transfer destination substrate, an electronic appliance that is flexible, light, and strong against impact when dropped can be provided. Furthermore, an electronic appliance having a curved surface such as a curved display can be provided, and hence a shape that was impossible or difficult to attain with conventional articles can be attained, and thus the amount of freedom in product design is broadened.

Here, 'electronic appliance' refers to any appliance that attains a specific function through a combination of a plurality of devices or circuits; for example, the electronic appliance may comprise an electro-optical apparatus or a memory. There are no particular limitations on the constitution of the electronic appliance, but examples include a mobile telephone, a video camera, a personal computer, a head-mounted display, and a rear type or front type projector, and also a fax machine having a display function, a digital camera viewfinder, a portable TV, a DSP apparatus, a PDA, an electronic organizer, an electric signboard, and a display for advertisements/announcements.

The present invention also provides an IC card manufactured using a transfer method according to the present invention. According to the IC card of the present invention, a circuit board provided with devices or circuits that are IC card components is formed using a transfer method of the present invention, and hence the IC card has advantages similar to those of the electronic appliance of the present invention.

BRIEF DESCRIPTION OF THE DRAWINGS

FIG. 3 is a process flowchart for explaining an example of partial transfer in which some of a plurality of transferred bodies are transferred onto a transfer destination substrate, and then a step is repeated in which others of the transferred bodies are transferred onto other transfer destination substrates, according to a third invention;

FIG. 4 are drawings for explaining a first embodiment of the present invention.

FIG. 13 are drawings for explaining a second embodiment of the present invention.

FIG. 14 are drawings for explaining a third embodiment of the present invention.

FIGS. 17A to 17E are manufacturing process sectional views for explaining a transfer method in which transferred bodies are transferred with only the peeling layer having been separated, according to a fifth embodiment of the present invention;

FIG. 19 are drawings for explaining a sixth embodiment of the present invention.

FIG. 20 are drawings for explaining a seventh embodiment of the transfer method according to the present invention; FIG. 20A is a sectional view showing a step (d) in which light is irradiated onto a peeling layer on a first substrate to transfer transferred bodies onto a second substrate (intermediate transfer substrate) side, FIG. 20B is a sectional view showing a state in which the first substrate has been removed from the transferred bodies that have been transferred onto the second substrate side, FIG. 20C is a sectional view showing a step (e) in which a third substrate (transfer destination substrate) on which a multi-layer film has been formed in advance is joined onto the transferred bodies that have been transferred onto the second substrate side, and FIG. 20D is a sectional view showing a step (f) in which a transferred-body-supplying substrate is formed;

FIG. 33 are examples of electronic appliances according to the present invention.

DESCRIPTION OF THE PREFERRED EMBODIMENTS

Following is a description of embodiments of the present invention with reference to the drawings.

Forms of the Present Invention

Firstly, before the description of embodiments of the present invention, a description will be given of forms of the present invention with reference to FIGS. 1 to 3. Detailed embodiments for each form will be given afterwards.

Following is a description of a first invention which relates to carrying out partial transfer once, with reference to FIG. 1 which are process drawings for explaining the concept of this first invention.

Figure 1A:
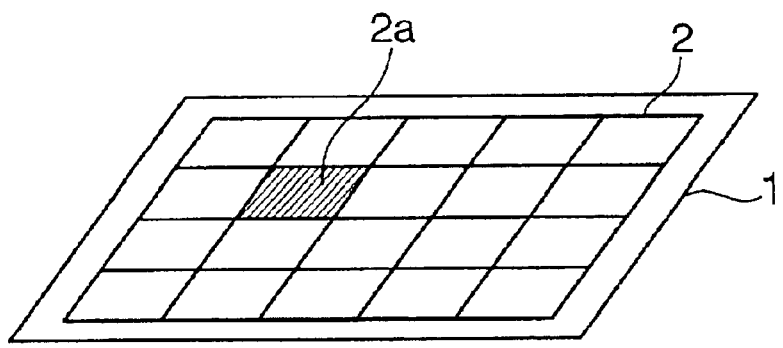
FIGS. 1A to 1C are perspective process drawings for explaining an example of partial transfer in which some of the transferred bodies formed on a transfer origin substrate are transferred onto a transfer destination substrate, according to a first invention.
Figure 1B:
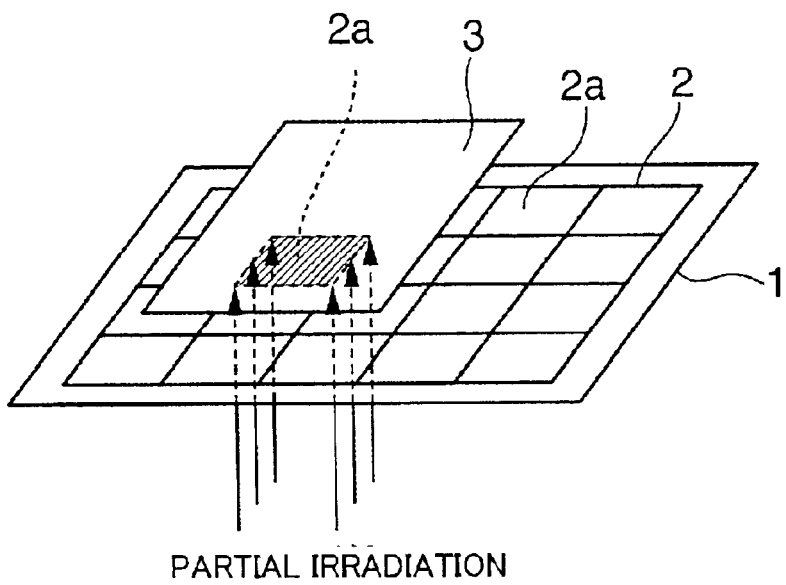

As shown in FIGS. 1, the transfer method of the first invention comprises a step of forming a plurality of transferred bodies 2a on a transfer origin substrate 1 (FIG. 1A), and a step of applying energy to partial regions corresponding to a transferred body 2a to be transferred (shown by the diagonal shading), and transferring the transferred body 2a corresponding to these partial regions onto a transfer destination substrate 3 (FIG. 1B).

Firstly, as shown in FIG. 1A, the transferred bodies 2a are formed. The transferred bodies 2a are formed on a light-transmitting heat-resistant transfer origin substrate 1 via a peeling layer in which peeling occurs if energy is applied. The transferred bodies 2a are TFTs, diodes, resistors, inductors, capacitors, or other active or passive devices, or circuits comprising a combination of such devices, and the layer in which the plurality of transferred bodies 2a are formed is referred to as the transferred layer 2. Regarding the transferred bodies 2a, a plurality of devices or circuits having the same function as one another may be formed, or a plurality of devices or circuits having different functions to one another may be formed, or a plurality of each of a plurality of different types of device or circuit may be formed.

Next, as shown in FIG. 1B, the transfer destination substrate 3 is joined to the desired transferred body 2a, and then energy is applied, thus peeling off the transferred body 2a. For example, when a peeling layer is used, if a specific energy is applied through irradiation of laser light (irradiation of light), heating or the like, then the bonding strength between atoms or molecules in the peeling layer drops, or a gas is generated and thus the bonding strength drops, and hence peeling occurs.

Figure 1C:
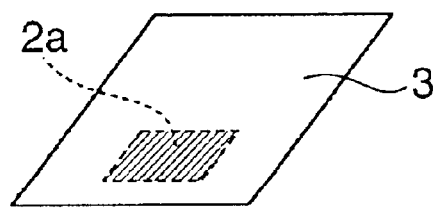

The joining of the transferred body 2a onto the transfer destination substrate 3 can be achieved, for example, by forming an adhesive layer on the desired transferred body 2a in advance. By applying energy to the region of the peeling layer where the transferred body 2a is formed, transfer occurs in which only the transferred body 2a to which the energy has been applied is joined onto the transfer destination substrate 3, as shown in FIG. 1C.

According to the transfer method of the first invention, a plurality of transferred bodies such as devices or circuits that are to be disposed on a transfer destination substrate with spaces therebetween can be manufactured integrated together on a transfer origin substrate, and hence compared with the case that the transferred bodies are formed on the transfer destination substrate directly, the amount of materials used in the manufacture of the transferred bodies can be reduced, the area efficiency can be greatly improved, and a transfer destination substrate on which a large number of devices or circuits are disposed in scattered locations can be manufactured efficiently and cheaply.

Moreover, according to the transfer method of the first invention, it becomes easy to carry out selection and elimination before transfer on a large number of devices or circuits that have been manufactured concentrated together on a transfer origin substrate, and hence the product yield can be improved.

Furthermore, according to the transfer method of the first invention, devices or circuits that are either the same as or different to one another can be built up on one another and combined, and hence by combining devices that are manufactured under different process conditions to one another, it is possible to provide devices or circuits having a layered structure for which manufacture has been difficult hitherto, and moreover devices or circuits having a three-dimensional structure can be manufactured easily.

In FIG. 2, process drawings are shown for explaining the concept of a second invention which relates to carrying out transfer a plurality of times. As shown in FIG. 2, the transfer method of the second invention comprises a step of forming a plurality of transferred bodies 2a on a transfer origin substrate 1 (FIG. 2A), a step of transferring the transferred bodies 2a onto an intermediate transfer substrate 5 (FIGS. 2B and 2C), and a step of transferring the transferred body 2a onto a transfer destination substrate 6 (FIG. 2D).

Figure 2A:
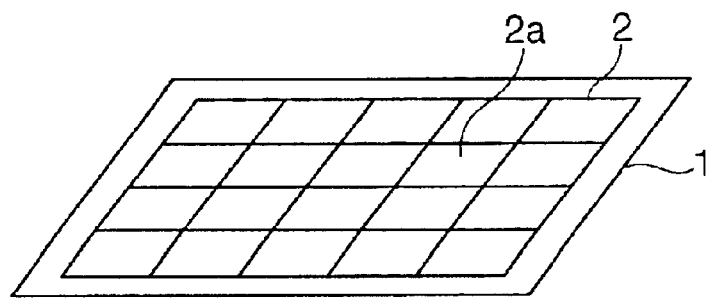
FIGS. 2A to 2E are perspective process drawings for explaining an example of partial transfer in which all of the transferred bodies formed on a transfer origin substrate are first transferred onto an intermediate transfer substrate, and then some of the transferred bodies are transferred onto a transfer destination substrate, according to a second invention.
Figure 2B:
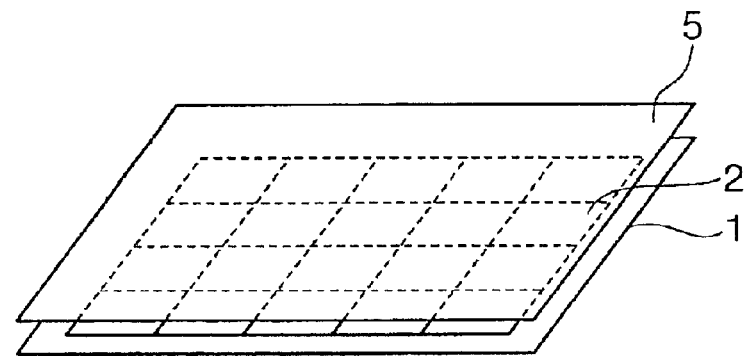
Figure 2C:
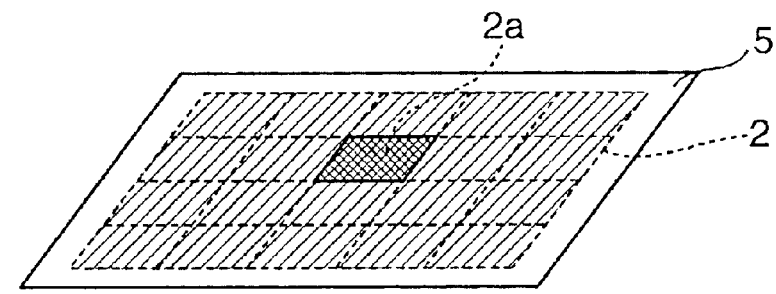
Figure 2D:
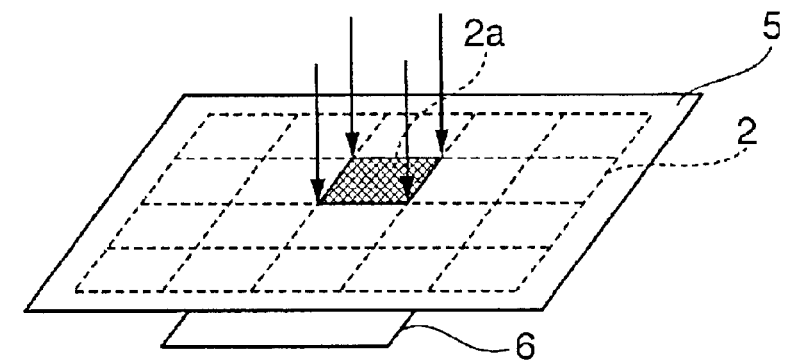
Figure 2E:
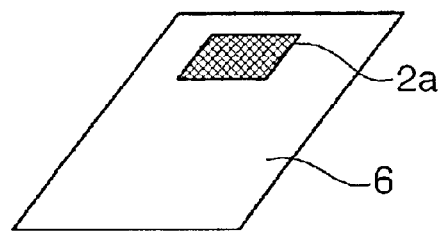

FIG. 2C shows the intermediate transfer substrate 5 onto which the transferred bodies 2a have been transferred. As shown in FIG. 2C, it is possible to transfer all of the transferred bodies 2a (i.e. the whole of the transferred layer 2) formed on the transfer origin substrate 1 onto the intermediate transfer substrate 5, and then apply energy selectively to the intermediate transfer substrate 5 onto which all of the transferred bodies 2a have been transferred, thus transferring only one or more desired transferred bodies 2a onto the transfer destination substrate 6. Alternatively, it is also possible to apply energy selectively to transfer desired transferred bodies 2a onto the intermediate transfer substrate 5, and then transfer onto the transfer destination substrate 6 all of the transferred bodies 2a that have been selectively transferred onto the intermediate transfer substrate 5. Furthermore, it is also possible to apply energy selectively to transfer one or more desired transferred bodies 2a onto the intermediate transfer substrate 5, and then apply energy selectively to the transferred bodies 2a that have been selectively transferred onto the intermediate transfer substrate 5, thus transferring only one or more specific transferred bodies 2a onto the transfer destination substrate 6.

According to the transfer method of the second invention, there are the same advantages as with the transfer method of the first invention; moreover, in the case in particular of transferring an even number of times, transferred bodies whose orientation has been reversed through being transferred onto the intermediate transfer substrate are further transferred onto the transfer destination substrate, and hence there is an advantage that the orientation of the transferred bodies on the transfer destination substrate can be made to be the same as the orientation of the transferred bodies on the transfer origin substrate. According to the transfer method of the present invention, transferred bodies such as devices or circuits that have been manufactured using a normal manufacturing method and have a normal constitution can thus be used on the transfer destination substrate with wiring carried out as normal and other layers formed as normal.

FIG. 3 shows a flowchart for explaining the concept of a third invention in which partial transfer is carried out repeatedly onto different transfer destination substrates.

The third invention can be combined with either the first invention or the second invention; as shown in FIG. 3, the third invention comprises a step of forming a plurality of transferred bodies on a transfer origin substrate (S1), a step of applying energy to partial regions corresponding to transferred bodies to be transferred (S2~S4), and a step of transferring the transferred bodies corresponding to the partial regions onto a transfer destination substrate (S5). Moreover, after the transferred bodies have been transferred onto one transfer destination substrate, a step is repeated in which energy is applied to other partial regions corresponding to others of the transferred bodies on the transfer origin substrate, and the transferred bodies corresponding to the other partial regions are transferred onto another transfer destination substrate (S6→S2~S5).

More specifically, the case in which the third invention is combined with the first invention, which relates to carrying out partial transfer once, will now be described (see FIG. 1). Firstly, a transferred layer 2 comprising a plurality of transferred bodies 2a is formed on a transfer origin substrate 1 (S1). Next, an adhesive layer is applied to a desired transferred body 2a (S2), and then the transfer origin substrate 1 is made to face a transfer destination substrate 3 and alignment is carried out, before adhesion is carried out (S3). Partial irradiation with light is then carried out onto the region corresponding to the desired transferred body 2a (S4), thus bringing about peeling in a peeling layer or the like. The transfer destination substrate 3 is then peeled off along with the transferred body 2a that has been joined thereto. The peeled off transfer destination substrate 3 is outputted. Here, in the case that other transferred bodies 2a to be transferred still remain on the transfer origin substrate 1 (S6: Y), once again an adhesive layer is applied to the required transferred body 2a (S2), another transfer destination substrate 3 is fed in, alignment is carried out (S3), partial irradiation with light is carried out (S4), the transferred body 2a that has been joined to the transfer destination substrate 3 is peeled off from the transfer origin substrate 1, and the transfer destination substrate 3 having the transferred bodies 2a joined thereto is outputted (S5). Subsequently, the feeding in of a new transfer destination substrate, the alignment, the irradiation with light, and the peeling are repeated (S2~S6).

Next, a description will be given of the case in which the third invention is combined with the second invention, which relates to carrying out transfer a plurality of times (see FIG. 2). Firstly, a transferred layer 2 comprising a plurality of transferred bodies 2a is formed on a transfer origin substrate 1 (S1). The whole of the transferred layer 2 is then transferred onto an intermediate transfer substrate 5. Next, an adhesive layer is applied to a desired transferred body 2a (S2), and then the intermediate transfer substrate 5 is made to face a transfer destination substrate 6 and alignment is carried out, before adhesion is carried out (S3). Partial irradiation with light is then carried out onto the region corresponding to the desired transferred body 2a (S4), thus bringing about peeling in a peeling layer or the like. The transfer destination substrate 6 is then peeled off along with the transferred body 2a that has been joined thereto. The peeled off transfer destination substrate 6 is outputted. Here, in the case that other transferred body 2a to be transferred still remain on the intermediate transfer substrate 5 (S6: Y), once again an adhesive layer is applied to the required transferred body 2a (S2), another transfer destination substrate 6 is fed in, alignment is carried out (S3), partial irradiation with light is carried out (S4), the transferred body 2a that has been joined to the transfer destination substrate 6 is peeled off from the intermediate transfer substrate 5, and the transfer destination substrate 6 having the transferred body 2a joined thereto is outputted (S5). Subsequently, the feeding in of a new transfer destination substrate, the alignment, the irradiation with light, and the peeling are repeated (S2~S6).

According to the transfer method of the third invention, transferred bodies that have been manufactured integrated together on a transfer origin substrate can be transferred partial region by partial region onto one transfer destination substrate after another, and hence on a production line it becomes possible to dispose similar transferred bodies onto a large number of transfer destination substrates efficiently and continuously. The amount of work required per transfer destination substrate can thus be reduced, and it becomes possible to greatly reduce the manufacturing cost due to manufacturing the transferred bodies integrated together on the transfer origin substrate.

In the following embodiments, detailed embodiments of the above first to third inventions are described.

First Embodiment

FIGS. 4A to 12B are drawings for explaining a first embodiment (transfer method) of the present invention. The first embodiment comes under the first invention, which relates to carrying out partial transfer once. The device transfer method is carried out through the following first to fifth steps.

<First Step>

Figure 4A:
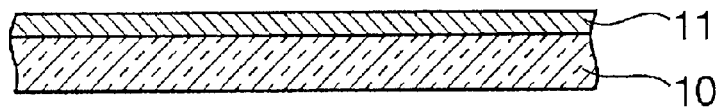
FIG. 4A is a sectional view showing a first step of forming a peeling layer on a first substrate.

In the first step, as shown in FIG. 4A, a peeling layer (light-absorbing layer) 11 is formed on a first substrate (transfer origin substrate) 10.

The first substrate 10 is preferably a light-transmitting substrate through which light can pass. As a result, light can be irradiated onto the peeling layer via the first substrate, and hence peeling can be made to occur swiftly and accurately through the irradiation of light onto the peeling layer. In this case, it is preferable for the transmissivity to light of the first substrate to be at least 10%, more preferably at least 50%. The higher the transmissivity, the lower the attenuation (loss) of light becomes, and hence the lower the amount of light required to bring about peeling in the peeling layer 11.

Moreover, it is preferable for the first substrate 10 to be constituted from a highly reliable material, in particular a material having excellent heat resistance. The reason for this is that when, for example, a transferred layer 12 or an intermediate layer 16 is formed as will be described later, depending on the type thereof and the formation method, the process temperature may be high (e.g. about 350 to 1000° C.), but even in this case, if the first substrate 10 has excellent heat resistance, then there will be a broad range of possible settings for the film formation conditions such as the temperature conditions during the formation of the transferred layer 12 or the like on the first substrate 10. When manufacturing a large number of devices or circuits on the first substrate, the desired high-temperature processing thus becomes possible, and hence devices or circuits of high reliability and high performance can be manufactured.

If the maximum temperature during formation of the transferred layer 12 is Tmax, it is thus preferable for the first substrate 10 to be constituted from a material having a strain point of at least Tmax. Specifically, it is preferable for the constituent material of the first substrate 10 to have a strain point of at least 350° C., more preferably at least 500° C. Examples of such a material include quartz glass, and heat-resistant glasses such as Corning 7059 and Nippon Electric Glass OA-2.

Moreover, there are no particular limitations on the thickness of the first substrate 10, but generally about 0.1 to 5.0 mm is preferable, with about 0.5 to 1.5 mm being more preferable. This is because the thicker the first substrate 10, the higher the strength, and yet the thinner the first substrate 10, the less attenuation of light occurs in the case that the transmissivity of the first substrate 10 is low. Note that in the case that the transmissivity to light of the first substrate 10 is high, the thickness may exceed the upper limit given above.

Moreover, so that the light can be irradiated uniformly, it is preferable for the thickness of the first substrate 10 to be uniform.

As described above, there are various conditions on the first substrate, i.e. the transfer origin substrate; nevertheless, unlike the transfer destination substrate, which is the final product, the transfer origin substrate can be used repeatedly, and hence even if a relatively expensive material is used, increase in the manufacturing cost can be kept down through such repeated use.

The peeling layer 11 has the property of absorbing irradiated light, whereby peeling occurs within the layer and/or at the interface thereof (referred to as 'in-layer peeling' and 'interfacial peeling' respectively); preferably, the peeling layer 11 is such that the bonding strength between atoms or molecules of the material that constitutes the peeling layer 11 is lost or reduced upon irradiation with light, i.e. ablation occurs, leading to in-layer peeling and/or interfacial peeling.

Furthermore, it may be the case that a gas is discharged from the peeling layer 11 upon irradiation with light, whereupon a separation effect is realized. That is, it may be the case that a component that was contained in the peeling layer 11 turns into a gas and is discharged, or the case that the peeling layer 11 absorbs light and turns into a gas instantaneously, and this vapor is discharged, contributing to separation. Examples of the constitution of the peeling layer 11 include the following A to E.

A. Amorphous Silicon (a-Si)

Hydrogen (H) may be contained in the amorphous silicon. In this case, the H content is preferably at least about 2 at %, more preferably about 2 to 20 at %. If a prescribed amount of hydrogen (H) is contained in this way, then the hydrogen is discharged upon irradiation with light, and hence an internal pressure is generated within the peeling layer 11, and this acts as a force for making the upper and lower thin films peel away from one another. The hydrogen (H) content in the amorphous silicon can be adjusted by suitably setting the film formation conditions, for example conditions such as the gas composition in CVD, the gas pressure, the gas atmosphere, the gas flow rate, the temperature, the substrate temperature, and the power input. Amorphous silicon has good light absorption, and moreover film formation is easy, and hence practicability is high. By constituting the peeling layer from amorphous silicon, it is thus possible to cheaply form a peeling layer for which peeling occurs accurately upon irradiation with light.

B. Various Oxide Ceramics, Dielectrics (Ferroelectrics) and Semiconductors such as Silicon Oxides and Silicates, Titanium Oxides and Titanates, Zirconium Oxides and Zirconates, and Lanthanum Oxides and Lanthanates Examples of silicon oxides are SiO, $SiO_2$ and $Si_3O_2$, and examples of silicates include $K_2SiO_3$, $Li_2SiO_3$, $CaSiO_3$, $ZrSiO_4$ and $Na_2SiO_3$.

Examples of titanium oxides are TiO, $Ti_2O_3$ and $TiO_2$, and examples of titanates include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_3$, $SnTiO_4$, $Al_2TiO_5$ and $FeTiO_3$.

An example of a zirconium oxide is $ZrO_2$, and examples of zirconates include $BaZrO_3$, $ZrSiO_4$, $PbZrO_3$, $MgZrO_3$ and $K_2ZrO_3$.

Alternatively, it is also preferable for the peeling layer to be constituted from silicon containing nitrogen. In the case of using nitrogen-containing silicon as the peeling layer, nitrogen is discharged upon irradiation with light, and this promotes the peeling in the peeling layer.

C. Ceramics and Dielectrics (Ferroelectrics) such as PZT, PLZT, PLLZT and PBZT

D. Nitride Ceramics such as Silicon Nitride, Aluminum Nitride and Titanium Nitride E. Organic macromolecular materials containing bonds such as —CH—, —CO— (ketone), —CONH— (amide), —NH— (imide), —COO— (ester), —N=N— (azo), or —CH=N— (Schiff) (these bonds are broken upon irradiation with light), in particular any organic macromolecular material containing many such bonds is suitable. Moreover, the organic macromolecular material may contain aromatic hydrocarbon rings (one or more benzene rings, or a fused ring) in the structural formula thereof.

Specific examples of such organic macromolecular materials include polyolefins such as polyethylene and polypropylene, polyimides, polyamides, polyesters, polymethyl methacrylate (PMMA), polyphenylene sulfide (PPS), polyether sulfones (PESs), and epoxy resins.

F. Metals

Examples of metals include Al, Li, Ti, Mn, In, Sn, Y, La, Ce, Nd, Pr, Gd, and Sm, and also alloys containing one or more of the above.

Alternatively, the peeling layer can be constituted from a hydrogen-containing alloy. When a hydrogen-containing alloy is used in the peeling layer, hydrogen is discharged upon irradiation with light, and this promotes the peeling in the peeling layer.

In addition, the peeling layer can also be constituted from a nitrogen-containing alloy. In the case that a nitrogen-containing alloy is used in the peeling layer, nitrogen is discharged upon irradiation with light, and this promotes the peeling in the peeling layer.

Furthermore, the peeling layer can be made to comprise a multi-layer film. The multi-layer film can be made to comprise, for example, an amorphous silicon film and a metal film formed on top of the amorphous silicon film. The materials of the multi-layer film can be one or more types selected from the ceramics, metals and organic macromolecular materials described above. If in this way the peeling layer is constituted from a multi-layer film, or a film in which different types of material are combined, then as in the case of amorphous silicon, peeling in the peeling layer is promoted by the discharge of hydrogen gas or nitrogen gas upon irradiation with light.

The thickness of the peeling layer 11 varies according to various conditions such as the peeling objective, the composition of the peeling layer 11, the layer constitution, and the formation method, but generally is preferably about 1 nm to 20 $\mu$m, more preferably about 10 nm to 2 $\mu$m, yet more preferably about 40 nm to 1 $\mu$m. This is because the higher the film thickness of the peeling layer 11, the better the uniformity of the film formation can be maintained, and hence the less the tendency for unevenness to occur in the peeling, but on the other hand, the thinner the film thickness, the lower the light power (amount of light) required to secure good peeling of the peeling layer 11, and moreover the less time required to remove the peeling layer 11 afterwards. Moreover, it is preferable for the film thickness of the peeling layer 11 to be as uniform as possible.

There are no particular limitations on the method of forming the peeling layer 11, with the method being selected as appropriate in accordance with various conditions such as the film composition and the film thickness. Examples include various vapor phase film formation methods such as CVD (including MOCVD, low-pressure CVD, ECR-CVD), vapor deposition, molecular beam (MB) deposition, sputtering, ion plating and PVD, various plating methods such as electroplating, immersion plating (dipping) and electroless plating, application methods such as the Langmuir-Blodgett (LB) method, spin coating, spray coating and roll coating, various printing methods, a transfer method, an ink jet coating method, and a powder jet method; moreover the formation can also be carried out by combining two or more of these methods.

For example, in the case that the peeling layer 11 is constituted from amorphous silicon (a-Si), it is preferable to carry out the film formation using CVD, in particular low-pressure CVD or plasma CVD.

Moreover, in the case that the peeling layer 11 is constituted from an organic macromolecular material, or is constituted from a ceramic made through a sol-gel method, it is preferable to carry out the film formation using an application method, in particular spin coating.

Moreover, although not shown in FIG. 4A, depending on the properties off the first substrate 10 and the peeling layer 11, an intermediate layer for improving the adhesion and so on between the first substrate 10 and the peeling layer 11 may be provided between the first substrate 10 and the peeling layer 11. This intermediate layer exhibits, for example, at least one function out of those of a protective layer that protects the transferred layer physically or chemically during manufacture or use, an insulating layer, a barrier layer that prevents migration of components to or from the transferred layer, and a reflective layer.

The composition of the intermediate layer is selected as appropriate in accordance with the purpose thereof. For example, in the case of an intermediate layer formed between the transferred layer and a peeling layer constituted from amorphous silicon, an example is a silicon oxide such as $SiO_2$. Moreover, other examples of the composition of the intermediate layer are metals such as Pt, Au, W, Ta, Mo, Al, Cr and Ti, and alloys having the above as principal components thereof.

The thickness of the intermediate layer is determined as appropriate in accordance with the purpose of forming the intermediate layer. Generally, about 10 nm to 5 $\mu$m is preferable, with about 40 nm to 1 $\mu$m being more preferable. This is because the higher the film thickness of the intermediate layer, the better the uniformity of the film formation can be maintained, and hence the less the tendency for unevenness to occur in the adhesion, but on the other hand, the thinner the film thickness, the less the attenuation of light that should pass through as far as the peeling layer.

Regarding the method of forming the intermediate layer, any of the various methods described earlier with regard to the peeling layer can be used. The intermediate layer can either be formed as a single layer, or else two or more layers can be formed using a plurality of materials having compositions the same as or different to one another.

<Second Step>

Figure 4B:
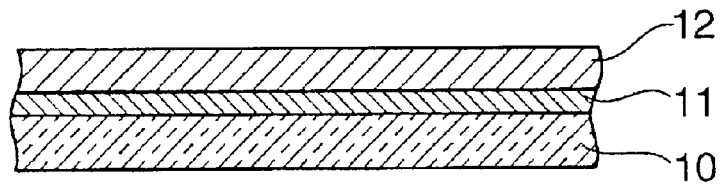
FIG. 4B is a sectional view showing a second step of forming transferred bodies on the peeling layer.

Next, as shown in FIG. 4B, a plurality of transferred bodies 12a are formed on the peeling layer 11. The layer constituted from the plurality of transferred bodies 12a is referred to as the transferred layer 12. Each of the transferred bodies 12a is a passive device or an active device such as a TFT, or a circuit comprising a combination of such devices. That is, each of the transferred bodies 12a is an individual device, or an independently functioning chip such as an integrated circuit, or something in-between, i.e. a circuit part that does not function independently, but a circuit comprising this circuit part combined with other devices or circuits functions independently. There are thus no limitations on the structure or size of the transferred body 12a. Regarding the transferred bodies 12a, a plurality of devices or circuits having the same function as one another may be formed, or a plurality of devices or circuits having different functions to one another may be formed, or a plurality of each of a plurality of different types of device or circuit may be formed.

In particular, in the present invention it is preferable to make the transferred bodies be thin film devices, or integrated circuits constituted from thin film devices. In the manufacture of thin film devices, high-temperature processes are required to some extent, and hence the substrate on which the thin film devices are formed must satisfy various conditions as with the first substrate. On the other hand, one can envisage that the final substrate that constitutes the product may be, for example, a flexile substrate. In this way, it is possible that, in the manufacture of thin film devices, the requirements on the final substrate and the requirements on the substrate on which the thin film devices are manufactured may conflict with one another; however, if the transfer method of the present invention is used, then it is possible to manufacture the thin film devices on a substrate that satisfies the manufacturing conditions, and then transfer the thin film devices onto a final substrate that does not satisfy the manufacturing conditions.

In addition to TFTs, examples of the thin film devices include thin film diodes, photoelectric transducers comprising silicon PIN junctions (photosensors, solar cells), silicon resistors, other thin film semiconductor devices, electrodes (e.g. transparent electrodes made of ITO, a mesa film or the like), switching devices, memories, actuators such as piezoelectric elements, micromirrors (piezoelectric thin film ceramics), magnetic recording thin film heads, coils, inductors, resistors, capacitors, thin film materials having high magnetic permeability and micro-magnetic devices in which these are combined, filters, reflecting films, and dichroic mirrors.

Figure 7A:
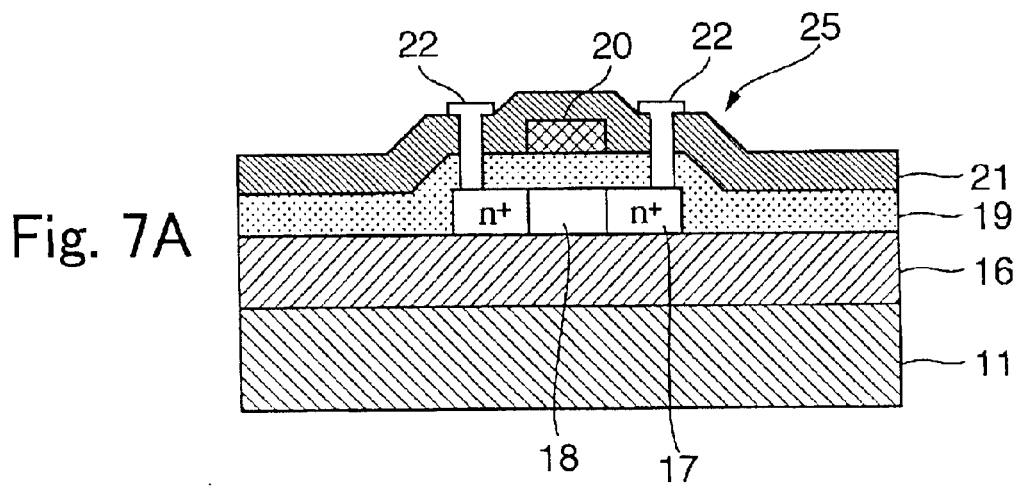
FIG. 7A is a sectional view of an example in which a TFT device is formed as a transferred body.

FIG. 7A is a sectional view of a thin film device, showing an example of a transferred body 12a used in the present embodiment. This thin film device has, for example, a constitution containing a thin film transistor T formed on an SiO$_2$ film (intermediate layer) 16. The thin film transistor T comprises source and drain regions 17 formed by introducing an n-type impurity into a polysilicon layer, a channel region 18, a gate insulator film 19, a gate electrode 20, a layer insulation film 21, and electrodes 22 comprising aluminum or the like. The TFT is not limited to having such a constitution, but rather various other structures can be used, for example a transistor on a silicon base, or an SOI (silicon-on-insulator) structure.

Note that here an SiO$_2$ film is used as the intermediate layer 16 that is provided in contact with the peeling layer 11, but it is also possible to use another insulating film, for example an insulating film of Si$_3$N$_4$. The thickness of the SiO$_2$ film (intermediate layer) 16 is determined as appropriate in accordance with the purpose of forming the same and the extent to which the functions of the same are to be exhibited; nevertheless, generally, about 10 nm to 5 μm is preferable, with about 40 nm to 1 μm being more preferable. The intermediate layer may be formed for any of various purposes, exhibiting, for example, at least one function out of those of a protective layer that protects the transferred body (thin film device) 12a physically or chemically, an insulating layer, a conducting layer, a laser light shielding layer, a barrier layer for preventing migration, and a reflective layer.

Note that in some cases the transferred body (thin film device) 12a may be formed directly on the peeling layer 11, without forming an intermediate layer 16.

Figure 7B:
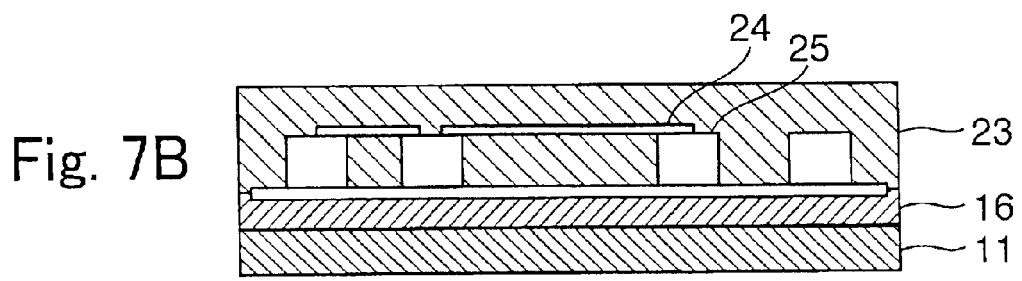
FIG. 7B is a sectional view (the section along 7B—7B in FIG. 7C) of an example in which an integrated circuit is formed as a transferred body.
Figure 7C:
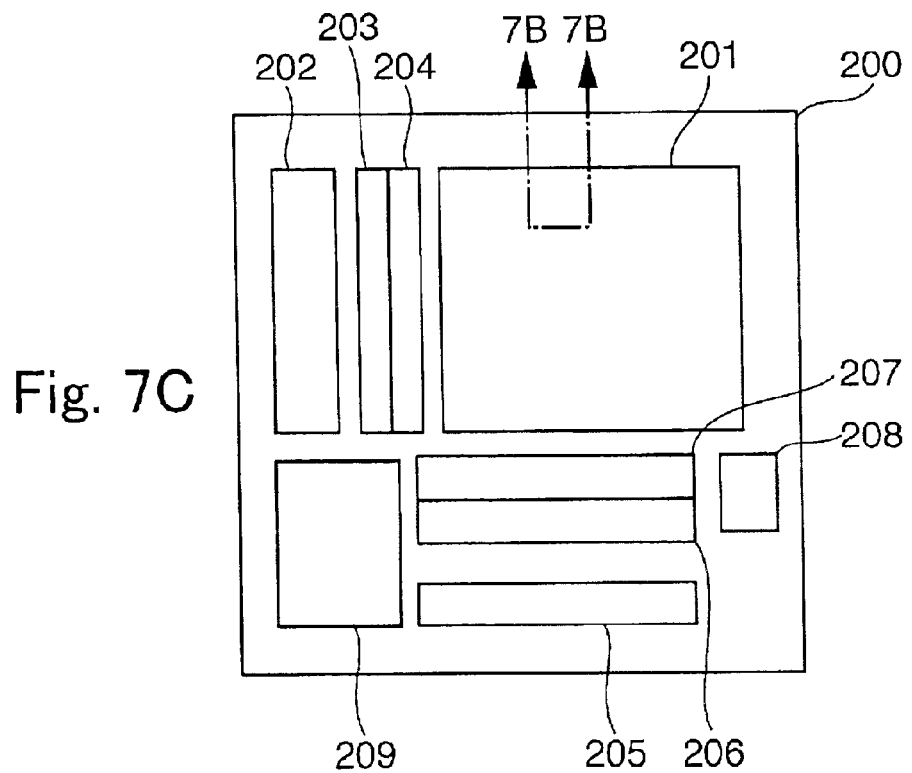
FIG. 7C is a top view of the integrated circuit example.

FIGS. 7B and 7C relate to, as an example of a transferred body 12a used in the present embodiment, a static RAM which is manufactured using the transfer method of the present invention and is an integrated circuit constituted from thin film devices integrated together.

As shown in FIG. 7C, the integrated circuit 200 comprises the following blocks: a memory cell array 201, an address buffer 202, a line decoder 203, a word driver 204, an address buffer 205, a column decoder 206, a column selection switch 207, input/output circuitry 208, and control circuitry 209. Circuitry based on thin film transistors is formed in each block, and wiring is formed between the blocks by patterning of a metal layer.

FIG. 7B is a sectional view of the integrated circuit 200 along the section 7B–7B in FIG. 7C, and shows a region in which a p-type MOS transistor Tp and an n-type MOS transistor Tn are formed. As shown in this sectional view, a device-forming layer 12 is formed on a peeling layer 11. In the device-forming layer 12, a silicon layer 16 which acts as a foundation, a wiring layer 210 in which is formed the layer structure of wiring and a large number of devices, and a protective layer 217 for protecting the upper surface, and so on are formed.

In the wiring layer 210, circuitry is formed through a well region 211, semiconductor regions 212 (corresponding to the regions 17 in FIG. 17A) that have impurities introduced therein and each form a source or a drain, a gate insulator film 214, a gate wiring film 213, a layer insulation film 215, a metal wiring layer 216, and so on. The protective layer 217 is a film for protecting the wiring layer 210. Various circuit configurations can be envisaged for the integrated circuit 200; in addition to the circuit configuration described above relating to a memory, one can also envisage application to, for example, pixel driving circuitry for a display apparatus, which is an electro-optical apparatus. In this way, not only individual devices, but also integrated circuits that are constituted by combining devices so that a specific function is attained, can be used as the transferred body 12a.

Figure 8:
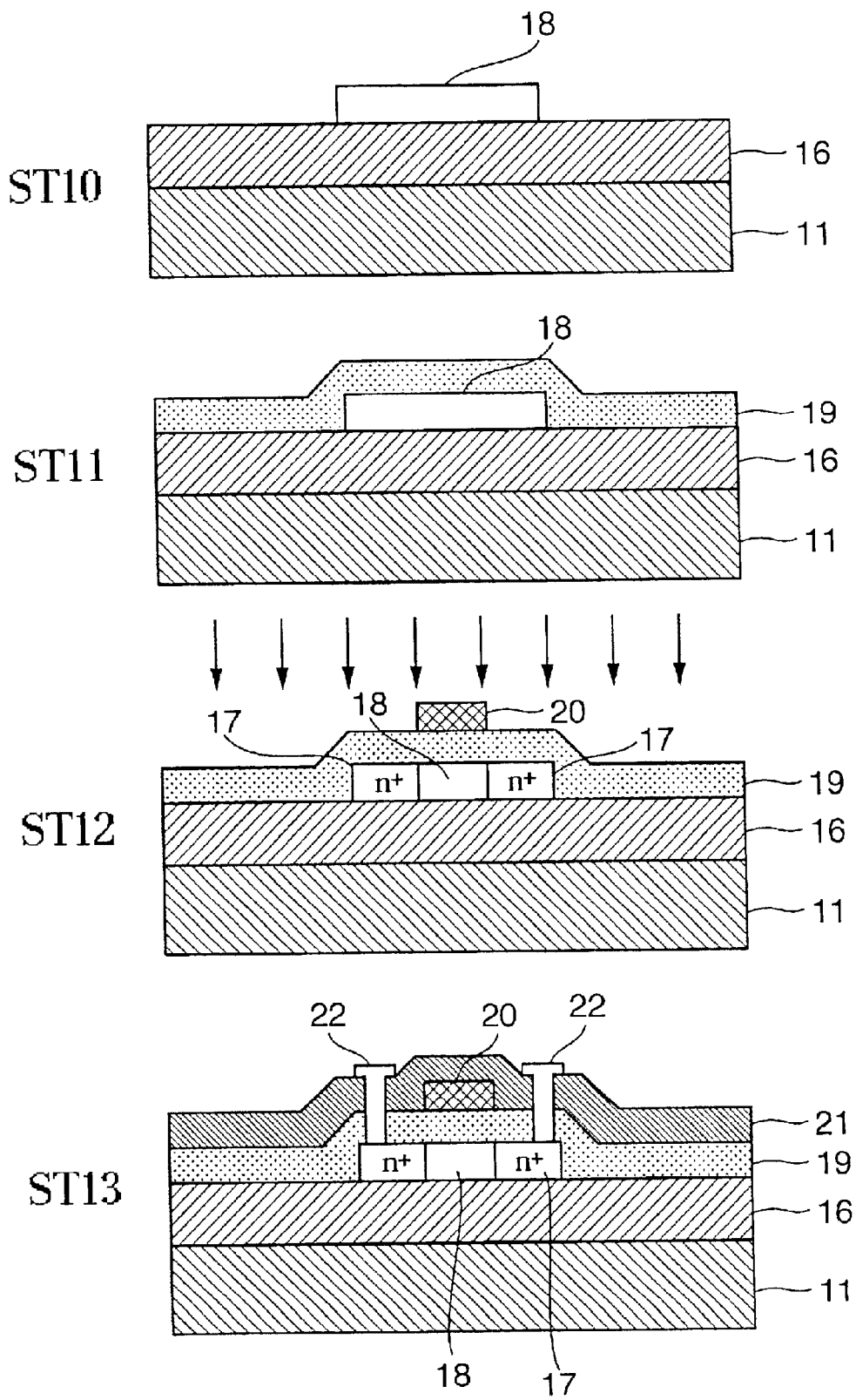
FIG. 8 consists of manufacturing process sectional views of the second step for the example in which a TFT is formed as a transferred body.

FIG. 8 illustrates a method of manufacturing a TFT Tp and To as described above through FIG. 7A, this being an example of a method of manufacturing a transferred body 12a.

Firstly, as shown in ST10, an SiO$_2$ film is deposited on the first substrate 10, thus forming an intermediate layer 16. Examples of the method of forming the SiO$_2$ film are publicly known methods, for example vapor phase deposition methods such as plasma enhanced chemical vapor deposition (PECVD), low pressure chemical vapor deposition (LPCVD), and sputtering. For example, an intermediate layer 16 of thickness 1 μm may be formed using PECVD. Next, a semiconductor film 18 is formed using a publicly known method, for example LPCVD. At this time, if the semiconductor film 18 if formed as a monocrystalline silicon film using a μ-CZ method or the like as will be described later, then a high-performance semiconductor film can be obtained. The semiconductor film 18 is patterned, thus forming into the shape of the semiconductor region of the TFT.

Next, as shown in ST11, an insulating film 19 of SiO$_2$ or the like is formed using a prescribed manufacturing method, for example electron cyclotron resonance PECVD (ECR-CVD), parallel plate PECVD, or LPCVD. The insulating film 19 acts as the gate insulator film of the TFT.

Next, as shown in ST12, a thin metal film of a prescribed gate metal such as tantalum or aluminum is formed by sputtering, and then patterning is carried out, thus forming a gate electrode 20. Impurity ions that will act as donors or acceptors are then implanted using the gate electrode 20 as a mask, thus producing source and drain regions 17 and a channel region 18 through self-alignment for the gate electrode 20. For example, to produce an NMOS transistor, phosphorus (P) is implanted as the impurity element into the source and drain regions to a prescribed concentration, for example $1\times10^{16}$cm$^{-2}$. A suitable energy is then applied, for example irradiation is carried out using an XeCl excimer laser at an irradiation energy concentration of about 200 to 400 mJ/cm$^2$, or else heat treatment is carried out at a temperature of about 250° C. to 450° C., thus activating the impurity element.

Next, as shown in ST13, an SiO$_2$ film 21 of thickness about 500 nm is formed on the upper surfaces of the insulating film 19 and the gate electrode 20 using a prescribed method, for example PECVD. Contact holes that reach as far as the source and drain regions 17 are then formed in the SiO$_2$ films 19 and 21, and source and drain electrodes 22 are formed by depositing aluminum or the like in the contact holes and around the rims of the contact holes using a prescribed method such as sputtering.

Next, a description will be given regarding separation of the transferred bodies 12a in the transferred layer 12. Methods that can be envisaged for separating the transferred bodies 12a are a method in which separation is carried out by etching or the like, in particular a method in which a separating structure is not provided (see the fourth embodiment), a method in which separation of only the peeling layer is carried out (see the fifth embodiment), and a method in which a prescribed structure is formed on the transfer origin substrate, thus making it easier to carry out separation into the individual transferred bodies (see the sixth embodiment). Here, a method in which separation into the individual transferred bodies 12a is carried out completely will be described.

Figure 5A:
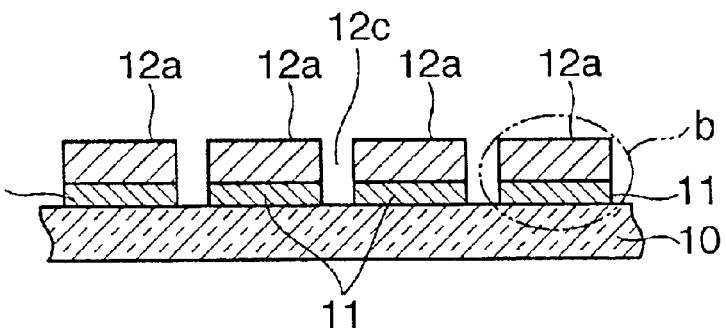
FIG. 5A is a sectional view for explaining a transferred body separation method in which the transferred layer and the peeling layer are completely etched.

In this method, to carry out the separation into the individual transferred bodies 12a, as shown in FIG. 5A, grooves 12c that form a recessed structure are formed by wet etching, dry etching or the like at the outer peripheries of the regions corresponding to the transferred bodies 12a, thus leaving the transferred bodies 12a behind as island shapes. Regarding these grooves 12c, in the thickness direction of the substrate, the whole of the transferred layer 12 is cut, and either the whole (FIG. 5A) or part (FIG. 6) of the peeling layer 11 is cut. The cuts may also be even shallower such that only the transferred layer 12 is targeted. The grooves 12c may be formed by etching as far as part way into the peeling layer 11 as in FIG. 6, or else the peeling layer 11 may be completely etched, thus leaving behind island shapes in which the transferred bodies 12a and the peeling layer 11 immediately thereunder have the same shape as each other, as shown in FIG. 5A. By creating an arrangement of the transferred bodies 12a on the first substrate 10 in which identical transferred bodies 12a are formed and then etching is carried out at equal intervals, it becomes easy to transfer only desired transferred bodies 12a in the peeling step (the fourth and fifth steps).

By cutting the transferred layer 12 in advance, it becomes possible to cleanly peel off part of the peeling body along the shape of the region in question, and hence damage to the region during the peeling can be prevented. Moreover, it becomes possible to ensure that the breaking of the transferred layer 12 accompanying the peeling does not extend to neighboring regions. Moreover, by inserting cuts in the film thickness direction in advance, it becomes possible to peel off a specific transferred body 12a even in the case that the adhesive strength of the adhesive layer that joins that transferred body 12a to the transfer destination substrate is weak. Moreover, the outline of the region targeted for transfer will be well-defined, and hence alignment during the transfer between substrates will become easy.

Figure 5B:
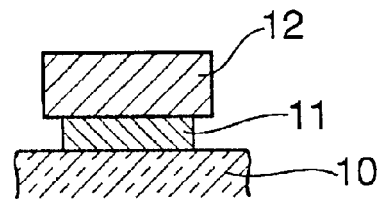
FIG. 5B is a sectional view for explaining a transferred body separation method in which over-etching is carried out.

Note that, as shown in FIG. 5B, over-etching may be carried out such that the area of bonding of the peeling layer 11 onto each transferred body 12a is less than the total area of the surface of the transferred body joined to the peeling layer. This is because, by over-etching the peeling layer 11 in this way, the area of the peeling layer becomes low, and hence when peeling is carried out by irradiating light onto the peeling layer 11, the peeling can be carried out reliably with a low force, and moreover by reducing the size of the peeling layer 11, the amount of light energy required for the peeling can be reduced.

Figure 5C:
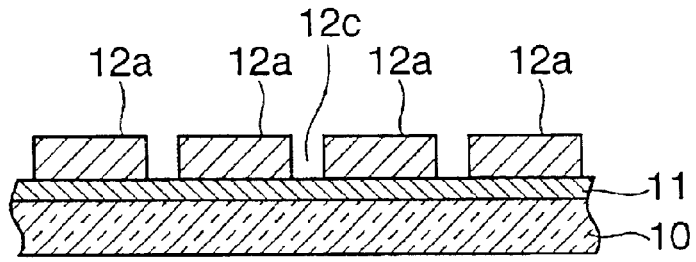
FIG. 5C is a sectional view for explaining a separation method in which only the transferred layer is etched and separation of the peeling layer is not carried out.
Figure 6:
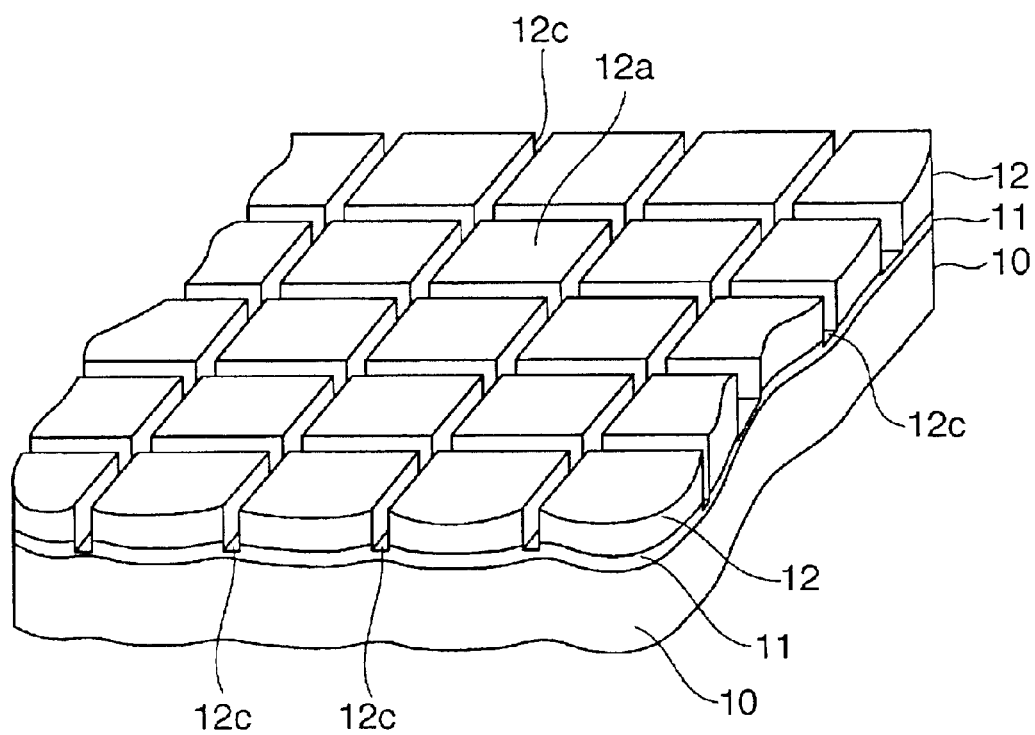
FIG. 6 is a perspective view for explaining a separation method in which grooves are formed at boundaries between the transferred bodies and the peeling layer is partially cut.

Furthermore, as shown in FIG. 5C, it is also possible to form grooves 12c by etching in only the transferred layer 12, leaving the peeling layer 11 in one piece. So long as it is possible to apply energy uniformly to the region in which a transferred body 12a is formed, peeling of the peeling layer 11 in this region can be made to occur reliably, and hence it will be possible to peel off only the desired transferred bodies even if splits are not provided in the peeling layer 11 itself.

<Third Step>

Figure 9A:
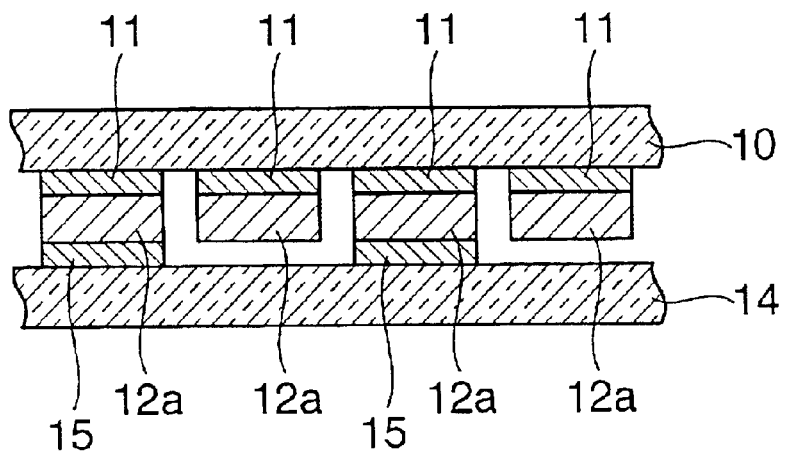
FIG. 9A is a sectional view of a third step in which a first substrate (transfer origin substrate) and a final substrate (transfer destination substrate) are joined together.

Next, as shown in FIG. 9A, the surface of the first substrate 10 on the side on which the transferred bodies 12a have been formed and the surface of a final substrate (transfer destination substrate) 14 on the side on which some of the transferred bodies 12a are to be transferred are placed together while carrying out alignment, and a pushing pressure is applied if necessary, thus selectively bonding only the transferred bodies 12a to be transferred onto the final substrate 14 side via an adhesive layer 15.

There are no particular limitations on the final substrate 14, but an example is a substrate (sheet), in particular a transparent substrate. This substrate may either be a flat sheet or a curved sheet. Moreover, the final substrate 14 may have properties such as heat resistance and corrosion resistance that are inferior to those of the first substrate 10. The reason for this is that, in the present invention, the transferred bodies 12a are formed on the first substrate 10 side and are subsequently transferred onto the final substrate 14, and hence the properties, in particular the heat resistance, required of the final substrate 14 do not depend on the temperature conditions and so on during the formation of the transferred bodies 12a.

Consequently, taking the maximum temperature during the formation of the transferred bodies 12a to be Tmax, a material having a glass transition temperature (Tg) or softening temperature lower than Tmax can be used as the constituent material of the final substrate 14. For example, the final substrate 14 can be constituted from a material having a glass transition temperature (Tg) or softening temperature of preferably 800° C. or less, more preferably 500° C. or less, yet more preferably 320° C. or less.

Moreover, regarding the mechanical properties of the final substrate 14, a final substrate 14 having some degree of rigidity (strength) is preferable, but the final substrate 14 may also be flexible and elastic. If devices such as TFTs are transferred onto such a flexible final substrate, then excellent properties that cannot be obtained with a highly rigid glass substrate can be realized. Consequently, in the present invention, by manufacturing, for example, an electro-optical apparatus using a flexible final substrate, an electro-optical apparatus that is flexible, light, and strong against impact when dropped can be realized.

Examples of the constituent material of the final substrate 14 include various synthetic resins and various glass materials; in particular, various synthetic resins and normal cheap low-melting-point glass materials are preferable. In particular, a soda glass substrate is low cost, and is thus an economically advantageous substrate. A soda glass substrate has a problem that alkaline components leach out upon heat treatment during TFT manufacture, and hence application to electro-optical apparatuses such as active matrix type liquid crystal displays has been difficult hitherto. However, according to the present invention, the devices are transferred onto the final substrate after already having been completed, and hence the above-mentioned problem associated with heat treatment is resolved. With the present invention, even substrates that have been difficult to use hitherto such as soda glass substrates can thus be used in the field of active matrix type electro-optical apparatuses.

The above-mentioned synthetic resin may be either a thermoplastic resin or a thermosetting resin; examples include polyolefins such as polyethylene, polypropylene, ethylene-propylene copolymers and ethylene-vinyl acetate (EVA) copolymers, cyclic polyolefins, modified polyolefins, polyvinyl chloride, polyvinylidene chloride, polystyrene, polyamides, polyimides, polyamidoimides, polycarbonates, poly(4-methylpentene-1), ionomers, acrylic resins, polymethyl methacrylate, acrylic-styrene copolymers (AS resins), butadiene-styrene copolymers, polyo copolymers (EVOH), polyesters such as polyethylene terephthalate (PET), polybutylene terephthalate (PBT) and polycyclohexane terephthalate (PCT), polyethers, polyether ketones (PEKs), polyether ether ketones (PEEKs), polyetherimides, polyacetal (POM), polyphenylene oxides, modified polyphenylene oxides, polyarylates, aromatic polyesters (liquid crystalline polymers), polytetrafluoroethylene, polyvinylidene fluoride, other fluororesins, thermoplastic elastomers of various types such as styrene type, polyolefin type, polyvinyl chloride type, polyurethane type, fluororubber type and chlorinated polyethylene type, epoxy resins, phenol resins, urea resins, melamine resins, unsaturated polyesters, silicone resins, and polyurethanes, and copolymers, blends, polymer alloys and so on based on the above. One of the above synthetic resins can be used, or two or more can be used in combination (for example, as a laminate of two or more layers).

Examples of the above-mentioned glass material include silicate glass (quartz glass), alkali silicate glass, soda-lime glass, potash-lime glass, lead (alkali) glass, barium glass, and borosilicate glass. Of these, ones other than silicate glass have a lower melting point than silicate glass, are relatively easily shaped and processed, and are cheap, and are thus preferable.

In the case that a substrate constituted from a synthetic resin is used as the final substrate 14, there are various advantages, for example a large final substrate can be formed as a single body, manufacture is easy even if the substrate has a complex shape having a curved surface or undulations, and the material cost and the manufacturing cost are low. The use of a synthetic resin is thus advantageous for forming large, cheap devices (for example, liquid crystal displays).

The final substrate 14 may itself constitute an independent device as in the case of a liquid crystal cell, or may constitute part of a device as in the case of a color filter, an electrode layer, a dielectric layer, an insulating layer, or a semiconductor device.

Furthermore, the final substrate 14 may also be a material such as a metal, a ceramic, stone, wood or paper, and may be on any chosen surface of some article (e.g. on a surface of a watch, on a surface of an air conditioner, or on a printed circuit board), or may be on the surface of a structure such as a wall, a pillar, a ceiling or a windowpane.

Preferable examples of the adhesive constituting the adhesive layer 15 include various curable adhesives, for example reactive curing adhesives, thermosetting adhesives, photo-curing adhesives such as UV-curing adhesives, and anaerobic curing adhesives. The adhesive may have any constitution, for example epoxy type, acrylate type, silicone type and so on. Moreover, in the case of using a commercially sold adhesive, the viscosity of the adhesive may be adjusted so as to be suitable for application by adding an appropriate solvent.

In the present embodiment, the adhesive layer 15 is formed on only the transferred bodies 12a to be transferred, or on the final substrate 14 in only places corresponding to the transferred bodies 12a to be transferred. Such local formation of the adhesive layer 15 can be carried out using any of various printing methods or liquid discharge methods. Liquid discharge methods include, for example, a piezoelectric jetting method in which liquid is discharged using the deformation of piezoelectric bodies, and a method in which liquid is discharged by forming bubbles through heat. In the present embodiment, an example is given in which the adhesive layer 15 is formed using an ink jet coating (liquid discharge) method.

Figure 10:
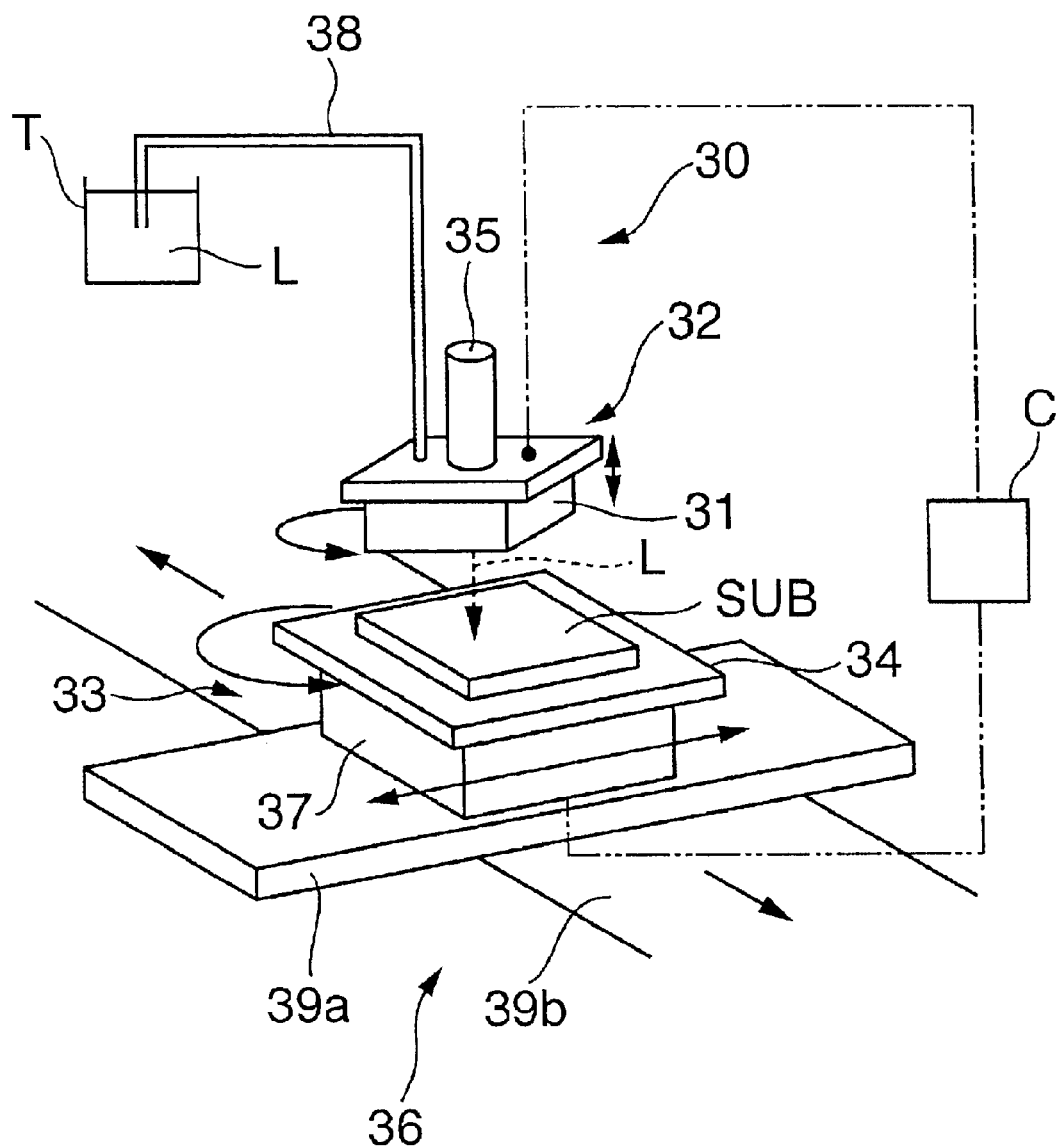
FIG. 10 is a perspective view illustrating a thin film formation (liquid jetting) apparatus for implementing an ink jet coating method used in layer formation in the present invention.

FIG. 10 is a perspective view illustrating an ink jet type thin film formation apparatus that can be used for forming the adhesive layer 15 on adhesive application parts on either the transferred bodies 12a to be transferred or else the final substrate 14 in places corresponding to the transferred bodies 12a to be transferred. The thin film formation apparatus 30 comprises an ink jet mechanism 32 having an ink jet head 31 that discharges a liquid adhesive L onto a substrate (the first substrate 10 or the final substrate 14) SUB, a shifting mechanism 33 for shifting the ink jet head 31 and the substrate SUB relative to one another, and a control part C for controlling the ink jet mechanism 32 and the shifting mechanism 33.

The shifting mechanism 33 is constituted from a head supporting part 35 that supports the ink jet head 31 so that the ink jet head 31 faces downwards above the substrate SUB, which is placed on a substrate stage 34, and a stage driver 36 that shifts the substrate stage 34 and hence also the final substrate SUB in the X- and Y-directions relative to the ink jet head 31. The head supporting part 35 comprises a mechanism such as a linear motor that is capable of shifting, at any chosen shifting speed, and positioning the ink jet head 31 relative to the substrate SUB in the vertical (Z-axis) direction, and a mechanism such as a stepping motor that is capable of rotating the ink jet head 31 about a vertical central axis and thus setting the angle of the ink jet head 31 relative to the substrate SUB therebelow to be any chosen angle.

The stage driver 36 comprises a θ-axis stage 37 that is capable of rotating the substrate stage 34 about a vertical central axis and thus setting the angle of the substrate stage 34 relative to the ink jet head 31 thereabove to be any chosen angle, and stages 39a and 39b that carry out shifting and positioning of the substrate stage 34 in horizontal directions (the X-direction and the Y-direction respectively) relative to the ink jet head 31. The θ-axis stage 37 has a driving source such as a stepping motor, and the stages 39a and 39b each has a driving source such as a linear motor.

The ink jet mechanism 32 comprises the ink jet head 31, and a tank T that is connected to the ink jet head 31 via a flow path 38. The tank T stores the liquid adhesive L, and the liquid adhesive L is fed to the ink jet head 31 via the flow path 38. Due to this constitution, the ink jet mechanism 32 is such that liquid adhesive L stored in the tank T is discharged from the ink jet head 31, and is thus applied onto the final substrate SUB.

The ink jet head 31 is, for example, such that liquid chambers are compressed through piezoelectric elements and liquid is discharged through the resulting pressure wave, and has a plurality of nozzles (nozzle holes) arranged in one or a plurality of rows.

Figure 11A:
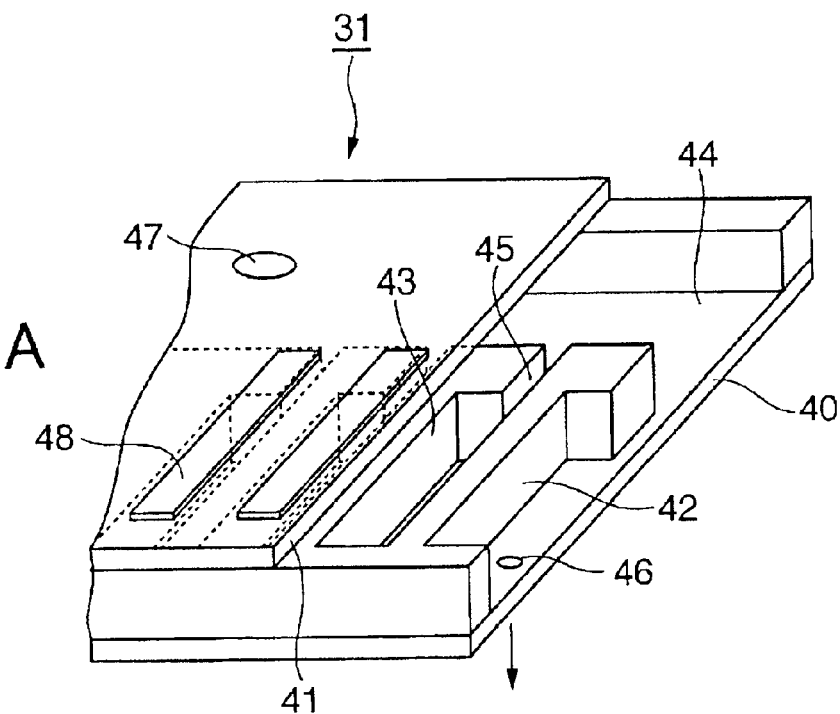
FIG. 11A is a perspective view of main parts for explaining the rough constitution of a head in the thin film formation (liquid jetting) apparatus.

Describing an example of the structure of the ink jet head 31, as shown in FIG. 11A, the ink jet head 31 comprises, for example, a stainless steel nozzle plate 40 and a diaphragm 41, with the two being joined together via a partitioning member (reservoir plate) 42. A plurality of spaces 43 and a liquid reservoir 44 are formed by the partitioning member 42 between the nozzle plate 40 and the diaphragm 41. The inside of each of the spaces 43 and the liquid reservoir 44 is filled with the liquid adhesive L, and each of the spaces 43 communicates with the liquid reservoir 44 via a supply port 45. Moreover, nozzles 46 for ejecting the liquid adhesive L from the spaces 43 are formed in the nozzle plate 40. Furthermore, a hole 47 for feeding the liquid adhesive L into the liquid reservoir 44 is formed in the diaphragm 41.

Figure 11B:
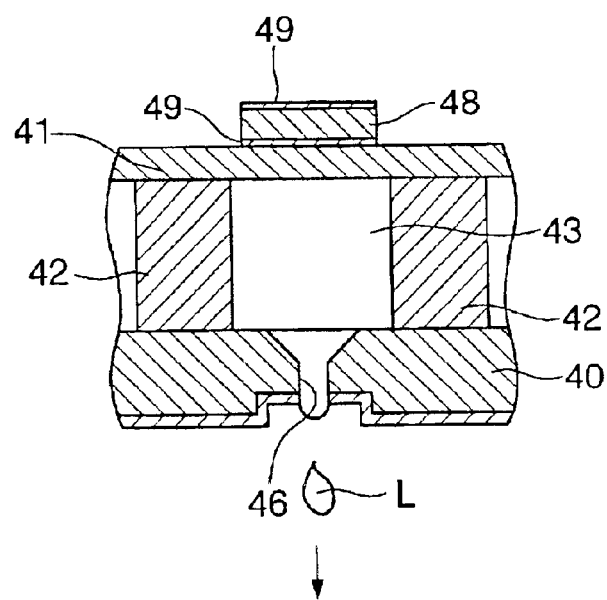
FIG. 11B is a sectional view of the main parts from the side.

Moreover, as shown in FIG. 11B, piezoelectric elements 48 are joined onto the surface of the diaphragm 41 on the opposite side to the surface facing the spaces 43. Each piezoelectric element 48 is positioned between a pair of electrodes 49, and is constituted so as to bend such as to project outwards upon passing a current. Due to this constitution, the diaphragm 41, which is joined to each piezoelectric element 48, forms a single body with the piezoelectric element 48 and thus also bends outwards at the same time, whereupon the volume of the space 43 increases. An amount of the liquid adhesive L corresponding to the increase in the volume in the space 43 thus flows into the space 43 from the liquid reservoir 44 via the supply port 45. From this state, if the passing of the current to the piezoelectric element 48 is stopped, then the piezoelectric element 48 and the diaphragm 41 both return to their original shapes.

The space 43 thus also returns to its original volume, and hence the pressure of the liquid adhesive L inside the space 43 increases, and thus a drop of the liquid adhesive L is discharged from the nozzle 46 towards the substrate SUB.

Note that, as the liquid adhesive discharge method, as mentioned earlier, in addition to a piezoelectric jetting method using piezoelectric elements 48 as described above, it is also possible to adopt, for example, a method in which electricity-to-heat converters are used as the energy generating elements, and the liquid is discharged by forming bubbles.

The control part C is constituted from a CPU such as a microprocessor that carries out control of the apparatus as a whole, a computer having functions of inputting and outputting various signals, or the like. By electrically connecting the control part C to each of the ink jet mechanism 32 and the shifting mechanism 33 as shown in FIG. 10, at least one of, and preferably both of, the discharging operation of the ink jet mechanism 32 and the shifting operation of the shifting mechanism 33 can be controlled. According to this constitution, there is a function of being able to change the application conditions of the liquid adhesive L and thus accurately control the position of formation and the film thickness of the adhesive layer 15 formed. Specifically, the control part C may have, as functions for controlling the film thickness, a control function of changing the discharge spacing of the applied liquid L, a control function of changing the amount of the applied liquid L discharged per dot, a control function of changing the orientation of the nozzles 46, and changing the shifting direction and angle θ using the shifting mechanism 33, a control function of setting the application conditions for each application in the case that application is carried out repeatedly in the same position on the substrate SUB, and a control function of dividing the substrate SUB into a plurality of regions and setting the application conditions for each region. Furthermore, the control part C may have, as control functions for changing the above-mentioned discharge spacing, a control function of changing the discharge spacing by changing the relative speed of shifting between the substrate SUB and the ink jet head 31, a control function of changing the discharge spacing by changing the time interval between discharges during the shifting, and a control function of changing the discharge spacing by setting as desired some of the plurality of nozzles to discharge the liquid adhesive L simultaneously.

According to this ink jet type thin film formation apparatus 30, by placing the first substrate 10 on which a large number of transferred bodies 12a have been formed or the final substrate 14 on the substrate stage 34, and applying the liquid adhesive L from the ink jet head 31 in desired regions only, it is possible to form the adhesive layer 15 efficiently in a large number of regions.

Figure 12A:
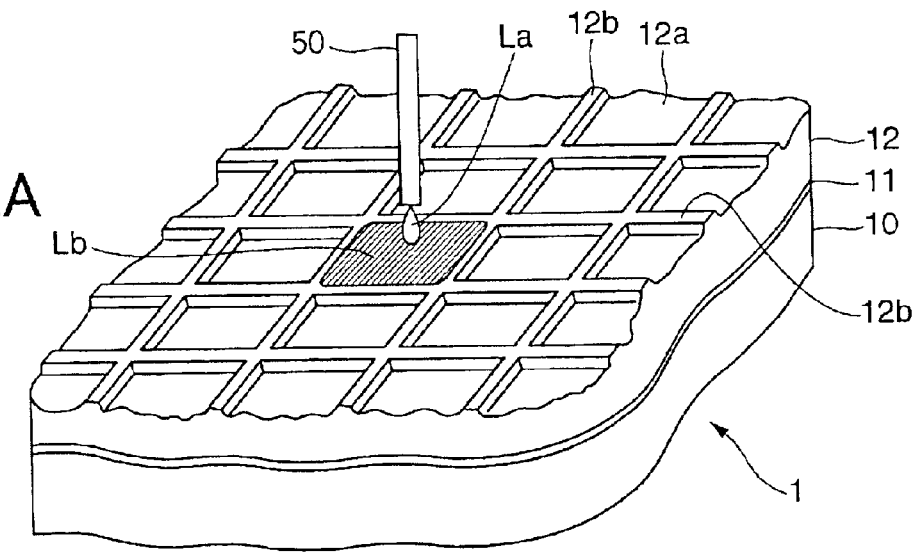
FIG. 12A is a perspective view showing a state in which banks have been formed on the transferred bodies for preventing a material from flowing out.
Figure 12B:
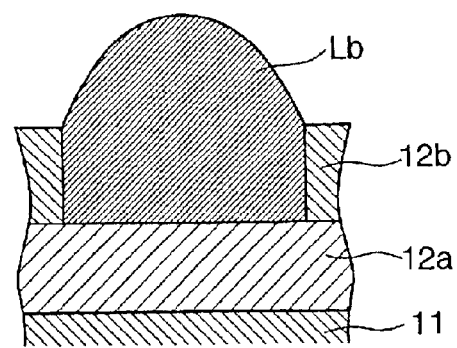
FIG. 12B is an enlarged sectional view of main parts in this case.

Next, a description will be given of the formation of banks, which are preferable when forming the adhesive layer using the ink jet coating method. To accurately form the adhesive layer using the ink jet coating method on only the desired adhesive application parts, i.e. on only the transferred bodies 12a to be transferred, or on only the parts of the final substrate 14 corresponding to the transferred bodies 12a to be transferred, it is preferable to provide means for preventing the liquid adhesive L applied onto the adhesive application parts from running out onto other parts. One suitable means for preventing the liquid adhesive L from running out onto such other parts is to form banks 12b (partitioning walls) at peripheral parts on the transferred bodies 12a. FIG. 12A is a perspective view illustrating the structure after the liquid adhesive L has been placed inside the banks 12b, and FIG. 12B is an enlarged sectional view of the region that has been filled with the liquid adhesive L. Note that in the example shown in FIGS. 12A and B, the constitution has been made to be such that the banks 12b are provided on the transferred bodies 12a, but it is also possible to form banks on the final substrate 14 side to enable the liquid adhesive L to be placed in the regions of the final substrate 14 where the transferred bodies 12a are to be disposed. The banks 12b can be formed using the same material and manufacturing method as with well-known banks (partitioning walls) in the field of, for example, manufacturing color filters for liquid crystal displays.

Moreover, an example of another means for preventing the liquid adhesive L from running out onto parts other than the adhesive application parts is providing an adhesive-repellent layer on the parts other than the adhesive application parts, or providing an adhesive-attractive layer on the adhesive application parts and providing an adhesive-repellent layer on the parts other than the adhesive application parts. Regarding the materials of the adhesive-repellent layer and the adhesive-attractive layer, materials that have suitable liquid-repellent properties and liquid-attractive properties towards the liquid adhesive L used can be selected as appropriate in accordance with the type of the liquid adhesive L used. It is preferable to use a SAM (self-assembled monolayer) film using a fluororesin such as hexafluoropolypropylene.

<Fourth Step>

Figure 9B:
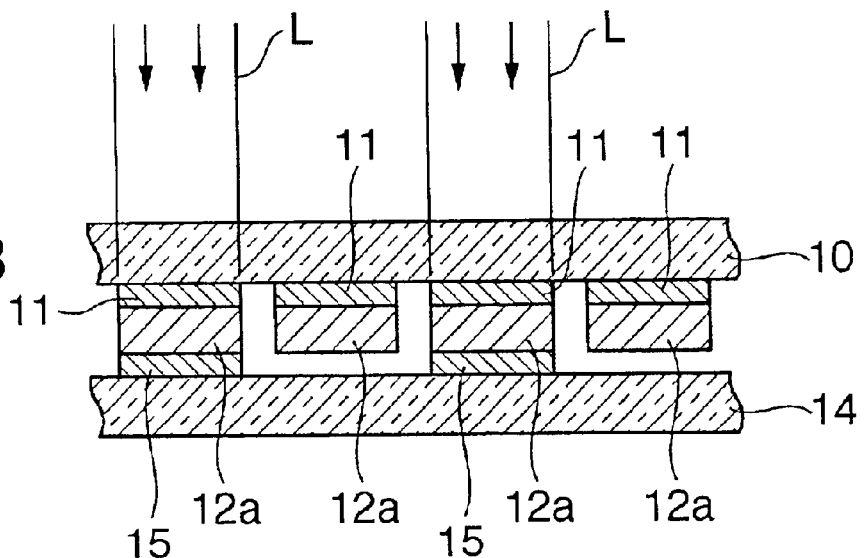
FIG. 9B is a sectional view of a fourth step in which partial irradiation with light is carried out from the first substrate (transfer origin substrate) side, thus bringing about peeling in desired regions.

Next, as shown in FIG. 9B, light L is selectively irradiated onto the peeling layer 11 at only the transferred bodies 12a to be transferred, this being from the first substrate 10 side of the joined body comprising the first substrate 10 and the final substrate 14 joined together via a large number of the transferred bodies 12a, whereby peeling (in-layer peeling and/or interfacial peeling) is made to occur at the peeling layer 11 only where the peeling layer 11 supports the transferred bodies 12a to be transferred.

The principles by which in-layer peeling and/or interfacial peeling of the peeling layer 11 occurs are that ablation of the constituent material of the peeling layer 11 occurs, a gas contained in the peeling layer 11 is discharged, and a phase change such as melting or evaporation occurs immediately after the irradiation.

Here, 'ablation' refers to the fixing material (the constituent material of the peeling layer 11) that has absorbed the irradiated light being excited optically or thermally, and hence bonds between atoms or molecules at the surface of or inside the fixing material breaking, resulting in discharge; this is manifested primarily as a phenomenon in which all or part of the constituent material of the peeling layer 11 undergoes a phase change such as melting or evaporation. Moreover, the bonding strength may drop due to minute bubbles being formed through the phase change.

Whether it is in-layer peeling or interfacial peeling or both that occurs in the peeling layer 11 depends on the composition of the peeling layer 11 and various other factors, for example the irradiation conditions such as the type, wavelength, intensity and penetration depth of the light irradiated, The irradiated light L may be any that brings about in-layer peeling and/or interfacial peeling of the peeling layer 11; examples include X-rays, UV rays, visible light, infrared rays (heat rays), laser light, millimeter waves, microwaves, electron rays, and radiation (α-rays, β-rays, γ-rays).

Of these, from the standpoint of peeling (ablation) of the peeling layer 11 occurring readily and local irradiation with high precision being possible, laser light is preferable. Laser light is coherent, and hence is suitable for irradiating high-output-power pulsed light onto the peeling layer via the first substrate 10, thus bringing about peeling at the desired places with high precision. By using laser light, the peeling off of the transferred bodies 12a can thus be carried out easily and reliably.

Examples of laser apparatuses for generating such laser light include various gas lasers and solid state lasers (semiconductor lasers); it is preferable to use an excimer laser, an Nd-YAG laser, an Ar laser, a $CO_2$ laser, a CO laser, an He—Ne laser or the like.

The laser light preferably has a wavelength of 100 to 350 nm. By using such short-wavelength laser light, the precision of the light irradiation can be raised, and the peeling in the peeling layer 11 can be carried out effectively.

Examples of lasers that generate laser light satisfying the above conditions include excimer lasers. Excimer lasers are gas lasers for which high-energy laser light output in the short-wavelength UV region is possible; by using a combination of a noble gas (Ar, Kr, Xe etc.) and a halogen gas ($F_2$, HCl etc.), laser light of any of four representative wavelengths can be outputted (XeF=351 nm, XeCl=308 nm, KrF=248 nm, ArF=193 nm). Because an excimer laser outputs a high energy in a low-wavelength region, ablation in the peeling layer 11 can be brought about in an extremely short time, and hence peeling of the peeling layer 11 can be carried out with virtually no temperature increase in the adjacent final substrate 14 and first substrate 10, and no degradation of or damage to the transferred bodies 12a and the like.

Alternatively, in the case of producing a separation property by bringing about gas discharge or a phase change such as evaporation or sublimation in the peeling layer 11, the wavelength of the laser light irradiated is preferably from about 350 to about 1200 nm.

In the case of laser light of such a wavelength, a laser light source or irradiation apparatus widely used in the field of general processing such as a YAG or gas laser can be used, and hence the irradiation with light can be carried out cheaply and easily. Moreover, by using such laser light having a wavelength in the visible region, the first substrate 10 need transmit only visible light, and hence the freedom to choose the first substrate 10 can be broadened.

Moreover, the energy density of the laser light irradiated, in particular the energy density in the case of an excimer laser, is preferably made to be about 10 to 5000 $mJ/cm^2$, more preferably about 100 to 500 $mJ/cm^2$. Moreover, the irradiation time is preferably made to be about 1 to 1000 nsec, more preferably about 10 to 100 nsec. This is because the higher the energy density and/or the longer the irradiation time, then the more readily ablation occurs, but the lower the energy density and/or the shorter the irradiation time, then the more the risk of there being adverse effects on the transferred bodies 12a or the like due to irradiated light passing through the peeling layer 11 can be reduced.

Note that as a measure against irradiated light passing through the peeling layer 11 and thus reaching and exerting adverse effects on the transferred bodies 12a, there is, for example, a method in which a metal film of tantalum (Ta) or the like is formed on the peeling layer 11. Laser light that passes through the peeling layer 11 is completely reflected at the interface with the metal film, and hence there are no adverse effects on the transferred bodies 12a thereabove.

It is preferable for the irradiated light such as laser light to be irradiated such that the intensity thereof is uniform. The direction of irradiation of the irradiated light is not limited to being the direction perpendicular to the peeling layer 11, but rather may also be a direction inclined at a certain prescribed angle relative to the peeling layer 11.

Moreover, in the case that the area of the peeling layer 11 is greater than the area of one irradiation of the irradiated light, it is possible to irradiate the irradiated light over the whole of the peeling layer 11 by dividing the irradiation into a plurality of times. Moreover, the same place may be irradiated two or more times. Moreover, irradiation may be carried out two or more times, with irradiated light (laser light) of different types or different wavelengths (wavelength bands) being irradiated onto the same region or different regions.

<Fifth Step>

Figure 9C:
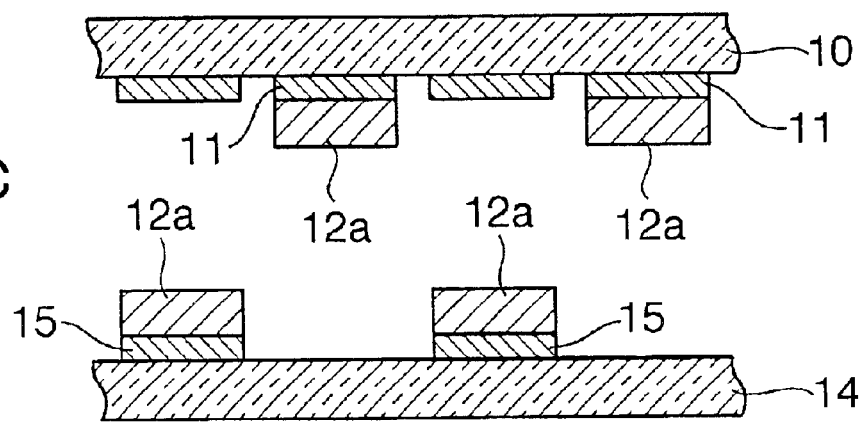
FIG. 9C is a sectional view of a fifth step in which the first substrate (transfer origin substrate) and the final substrate (transfer destination substrate) are pulled apart after the peeling.

Next, as shown in FIG. 9C, forces are applied to the first substrate 10 and the final substrate 14 in a direction so as to separate the two, thus removing the first substrate 10 from the final substrate 14. Through the fourth step described above, the peeling layer 11 on the transferred bodies 12a to be transferred onto the final substrate 14 has been peeled off from the transferred bodies 12a, and hence these transferred bodies 12a to be transferred are disconnected from the first substrate 10 side. Moreover, the transferred bodies 12a to be transferred have been joined to the final substrate 14 through the adhesive layer 15. Note that, in the fourth step described above, it is preferable to bring about complete peeling of the peeling layer 11 from each of the transferred bodies 12a to be transferred, but it is also possible to bring about peeling of only part of the peeling layer 11 from each of the transferred bodies 12a to be transferred, so long as the adhesive strength of the adhesive layer 15 to the transferred bodies 12a to be transferred wins out over the joining strength of the remaining parts of the peeling layer 11, and hence when the first substrate 10 and the final substrate 14 are pulled apart, the transferred bodies 12a to be transferred are reliably transferred onto the final substrate 14 side.

In this way, whether or not the transferred bodies are transferred is determined by the relative strength relationship between the bonding strength of the peeling layer, which has been weakened through the peeling of the peeling layer, and the bonding strength of the adhesive layer that has been applied to the transferred bodies. If the peeling of the peeling layer is sufficient, then transfer of the transferred bodies will be possible even if the bonding strength of the adhesive layer is weak, and moreover, on the other hand, even if the peeling of the peeling layer is somewhat insufficient, transfer of the transferred bodies will be possible if the bonding strength of the adhesive layer is high.

As shown in FIG. 9C, by pulling the first substrate 10 away from the final substrate 14, transferred bodies 12a are transferred into a plurality of positions on the final substrate 14. Transferred bodies 12a that are not transferred remain on the first substrate 10.

There are cases that peeling residue from the peeling layer 11 remains attached to the transferred bodies 12a after transfer onto the final substrate 14, and it is preferable to completely remove this peeling residue. The method used for removing the residual parts of the peeling layer 11 can be selected as appropriate from methods such as washing, etching, ashing, polishing and so on, or a combination thereof.

Similarly, in the case that peeling residue from the peeling layer 11 remains attached to the surface of the first substrate 10 after the transfer of the transferred bodies 12a has been completed, this can be removed as described above for the final substrate 14. The first substrate 10 can thus be reused (recycled). By reusing the first substrate 10 in this way, wastefulness can be avoided with regard to the manufacturing cost. This is particularly significant in the case that a first substrate 10 made from an expensive material such as quartz glass or a scarce material is used.

Note that it is possible to apply the third invention described earlier to the present embodiment, i.e. repeat the third to fifth steps described above on the first substrate 10 having some of the transferred bodies 12a remaining thereon, thus transferring a large number of transferred bodies 12a onto separate final substrates 14 one after another.

Specifically, the first and second steps described above correspond to the manufacture of the transfer origin substrate (the first substrate 10 and the transferred layer 12) of S1 in FIG. 3, the third step described above corresponds to the application of the adhesive 15 and the alignment of the transfer destination substrate (the final substrate 14) of S2 and S3 in FIG. 3, the fourth step described above corresponds to the partial irradiation with light of S4 in FIG. 3, and the fifth step described above corresponds to the peeling step of S5 in FIG. 3. Each time transferred bodies 12a are transferred, a new final substrate 14 is aligned as a transfer destination substrate and adhesion is carried out (S3), irradiation of light is carried out selectively (S4), and then the transferred bodies 12a to be transferred are peeled off along with the final substrate 14 (S5), i.e. the sequence of steps S2 to S6 is repeated as long as transferred bodies 12a still remain on the first substrate 10 (the transfer origin substrate). In the case of applying the third invention and transferring to a plurality of final substrates 14 one after another in this way, and thus applying the present manufacturing method to, for example, the manufacture of an active matrix board for an electro-optical apparatus, it is possible to efficiently dispose in scattered locations minute transferred bodies 12a such as TFTs for each of a large number of pixels on a substrate.

Through the steps described above, a large number of transferred bodies 12a to be transferred can be selectively transferred onto a final substrate 14. Afterwards, the transferred bodies 12a that have been transferred can be connected to wiring on the final substrate 14 through wiring formed using any of various methods as will be described later, for example an ink jet coating method, photolithography, or a coating method combined with liquid repellency treatment using an SAM (self-assembled monolayer) film, a protective film can be formed if desired, and so on.

According to the transfer method of the present first embodiment, a large number of transferred bodies 12a that are to be disposed in scattered locations with spaces therebetween on a final substrate 14 can be manufactured concentrated together on a first substrate 10, and hence compared with the case that the transferred bodies 12a are formed on the final substrate 14 directly, the area efficiency in the manufacture of the transferred bodies 12a can be greatly improved, and a final substrate 14 on which a large number of transferred bodies 12a are disposed in scattered locations can be manufactured efficiently and cheaply.

Moreover, according to the transfer method of the present embodiment, it becomes easy to carry out selection and elimination before transfer on a large number of transferred bodies 12a that have been manufactured concentrated together on a first substrate 10, and hence the product yield can be improved.

Furthermore, according to the transfer method of the present embodiment, transferred bodies 12a that are either the same as or different to one another can be built up on one another and combined, and hence by combining devices that are manufactured under different process conditions to one another, it is possible to provide devices having a layered structure for which manufacture has been difficult hitherto, and moreover devices having a three-dimensional structure can be manufactured easily.

Moreover, according to the present embodiment, the transferred bodies can be aligned accurately on the final substrate 14, and hence, unlike with microstructures used in a conventional microstructure disposing technique, extra symmetrical circuit structures becomes unnecessary, and extremely small blocks in which only the minimum required circuitry is formed can be produced; consequently, an extremely large number of transferred bodies 12a can be manufactured concentrated together on the first substrate 10, and the cost per device can be greatly reduced.

Moreover, because minute transferred bodies 12a can be disposed accurately in prescribed positions on the final substrate 14, transferred bodies 12a having excellent ability to follow curvature of the substrate can be provided. Furthermore, mounting on a curved surface such as that of a curved display or an automobile body becomes possible.

Moreover, according to the present embodiment, because minute transferred bodies 12a can be disposed accurately in prescribed positions on the final substrate 14, devices can be disposed in minute regions for which device installation has been impossible or costly hitherto, for example at the tips of optical fibers, and hence the scope of application of the devices can be expanded.

Moreover, according to the present embodiment, because grooves are formed by etching at the boundaries between the regions of the transferred bodies 12a, the film thickness becomes thinner at the boundary parts, and hence separation and peeling can be carried out easily along the boundary parts for each transferred body, and thus it becomes possible to prevent damage to the transferred bodies during the peeling.

Second Embodiment

FIGS. 13A to 13D are drawings for explaining a second embodiment (transfer method) of the present invention. As with the first embodiment described above, the present second embodiment comes under the first invention, which relates to carrying out partial transfer once, but the present second embodiment differs from the first embodiment in particular in that, in the third step, the transferred bodies 12a to be transferred are joined to the final substrate 14 through a combination of a UV-curing resin and partial irradiation with UV light.

The first step and the second step can be carried out as in the first embodiment described above with regard to the methods of operation, components and materials used, formation conditions and so on, and hence the description of these steps will be omitted here.

In this second embodiment, a first substrate 10 having a large number of transferred bodies 12a formed thereon, and a final substrate 14 having an adhesive layer 52 comprising a UV-curing resin applied over the whole of the surface thereof on the side onto which the transferred bodies 12a are to be transferred, are prepared through the first step (see FIGS. 4A and B) and the second step (see FIGS. 5A to C) of the first embodiment described above.

Figure 13A:
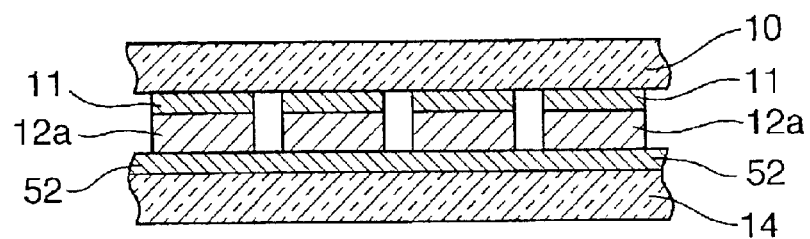
FIG. 13A is a sectional view showing a state in which a first substrate (transfer origin substrate) and a final substrate (transfer destination substrate) have been placed on top of one another with a UV-curing resin therebetween.

Then, as shown in FIG. 13A, the first substrate 10 is placed onto the final substrate 14, while carrying out alignment such that the transferred bodies 12a to be transferred are aligned with prescribed positions on the final substrate 14.

There are no particular limitations on the UV-curing resin used in the adhesive layer 52, so long as the UV-curing resin is cured upon irradiation with UV light and is capable of joining the transferred bodies 12a disposed in contact with the adhesive layer 52 onto the final substrate 14 side with a sufficient adhesive strength; a UV-curing resin selected as appropriate from various commercially sold ones can be used. The method of applying the UV-curing resin onto the final substrate 14 can also be selected as appropriate from various well-known coating methods; preferably, a spin coating method or the like is used, whereby the adhesive layer 52 can easily be formed to the desired film thickness. The film thickness of the adhesive layer 52 can be changed as appropriate in view of the size of the transferred bodies 12a, the adhesive strength of the adhesive used, and so on.

Figure 13B:
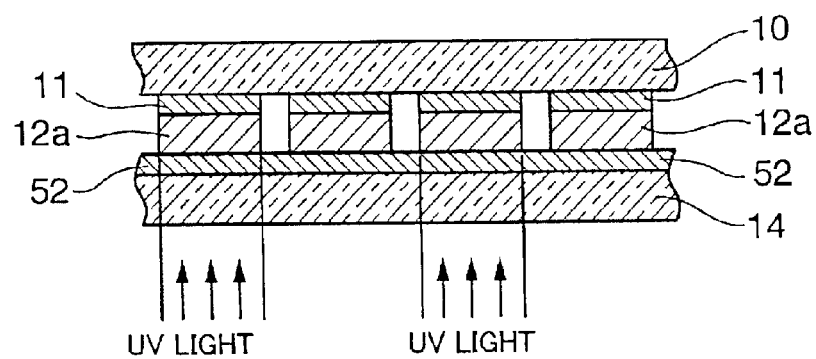
FIG. 13B is a sectional view for explaining a step in which partial irradiation with UV light is carried out.

Next, as shown in FIG. 13B, partial irradiation with UV light, i.e. irradiation of UV light onto the adhesive layer 52 only in places where the adhesive layer 52 is in contact with transferred bodies 12a to be transferred, is carried out via the final substrate 14, thus curing the adhesive layer 52 in these places. The UV light used should be such that it is possible to cure the adhesive layer 52 comprising the UV-curing resin only at the irradiated parts, and it is preferable to adjust the irradiation conditions such as the wavelength, the light intensity and the irradiation time as appropriate in accordance with the properties of the final substrate 14 (the thickness, the transmissivity to the UV light etc.) and the type of the UV-curing resin used. The irradiation of the UV light onto the adhesive layer 52 only in the places where the adhesive layer 52 is in contact with the transferred bodies 12a to be transferred can be carried out easily and reliably by a method such as disposing a mask on the surface of the final substrate 14 on the opposite side to the surface on which the adhesive layer 52 is formed.

After the irradiation with UV light as shown in FIG. 13B, uncured UV-curing resin on the final substrate 14 is washed off using a suitable solvent such as water. As a result, the state becomes such that, out of the large number of transferred bodies 12a on the first substrate 10 side, only those transferred bodies 12a to be transferred onto the final substrate 14 side are joined to the final substrate 14 side by an adhesive layer 54 comprising the cured resin.

Figure 13C:
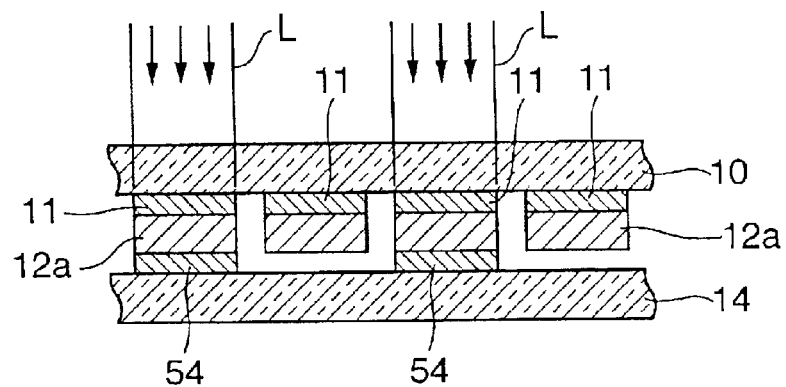
FIG. 13C is a sectional view showing a fourth step in which partial irradiation with light is carried out from the first substrate side, thus bringing about peeling in desired regions.

Next, as shown in FIG. 13C, as in the fourth step (see FIG. 9B) in the first embodiment described above, partial irradiation with laser light L is carried out via the first substrate 10 onto the peeling layer 11 only where the peeling layer 11 is in contact with the transferred bodies 12a to be transferred, thus bringing about peeling of the peeling layer 11 where the irradiation with light is carried out. The details are as with the first embodiment described above and will thus be omitted here.

Figure 13D:
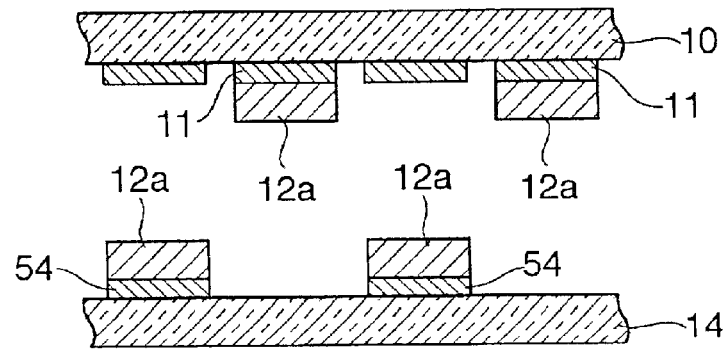
FIG. 13D is a sectional view showing a fifth step in which the first substrate and the final substrate are pulled apart after the peeling.

Next, as shown in FIG. 13D, as in the fifth step (see FIG. 9C) in the first embodiment described above, forces are applied to the first substrate 10 and the final substrate 14 in a direction so as to separate the two, thus removing the first substrate 10 from the final substrate 14. The details are as with the first embodiment described above and will thus be omitted here.

It is possible to apply the third invention to the present second embodiment, i.e. repeat the third to fifth steps; this is as with the first embodiment described above.

With the transfer method according to the present second embodiment, effects equivalent to those of the first embodiment described above can be obtained; furthermore, the UV-curing resin can be applied over the whole surface of the final substrate 14, and by irradiating with UV light only in certain places it is possible to join only the transferred bodies 12a to be transferred onto the final substrate 14 easily and reliably; the manufacturing process can thus be simplified.

Third Embodiment

Figure 14A:
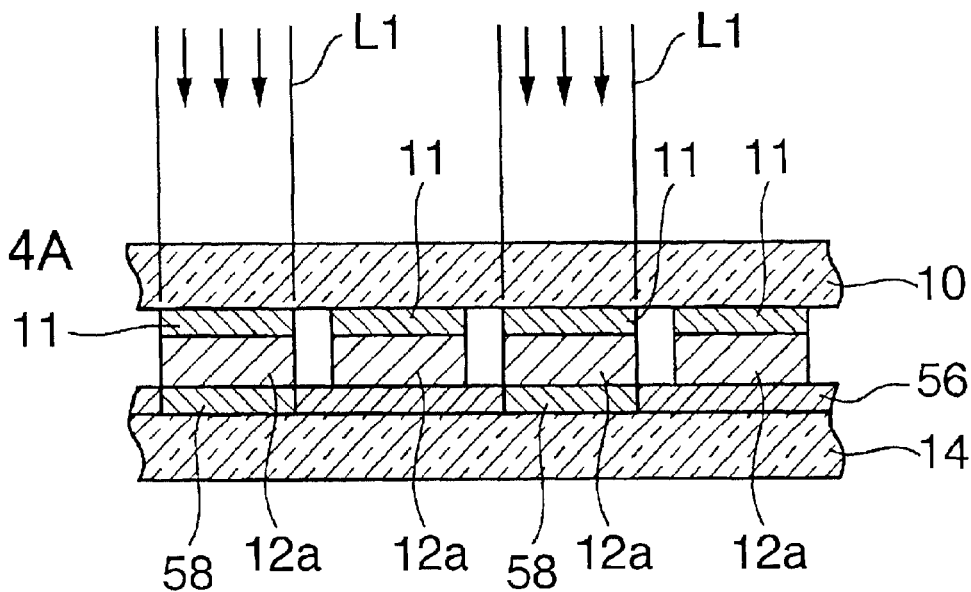
FIG. 14A is a sectional view showing a step in which first laser light irradiation is carried out from a first substrate (transfer origin substrate) side, thus joining desired transferred bodies to a final substrate (transfer destination substrate)
Figure 14B:
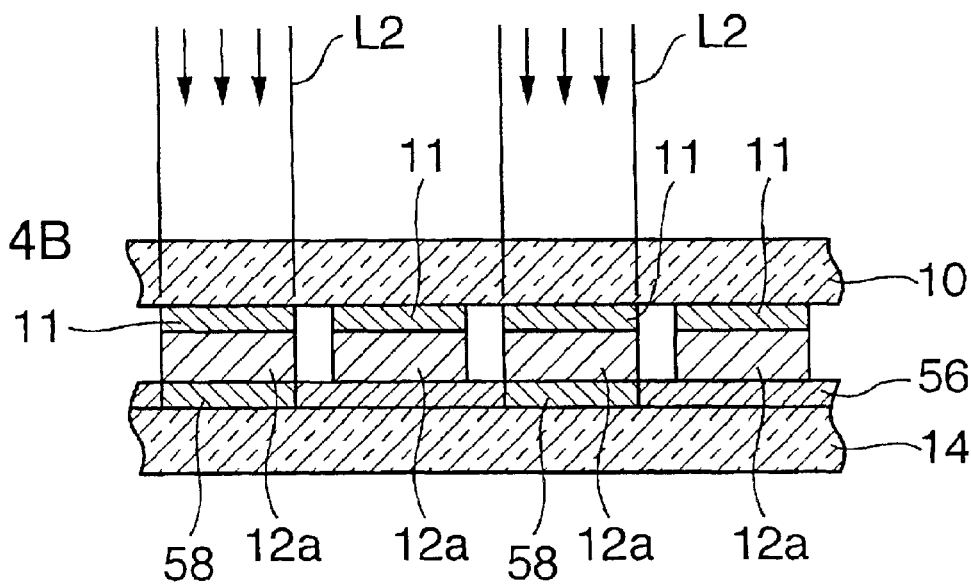
FIG. 14B is a sectional view showing a step in which second laser light irradiation is carried out from the first substrate side, thus bringing about peeling in a peeling layer.

FIGS. 14A and 14B are drawings for explaining a third embodiment (transfer method) of the present invention. As with the first embodiment described above, the present third embodiment comes under the first invention, which relates to carrying out partial transfer once, but the present third embodiment differs from the first embodiment in particular in that, in the third step, the transferred bodies 12a to be transferred are joined to the final substrate 14 through a combination of an adhesive sheet 56 comprising a heat-fusing adhesive disposed between the final substrate 14 and the transferred bodies 12a and partial irradiation with laser light L1.

The first step and the second step can be carried out as in the first embodiment described above with regard to the methods of operation, components and materials used, formation conditions and so on, and hence the description of these steps will be omitted here.

In this third embodiment, adhesive (heat-fusing) sheets 56 are used instead of the adhesive layer 15 used in the first embodiment described above. Regarding this adhesive sheet 56, one of, for example, a polyolefin resin (polyethylene, polypropylene, EVA etc.), an epoxy resin, a fluororesin, a heat-fusing polyester resin such as a carboxyl-group-containing acrylic resin, an acrylate resin, or a silicone resin, or two or more of these mixed together, can be used. The thickness of the adhesive sheet 56 is made to be about 0.1 to 100 $\mu$m, preferably about 1 to 50 $\mu$m. There are no particular limitations on the method of disposing the adhesive sheet 56; the adhesive sheet 56 may be bonded to the final substrate 14 side or the first substrate 10 side, or may be sandwiched in removable fashion between the final substrate 14 and the first substrate 10.

Figure 15:
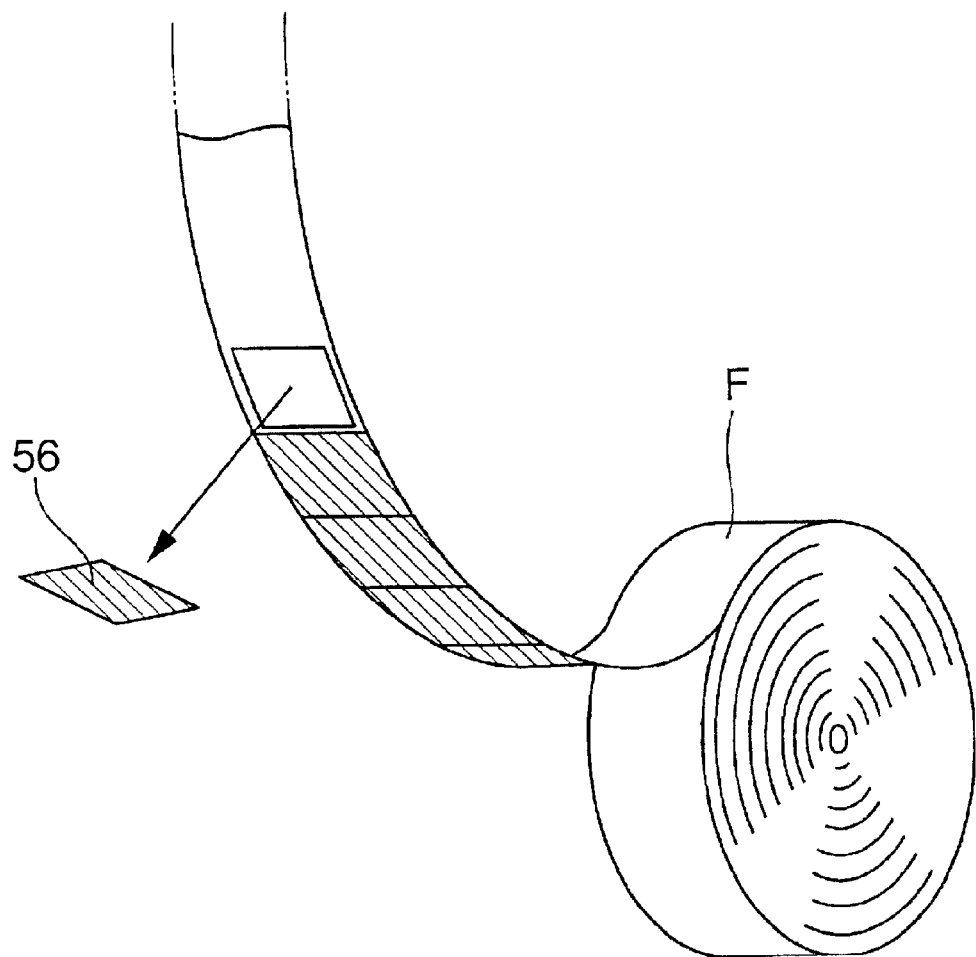
FIG. 15 is a drawing for explaining an example in which adhesive sheets are supplied continuously.

It is preferable to supply such adhesive sheets 56 using, for example, a tape carrier F as shown in FIG. 15. The tape carrier F is constituted such that the adhesive sheets 56 are supported in peelable fashion on a flexible film, are stored with the tape carrier F wound up, and can be supplied continuously using an assembly apparatus (not shown). Each tape carrier F is an adhesive layer formed in a sheet shape, and is formed with a suitable area and shape in accordance with the substrate size. In particular, in the case that the transferred bodies 12a are fairly large integrated circuits or IC chips, the area of the adhesive sheets 56 can be made to correspond to the area and shape of the regions for transfer corresponding to the transferred bodies 12a. By pushing an adhesive sheet 56 onto a region targeted for transfer using the tape carrier F, the adhesive sheet 56 peels off from the adhesive sheet 56 to which the bonding is weak and is bonded onto the region targeted for transfer of the transferred layer 12. By using such a tape carrier, it becomes possible to supply the adhesive sheets continuously, and hence the manufacturing efficiency can be improved.

Moving on, in FIG. 14A, after the first substrate 10 having the large number of transferred bodies 12a formed thereon and the final substrate 14 have been placed on top of one another with an adhesive sheet 56 as described above therebetween, partial irradiation with laser light L1 onto only the transferred bodies 12a to be transferred is carried out from the first substrate 10 side. The partial irradiation with the laser light L1 can be carried out either by irradiating the laser light L1 onto the whole of the first substrate 10 with a mask disposed on the first substrate 10, or by scanning a laser beam having a small area of irradiation over the first substrate 10. As a result of the partial irradiation with the laser light L1, heat generated in the peeling layer 11, which acts as a light-absorbing layer, causes fusing of the adhesive sheet 56 in places, and hence the state become such that only the transferred bodies 12a to be transferred are joined to the final substrate 14 by an adhesive layer 58.

Next, as shown in FIG. 14B, using the same method as in FIG. 14A, partial irradiation with laser light L2 onto only the transferred bodies 12a to be transferred is carried out from the first substrate 10 side, thus bringing about peeling of the peeling layer 11 only where the peeling layer 11 supports the transferred bodies 12a to be transferred on the first substrate 10 side. After this, the first substrate 10 and the final substrate 14 are pulled apart, whereby the transferred bodies 12a to be transferred are transferred into the prescribed positions on the final substrate 14.

In the present embodiment, the irradiation of the first laser light L1 for fusing the adhesive sheet 56 in places as shown in FIG. 14A, and the irradiation of the second laser light L2 for bringing about peeling of the peeling layer 11, can be carried out using the same light, or using different light. Furthermore, in the present embodiment, after the first substrate 10 on which the large number of transferred bodies 12a have been formed and the final substrate 14 have been placed on top of one another with the adhesive sheet 56 therebetween, it is possible to join the transferred bodies 12a to be transferred to the final substrate 14 and at the same time bring about peeling of the peeling layer 11 through a single instance of irradiation with light, and hence the third and fourth steps described earlier can be carried out simultaneously. By carrying out the third and fourth steps simultaneously in this way, the transfer process can be simplified, and thus the manufacturing efficiency can be further improved.

It is possible to apply the third invention to the present third embodiment, i.e. repeat the third to fifth steps; this is as with the first embodiment described earlier.

With the transfer method according to the present third embodiment, effects equivalent to those of the first embodiment described earlier can be obtained. Furthermore, by using an adhesive sheet as an adhesive layer and supplying the adhesive sheets continuously, the transfer process can be simplified, and thus the manufacturing efficiency can be further improved.

Fourth Embodiment

FIGS. 16A to 16E are drawings for explaining a fourth embodiment (transfer method) of the present invention. In each of the embodiments described above, the transferred bodies 12a have been separated from one another, but in the present fourth embodiment, an example is shown in which transfer is carried out without particularly separating the transferred bodies 12a from one another.

The various steps can be carried out roughly as in the first and third embodiments described above with regard to the methods of operation, components and materials used, formation conditions and so on, and hence where the descriptions overlap the same reference numeral will be used and the redundant description will be omitted.

Figure 16A:
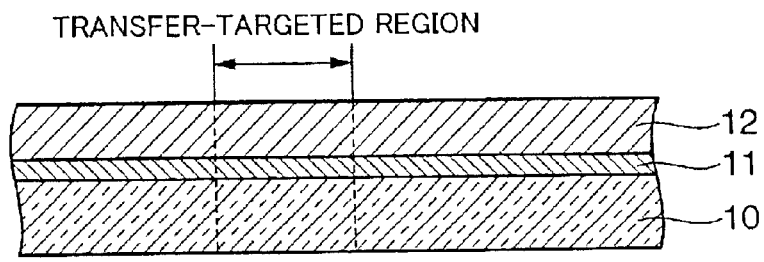
FIGS. 16A to 16E are manufacturing process sectional views for explaining a transfer method in which transfer is carried out without separating the transferred bodies in advance, according to a fourth embodiment of the present invention.

As shown in FIG. 16A, after the transferred layer 12 has been formed on the peeling layer 11, in the present embodiment, the transferred layer is not particularly separated into parts by etching or the like. The transferred body 12a to be transferred in the transferred layer 12 is contained in a transfer-targeted region. Because a separation method is not used, it is possible that breaking along the transfer-targeted region may not occur cleanly when the peeling off of the transferred body is carried out. It is thus preferable, for example, to provide a forbidden region in which devices, circuitry and wiring are not provided in the vicinity of the boundaries of the transfer-targeted region.

Figure 16B:
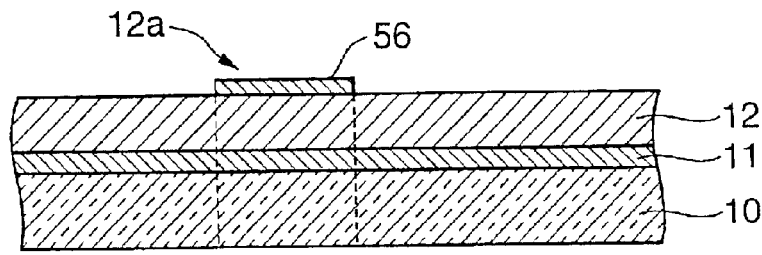

Next, as shown in FIG. 16B, an adhesive layer is provided in the region corresponding to the transferred body 12a to be selectively transferred out of the transferred layer 12. An adhesive layer as used in the first or second embodiments may be used, but here it has been decided to provide an adhesive sheet 56 as used in the third embodiment.

Figure 16C:
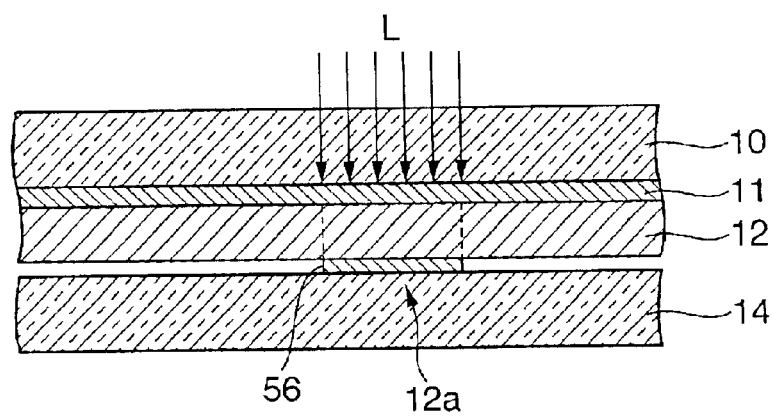

Next, as shown in FIG. 16C, after alignment has been carried out, the first substrate 10 and the final substrate 14 are pushed together, thus bonding the final substrate 14 to the adhesive sheet 56. The first substrate 10 and the final substrate 14 are thus bonded (joined) together at a certain place.

Next, an excimer laser or the like is irradiated onto the corresponding region of the peeling layer 11 under the transfer-targeted region from the rear side of the first substrate 10, thus bringing about partial peeling, i.e. peeling in this region, of the peeling layer 11.

Figure 16D:
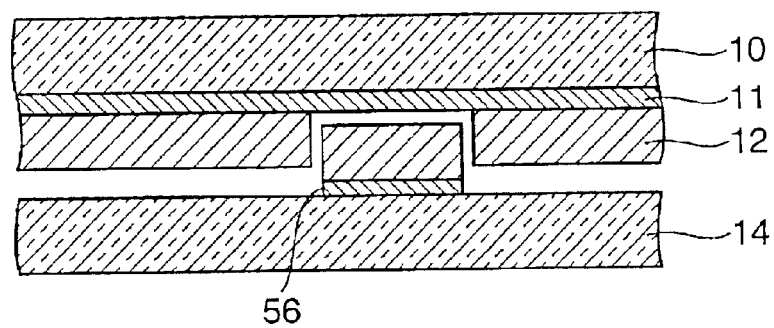

Next, as shown in FIG. 16D, the final substrate 14 is pulled away from the first substrate 10, whereupon breaking occurs at the outer periphery of the transfer-targeted region of the transferred body 12a that is bonded to the final substrate 14 through the adhesive sheet 56, and hence the transferred body 12a is transferred from the first substrate 10 onto the final substrate 14 side.

Figure 16E:
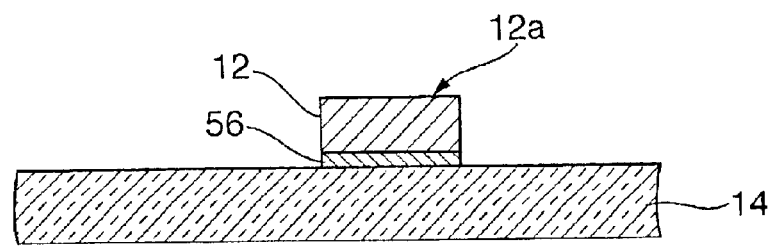

As a result, as shown in FIG. 16E, the transferred body 12a, which is a thin film integrated circuit, is provided on the required part of the final substrate 14.

According to the present fourth embodiment, effects equivalent to those of the various other embodiments described above are attained; in addition, because the transferred bodies have been formed such that there will be no adverse effects on the devices or circuits that make up the transferred bodies even when breakage occurs in the vicinity of the boundaries of the transfer-targeted region, a step of separating the transferred bodies by etching or the like can be omitted.

Fifth Embodiment

FIGS. 17A to 17E are drawings for explaining a fifth embodiment (transfer method) of the present invention. In each of the first to third embodiments described earlier, separation was carried out on the transferred bodies 12a and, wholly or partially, on the peeling layer 11, but in the present fifth embodiment, an example is shown in which separation is carried out on only the peeling layer.

The various steps can be carried out roughly as in the first and third embodiments described above with regard to the methods of operation, components and materials used, formation conditions and so on, and hence where the descriptions overlap the same reference numeral will be used and the redundant description will be omitted.

As shown in FIG. 17A, after the peeling layer 11 has been formed on the first substrate 10, breaks 11a are formed in advance in a grid shape or the like by photoetching or the like, thus forming a constitution according to which the transferred body 12a of a transfer-targeted region can be broken cleanly away from the outer periphery of the transfer-targeted region. The transferred bodies 12a are formed on top of the peeling layer 11 in which such breaks 11a have been formed.

Here, because there are no breaks such as grooves in the transferred layer 12 itself, it is possible that breaking along the transfer-targeted region may not occur cleanly during peeling, and hence, as in the fourth embodiment described above, it is preferable, for example, to provide a forbidden region in which devices, circuitry and wiring are not provided in the vicinity of the boundaries of the transfer-targeted region.

Next, as shown in FIG. 17B, an adhesive layer is provided in the region corresponding to the transferred body 12a to be selectively transferred out of the transferred layer 12. An adhesive layer as used in the first or second embodiments may be used, but here it has been decided to provide an adhesive sheet 56 as used in the third embodiment.

Next, as shown in FIG. 17C, after alignment has been carried out, the first substrate 10 and the final substrate 14 are pushed together, thus bonding the final substrate 14 to the adhesive sheet 56. The first substrate 10 and the final substrate 14 are thus bonded (joined) together at a certain place.

Next, an excimer laser or the like is irradiated onto the corresponding region of the peeling layer 11 under the transfer-targeted region from the rear side of the first substrate 10, thus bringing about partial peeling, i.e. peeling in this region, of the peeling layer 11.

Next, as shown in FIG. 17D, the final substrate 14 is pulled away from the first substrate 10, whereupon, because the transfer-targeted region can be separated away cleanly in the peeling layer 11 due to the breaks 11a, the transferred body 12a formed on the peeling layer 11 also breaks away in line with the outer peripheral shape of the transfer-targeted region, and hence the transferred body 12a that is bonded to the final substrate 14 through the adhesive sheet 56 is transferred from the first substrate 10 onto the final substrate 14 side.

As a result, as shown in FIG. 17E, the transferred body 12a, which is a thin film integrated circuit, is provided on the required part of the final substrate 14.

According to the present fifth embodiment, effects similar to those of the various other embodiments described above are attained; in addition, because breaks (grooves) are formed in the peeling layer only, the transferred layer can be made to break in the vicinity of the boundaries of the transfer-targeted region along these breaks. Moreover, because the transferred bodies have been formed such that there will be no adverse effects on the devices or circuits that make up the transferred bodies, a step of separating the transferred bodies by etching or the like can be omitted.

Sixth Embodiment

Figure 18A:
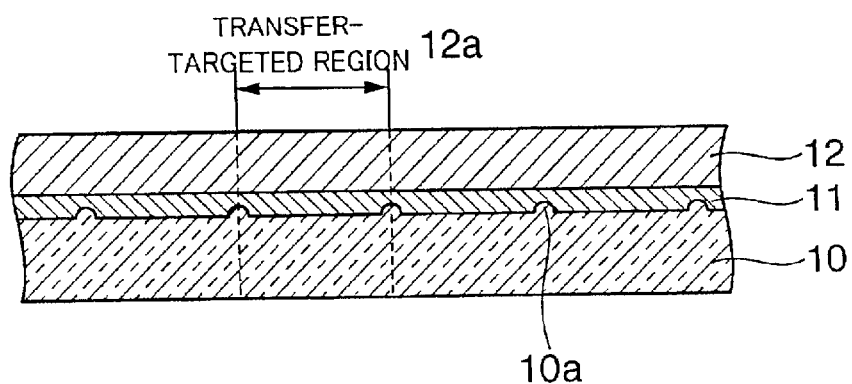
FIG. 18A is a sectional view for explaining an example in which a projecting structure is formed on a first substrate (transfer origin substrate), and a peeling layer is separated into unit transfer regions.
Figure 18B:
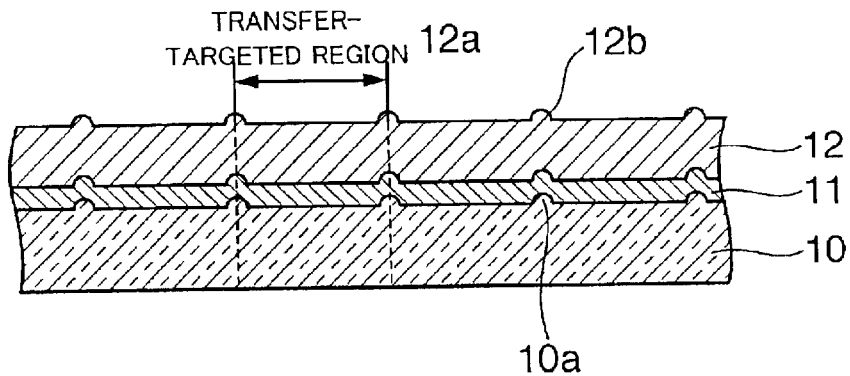
FIG. 18B is a sectional view for explaining an example in which a projecting structure is formed on a first substrate, and a peeling layer and transferred bodies are separated into unit transfer regions.

FIGS. 18A and 18B are drawings for explaining a sixth embodiment (transfer method) of the present invention. In the fifth embodiment described above, separation of the peeling layer was carried out in the vicinity of the boundaries of a transfer-targeted region, whereas in the present sixth embodiment, an example is shown in which separation of the transferred bodies is made easy by providing a projecting structure on the first substrate.

The various steps can be carried out roughly as in the first embodiment described earlier with regard to the methods of operation, components and materials used, formation conditions and so on, and hence where the descriptions overlap the same reference numeral will be used and the redundant description will be omitted.

In the present embodiment, as shown in FIG. 18A, in the first step described earlier, projections 10a are formed on the surface of the first substrate 10 in advance along the outer peripheries of a transfer-targeted region. In this way, the projecting structure is formed. Then, in the second step described earlier, after the peeling layer 11 has been formed on the first substrate 10, the surface is made flat once again by etch-back or the like, before the transferred layer 12 is formed.

Alternatively, after the peeling layer 11 has been formed on the first substrate 10, it is also possible to form the transferred layer 12 without carrying out flattening treatment such as etch-back, as shown in FIG. 18B. In this case, the projecting structure formed through the projections 10a on the first substrate 10, i.e. the lower layer, appear as is on the upper layer, and hence a projecting structure 12b appears along the periphery of the transfer-targeted region on the transferred layer 12.

Note that it is also possible to make undulations provided on the first substrate 10 into a recessed structure. This is because, so long as there are undulations, the peeling layer and the transferred layer thereupon will readily break along the boundaries provided by the undulations.

According to the present sixth embodiment, effects equivalent to those of the various other embodiments described above are attained; in addition, the peeling layer is separated through the projecting structure provided on the substrate, and hence it becomes that the transferred bodies are readily separated, and moreover it becomes possible to use the projecting structure a appearing on the surface of the transferred layer 12 as banks 12b for filling of adhesive (see FIGS. 12A and B), which is suitable in the case that coating with the adhesive is carried out using an ink jet method or the like.

Seventh Embodiment

FIGS. 19A to 19E are drawings for explaining a seventh embodiment (transfer method) of the present invention. Unlike the various other embodiments described above, the present seventh embodiment relates to the second invention in which transfer is carried out twice.

The various steps can be carried out roughly as in the first embodiment described earlier with regard to the methods of operation, components and materials used, formation conditions and so on, and hence where the descriptions overlap the same reference numeral will be used and the redundant description will be omitted.

The first and second steps are carried out as in the first embodiment described earlier (see FIG. 4A to FIG. 6).

<Third Step>

In the present seventh embodiment, transfer is carried out a plurality of times, and hence, first all of the transferred bodies are transferred onto a second substrate 14, i.e. an intermediate transfer substrate, and then partial transfer is carried out onto a final substrate 24, i.e. a transfer destination substrate.

Figure 19A:
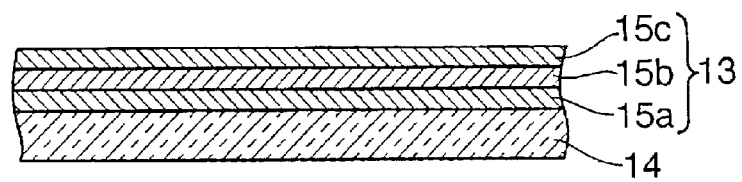
FIG. 19A is a sectional view showing a state in which a multi-layer film has been formed on a second substrate (intermediate transfer substrate)

First, as shown in FIG. 19A, a multi-layer film 13 in which a protective layer 15a, a light-absorbing layer 15b and an adhesive layer 15c are built up in this order is formed on the second substrate 14, i.e. the intermediate transfer substrate.

Figure 19B:
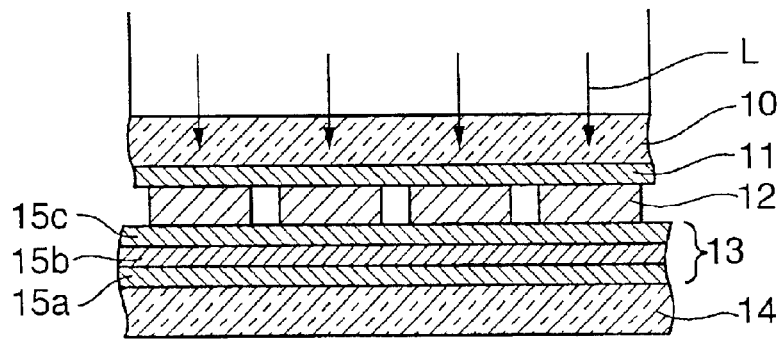
FIG. 19B is a sectional view showing a third step in which a first substrate (transfer origin substrate) and the second substrate are joined together, and a fourth step in which partial irradiation with light is carried out from the first substrate side, thus bringing about peeling in a peeling layer.
Figure 19C:
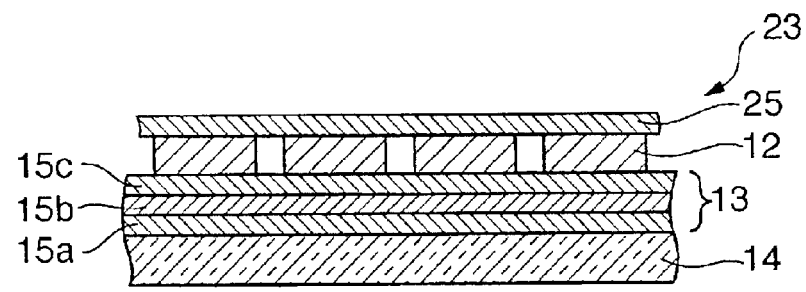
FIG. 19C is a sectional view showing a fifth step in which a transferred-body-supplying substrate (intermediate transfer substrate) is manufactured.

Next, as shown in FIG. 19B, a first substrate 10 as described earlier is placed onto the adhesive layer 15c of the second substrate 14, thus joining all of the large number of transferred bodies 12a formed on the first substrate 10 onto the peeling layer 11 via the adhesive layer 15c.

There are no particular limitations on the second substrate 14, but an example is a substrate (sheet), in particular a transparent substrate. This substrate may either be a flat sheet or a curved sheet. Regarding the material of the second substrate 14, the same kind of material can be used as with the final substrate 14 in the first embodiment described earlier.

Regarding the materials constituting the multi-layer film 13, the protective layer 15a is for protecting the second substrate from heat generated in the light-absorbing layer 15b when the multi-layer film is irradiated with light, and examples of the material of the protective layer 15a include inorganic films of $SiO_x$, $Si_3N_4$ and so on, and synthetic resin materials.

Moreover, the material of the light-absorbing layer 15b can be selected from materials capable of converting the irradiated light into heat; examples include silicones, metals, carbon black, and photopolymerizable monomers and oligomers.

Suitable examples of the adhesive constituting the adhesive layer 15c include various curable adhesives, for example reactive curing adhesives, thermosetting adhesives, photo-curing adhesives such as UV-curing adhesives, and anaerobic curing adhesives. The adhesive may have any constitution, for example epoxy type, acrylate type, silicone type and so on.

<Fourth Step>

Next, the first transfer, i.e. the transfer from the transfer origin substrate onto the intermediate transfer substrate is carried out. Specifically, as shown in FIG. 19B, light L is irradiated onto the whole of the peeling layer 11 from the first substrate 10 side of the joined body comprising the first substrate 10 and the second substrate 14, thus bringing about in-layer peeling and/or interfacial peeling of the peeling layer. Through the peeling of the peeling layer 11, all of the transferred bodies 12a break away from the peeling layer 11, and hence the state becomes such that the transferred bodies 12a are joined only to the second substrate 14 side.

The principle by which the peeling occurs in the peeling layer, and the details of the irradiated light are as in the first embodiment described earlier.

<Fifth Step>

Next, the first substrate 10 which has been peeled off from the transferred bodies 12a is removed, and then an adhesive sheet 25 containing a heat-fusing adhesive is provided on the transferred bodies 12a, thus forming a transferred-body-supplying substrate 23.

Regarding the adhesive sheet 25, the adhesive sheet 56 used in the third embodiment described earlier can be used as is. There are no particular limitations on the method of providing the adhesive sheet 25 on the transferred bodies 12a; for example, the adhesive sheet 25 can easily be provided by using a method such as placing on the transferred bodies 12a an adhesive sheet that has been cut in line with the second substrate 14, and then pressing while heating. Note that it is also possible to not bond the adhesive sheet 25 onto the transferred bodies 12a at this time, but rather insert the adhesive sheet 25 when the final substrate 24 is placed on the transferred bodies 12a as described below. Furthermore, as described in the third embodiment earlier, the constitution may be made to be such that the adhesive sheet is supplied using a tape carrier F (see FIG. 15).

There are cases that peeling residue from the peeling layer 11 remains attached to the transferred bodies 12a after transfer onto the second substrate 14 side, and it is preferable to completely remove this peeling residue. The method used for removing the residual parts of the peeling layer 11 can be selected as appropriate from methods such as washing, etching, ashing, polishing and so on, or a combination thereof.

Furthermore, in the case that peeling residue from the peeling layer 11 remains attached to the surface of the first substrate 10 after the transfer of the transferred bodies 12a has been completed, this can be removed as described above for the transferred bodies 12a. The first substrate 10 can thus be reused (recycled). By reusing the first substrate 10 in this way, wastefulness can be avoided with regard to the manufacturing cost. This is particularly significant in the case that a first substrate 10 made from an expensive material such as quartz glass or a scarce material is used.

<Sixth Step>

Figure 19D:
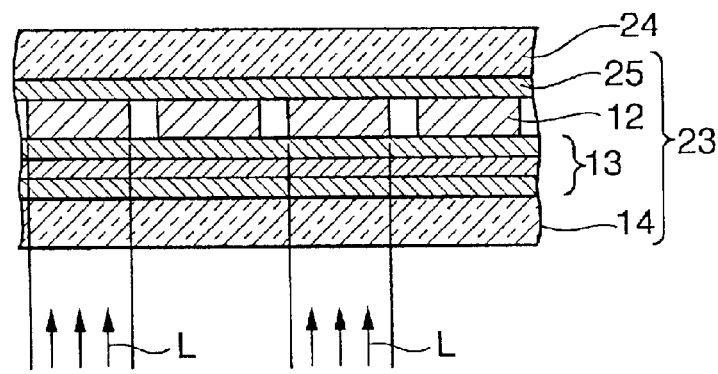
FIG. 19D is a sectional view showing a sixth step in which a final substrate (transfer destination substrate) is placed on top of the transferred-body-supplying substrate, and irradiation with light is carried out selectively, thus transferring onto the final substrate only devices to be transferred.

Next, as shown in FIG. 19D, the final substrate 24 onto which some of the transferred bodies 12a are to be transferred is placed on the adhesive sheet 25 of the transferred-body-supplying substrate 23, and light L is selectively irradiated onto only the regions of the transferred bodies 12a to be transferred, thus joining onto the final substrate 24 only the transferred bodies 12a to be transferred.

Here, the light L used may be any that is received by the light-absorbing layer 15b of the multi-layer film 13, generating heat, and thus bring about fusion through the adhesive sheet 25; examples include X-rays, UV rays, visible light, infrared rays (heat rays), laser light, millimeter waves, microwaves, electron rays, and radiation ($\alpha$-rays, $\beta$-rays, $\gamma$-rays). Of these, from the standpoint of peeling (ablation) of the peeling layer 11 occurring readily and local irradiation with high precision being possible, laser light is preferable. As the laser light, the same kind of laser light as that used in the fourth step described above can be used, or a different type of laser light can be used.

By using a transferred-body-supplying substrate as described above, then by placing the final substrate 24 onto which some of the transferred bodies 12a are to be transferred on top of the transferred-body-supplying substrate 23 so as to be in contact with the adhesive sheet 25, and irradiating the light L onto only the regions of the transferred bodies 12a to be transferred, the heat generated in the light-absorbing layer 15b where irradiated with the light is transmitted to the adhesive sheet 25, and hence only the transferred bodies 12a to be transferred are bonded to the final substrate 24 via a heat-fused adhesive layer (the adhesive sheet 25, which first melts and then hardens). By placing the final substrate 24 on top of the transferred-body-supplying substrate 23 and irradiating light onto only the parts where transfer is to be carried out, it is thus possible to accurately transfer into prescribed positions on the final substrate 24 some or all of the large number of transferred bodies 12a on the transferred-body-supplying substrate 23 side.

Note that the final substrate 24 can be thought of as being like the second substrate 14 in the first embodiment described earlier, and hence description of the final substrate 24 will be omitted here.

<Seventh Step>

Figure 19E:
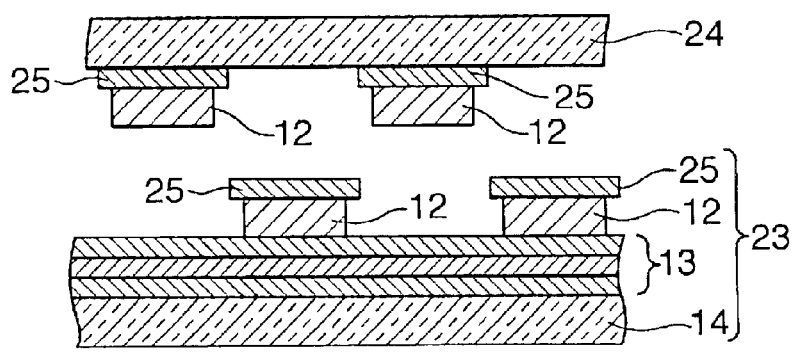
FIG. 19E is a sectional view showing a seventh step in which, after the transfer has been completed, the final substrate is removed from the second substrate.

Next, as shown in FIG. 19E, forces are applied to the transferred-body-supplying substrate 23 and the final substrate 24 in a direction so as to separate the two, thus removing the transferred-body-supplying substrate 23 from the final substrate 24. By pulling the transferred-body-supplying substrate 23 away from the final substrate 24, transferred bodies 12a are transferred into a plurality of positions on the final substrate 24, as shown in FIG. 19E.

Moreover, the transferred bodies 12a that are not transferred remain on the transferred-body-supplying substrate 23. Regarding the transferred-body-supplying substrate 23 on which these transferred bodies 12a remain, as with the first substrate 10, it is possible to apply the third invention to the present embodiment, i.e. repeat the fifth to seventh steps described above, and thus use the transferred-body-supplying substrate 23 for transferring a large number of transferred bodies 12a onto separate final substrates 24 one after another.

Specifically, in FIG. 3, 'transfer origin substrate' is changed to 'transferred-body-supplying substrate'. Then, S1 in FIG. 3 corresponds to the first to fourth steps described above, S2 and S3 in FIG. 3 correspond to the fifth step described above, S4 in FIG. 3 corresponds to the sixth step described above, and S5 in FIG. 3 corresponds to the seventh step described above. Each time transferred bodies 12a are transferred, a final substrate 24 is fed in as a transfer destination substrate, and is aligned with and bonded to the transferred-body-supplying substrate 23 (S3), irradiation of light is carried out selectively (S4), and then the transferred bodies 12a to be transferred are peeled off along with the final substrate 24 (S5), i.e. the sequence of steps S2 to S6 is repeated as long as transferred bodies 12a still remain on the transferred-body-supplying substrate 23 (the intermediate transfer substrate). In the case of applying the third invention and transferring to a plurality of final substrates 24 one after another in this way, and thus applying the present manufacturing method to, for example, the manufacture of an active matrix board for an electro-optical apparatus, it is possible to efficiently dispose in scattered locations minute transferred bodies 12a such as TFTs for each of a large number of pixels on a substrate.

Through the steps described above, a large number of transferred bodies 12a to be transferred can be selectively transferred onto a final substrate 24. Afterwards, the transferred bodies 12a that have been transferred can be connected to wiring on the final substrate 24 through wiring formed using any of various methods as will be described later, for example an ink jet coating method, photolithography, or a coating method combined with liquid repellency treatment using an SAM (self-assembled monolayer) film, a protective film can be formed if desired, and so on.

Note that in the present embodiment, the constitution has been made to be such that an adhesive sheet is used as the outermost layer of the transferred-body-supplying substrate 23, heat fusion is brought about through heat generated by irradiation with light, and hence transferred bodies 12a are transferred onto the final substrate 24; however, it is also possible to use a curing adhesive or photo-curing resin as in the first or second embodiment described earlier instead of the adhesive sheet, and thus transfer only the transferred bodies 12a to be transferred onto the final substrate 24. In this case, it is not necessary to provide the light-absorbing layer 15b and the protective layer 15a.

According to the present seventh embodiment, effects similar to those of the first embodiment described earlier are attained; in addition, transfer onto the final substrate 24 can be carried out with the top/bottom relationship of the layered structure of the transferred bodies 12a formed on the first substrate 10 maintained, and hence the devices can be manufactured using an existing device manufacturing process, i.e. it is not necessary to carry out extra improvements such as changing the position of external connection terminals which is necessary to cope in the case that the top/bottom relationship is reversed.

Eighth Embodiment

FIGS. 20A to 20D are drawings for explaining an eighth embodiment (transfer method) of the present invention. As with the seventh embodiment described above, the present eighth embodiment relates to the second invention in which transfer is carried out a plurality of times, but here transfer is carried out a total of three times.

The various steps can be carried out roughly as in the first and seventh embodiments described earlier with regard to the methods of operation, components and materials used, formation conditions and so on, and hence where the descriptions overlap the same reference numeral will be used and the redundant description will be omitted.

The transfer method of the present embodiment is carried out through the following steps (a) to (i).

<Step (a)>
In step (a), a peeling layer 11 is formed on the first substrate 10. This step can be carried out as with the first step in the first embodiment described earlier with regard to preferable materials for the first substrate 10, preferable materials for the peeling layer 11, the method of forming the peeling layer 11, and so on (see FIG. 4A).

<Step (b)>
Next, a large number of transferred bodies 12a are formed on the peeling layer 11. This step (b) can be carried out as with the second step in the first embodiment described earlier (see FIG. 4B).

<Step (c)>
Next, the transferred bodies 12a on the first substrate 10, i.e. the transfer origin substrate, and a second substrate 26, i.e. an intermediate transfer substrate, are joined together via a temporary adhesive layer 26a comprising a solvent-dissolvable adhesive.

The solvent-dissolvable adhesive that constitutes the temporary adhesive layer 26a can be selected as appropriate from adhesives that dissolve relatively easily in some solvent such as water, alcohol, acetone, ethyl acetate or toluene, thus enabling the bonded article to be peeled off; examples include water-soluble adhesives such as polyvinyl alcohol type adhesives, water-based vinyl urethane type adhesives, acrylic type adhesives, polyvinyl pyrrolidone, alpha olefins, maleate type adhesives and photo-curing adhesives, and various adhesives that are soluble in organic solvents such as acrylic type adhesives, epoxy type adhesives and silicone type adhesives.

The temporary adhesive layer 26a may be applied onto the whole surface of the second substrate 26, or may be applied onto only the transferred bodies 12a, or may be applied onto both. The thickness of the temporary adhesive layer 26a should be such that the transferred bodies 12a can be bonded to the second substrate 26 reliably, and can be selected as appropriate in accordance with the adhesive strength of the adhesive used and so on. Regarding the method of forming the temporary adhesive layer 26a, methods such as a spin coating method, an ink jet coating method using an ink jet type thin film formation apparatus as described above, and printing methods can be used.

There are no particular limitations on the material or thickness of the final substrate 26; for example, a substrate of a material and thickness like those of the second substrate 14 used in the first embodiment described earlier can be used.

<Step (d)>
Next, as shown in FIG. 20A, light, preferably laser light, is irradiated from the first substrate 10 side onto the temporarily joined body comprising the second substrate 26, the temporary adhesive layer 26a, the transferred bodies 12a, the peeling layer 11 and the first substrate 10 laminated together, thus bringing about in-layer peeling and/or interfacial peeling of the peeling layer 11, and hence transferring all of the transferred bodies 12a onto the second substrate side.

The light irradiation for the peeling of the peeling layer 11 can be carried out using the same light, especially laser light, and irradiation conditions as used in the fourth step in the first embodiment described earlier.

After the peeling, as shown in FIG. 20B, the first substrate 10 is removed from the transferred bodies 12a. There are cases that peeling residue from the peeling layer 11 remains attached to the transferred bodies 12a after transfer onto the second substrate 26 side, and it is preferable to completely remove this peeling residue. The method used for removing the residual parts of the peeling layer 11 can be selected as appropriate from methods such as washing, etching, ashing, polishing and so on, or a combination thereof. Furthermore, any peeling residue from the peeling layer 11 remaining attached to the surface of the first substrate 10 after the transfer of the transferred bodies 12a has been completed can be removed by a similar method, and as a result the first substrate 10 can be reused (recycled). By reusing the first substrate 10 in this way, wastefulness can be avoided with regard to the manufacturing cost. This is particularly significant in the case that a first substrate 10 made from an expensive material such as quartz glass or a scarce material is used.

<Step (e)>

Next, as shown in FIG. 20C, a third substrate 27, which is an intermediate transfer substrate, on which a multi-layer film 28 comprising a protective layer 28a, a light-absorbing layer 28b and an adhesive layer 28c built up in this order has been formed in advance, and the second substrate 26 onto which all of the transferred bodies 12a have been transferred, are placed on top of one another, and all of the transferred bodies 12a are joined to the third substrate 27 via the adhesive layer 28c.

The constitution of the multi-layer film 28 can be the same as that of the multi-layer film 13 used in the first embodiment described earlier. There are no particular limitations on the material or thickness of the third substrate 27; for example, a substrate of a material and thickness like those of the second substrate 14 used in the first embodiment described earlier can be used.

<Step (f)>

Next, the temporary adhesive layer 26a is dissolved away using a solvent in which the temporary adhesive layer 26a is soluble, thus removing the second substrate 26 from the transferred bodies 12a.

The dissolving of the temporary adhesive layer 26a can be carried out using a method such as immersing part (the second substrate side) or all of the temporarily joined body shown in FIG. 20C in a suitable solvent such as water or an organic solvent, or spraying on such a solvent. After the second substrate 26 has been removed, it is preferable to completely evaporate off remaining solvent by hot air drying or the like.

<Step (g)>

Next, as shown in FIG. 20D, after the second substrate 26 has been removed, an adhesive sheet 29a containing a heat-fusing adhesive is mounted on the transferred bodies 12a, thus forming a transferred-body-supplying substrate 29 having a structure in which the multi-layer film 28, the transferred bodies 12a and the adhesive sheet 29a are built up in this order on the third substrate 27.

The adhesive sheet 29a used can be like the adhesive sheet 56 used in the third embodiment described earlier. Moreover, regarding the method of disposing the adhesive sheet 29a, again this can be carried out as with the adhesive sheet 56 used in the third embodiment described earlier.

By carrying out the steps (h) and (i) described below, the transferred-body-supplying substrate 29 can be used for selectively transferring some of the transferred bodies 12a onto a final substrate as with the transferred-body-supplying substrate 23 used in the seventh embodiment described above, but here the top/bottom relationship of the layered structure of the transferred bodies 12a transferred onto the final substrate will be the opposite to that with the transferred-body-supplying substrate 23 used in the seventh embodiment described above.

<Step (h)>

Next, a final substrate (transfer destination substrate), not shown, is placed onto the adhesive sheet 29a side of the transferred-body-supplying substrate 29, and irradiation with light is carried out as in the sixth step in the seventh embodiment described above, thus transferring onto the final substrate only the transferred bodies 12a to be transferred (see FIGS. 19D and 19E).

The final substrate, light irradiation conditions and so on used can be made to be as in the sixth step in the seventh embodiment described above.

<Step (i)>

Next, the final substrate and the transferred-body-supplying substrate 29 are pulled apart, thus obtaining a final substrate having transferred bodies 12a transferred in desired positions thereon (see FIG. 19E).

Ninth Embodiment

Figure 21:
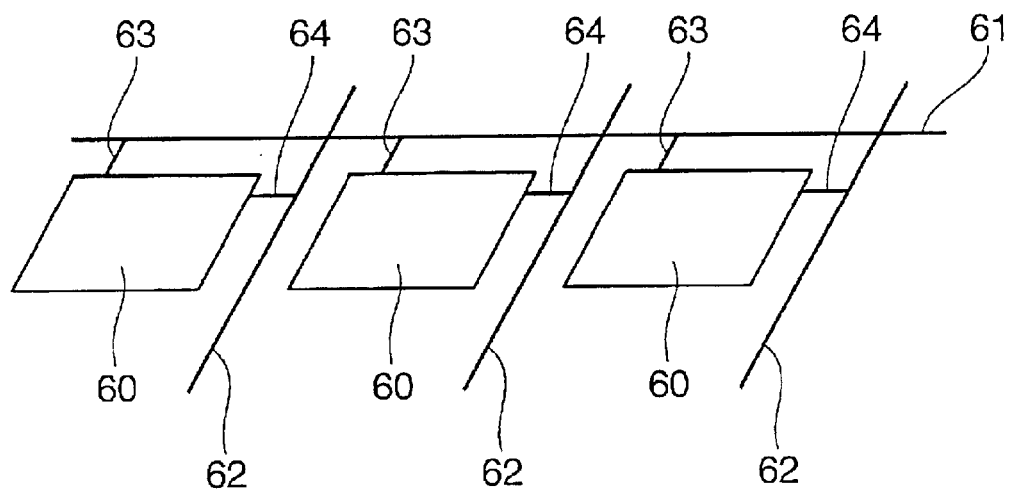
FIG. 21 is a schematic perspective view for explaining a first example of a circuit board according to the present invention.

FIG. 21 is a drawing showing a ninth embodiment (circuit board) of the present invention.

The present embodiment is characterized in that devices 60 such as TFTs are transferred onto a final substrate such as an active matrix board using the transfer method described in one of the embodiments above, and then the devices 60 are electrically connected by wiring 63 and 64 made of a conductor to wiring 61 and 62 that has formed on the final substrate in advance, thus manufacturing a circuit board.

In the present embodiment, a substrate having a circuit pattern and wiring made of a conductor formed thereon is used as the final substrate, for example any of various substrates for electro-optical apparatuses such an active matrix board, or any of various substrates for general electronic apparatuses such as a printed wiring board or a flexible printed wiring board. Moreover, regarding the devices 60, in addition to TFTs, any of various circuit units such as shift registers, DA converters, SRAMs, DRAMs, current compensation circuits, ICs and LSIs can be used.

The wiring 63 and 64, which is made from a conductor and is formed after the devices 60 have been transferred to electrically connect the devices 60 to the wiring 61 and 62 that has been formed on the final substrate in advance can be formed using a method such as the following: bonding on of metal wire such as gold wire; a coating technique for a conductive material such as a thin metal film or a thin ITO film, in which a thin film formation method such as sputtering, vacuum deposition, CVD or electroless plating is combined with a resist film or a mask; a printing method in which a conductive coating liquid is applied in prescribed positions on the substrate, and then the substrate is subjected to heat treatment, thus forming metallic conductors; or an ink jet coating method using such a conductive coating liquid. The method in which a conductive coating liquid is applied in prescribed positions on the substrate by ink jet coating, and then the substrate is subjected to heat treatment, thus forming circuitry comprising metallic conductors is particularly preferable.

The application of the conductive coating liquid onto the final substrate using the ink jet coating method can easily be carried out using the ink jet type thin film formation apparatus 30 described in the first embodiment earlier (see FIG. 10). Specifically, the ink jet type thin film formation apparatus 30 can not only be used for forming various types of adhesive layer, but can also be used for forming wiring as in the present embodiment. In the case of forming wiring, a coating liquid for conductor formation is used instead of the liquid adhesive L. The coating liquid L for conductor formation should be a liquid that can be discharged from the nozzles of the ink jet head, and should be such that circuit conductors having electrical conductivity sufficient to allow use as electrical wiring can be obtained by drying and baking the coating film formed on the substrate. Preferably, a fine metal powder dispersion in which fine metal particles of gold, silver or the like are dispersed uniformly and stably in an organic solvent is used. Commercially sold coating liquids suitable for the present invention include Perfect Gold (proprietary name) and Perfect Silver (proprietary name) made by Vacuum Metallurgical Co., Ltd., but there is no limitation to these.

Using the thin film formation apparatus 30, the coating liquid L for conductor formation containing fine metal particles is applied onto the final substrate to form thin-film lines, and then the substrate is dried, and then baked at a temperature above the temperature at which the fine metallic particles contained in the coating liquid are sintered onto the substrate, whereupon the fine metallic particles join together on the substrate, thus forming the wiring 63 and 64 made of a conductor having sufficient electrical conductivity. The drying temperature is made to be a temperature such that the solvent used to disperse the fine metallic particles in the coating liquid L can be completely evaporated off, generally about 50 to 150° C., preferably about 90 to 120°C.; moreover, the drying time is made to be about 1 to 60 min, preferably about 2 to 5 min. Furthermore, the baking temperature is changed as appropriate in accordance with the fine metallic particles contained in the coating liquid L; in the case of using a coating liquid containing ultra-fine particles of mean particle diameter 0.1 μm or less as the fine metallic particles, the baking can be carried out at a baking temperature considerably lower than the melting point of the metal itself. For example, in the case of a coating liquid L containing ultra-fine gold or silver particles (mean particle diameter approximately 0.01 μm), the baking can be carried out at a low temperature of about 200 to 400° C., preferably about 250 to 300° C. The wiring 63 and 64 for electrically connecting the devices 60 to the wiring 61 and 62 on the final substrate is formed through the baking.

Tenth Embodiment

Figure 22:
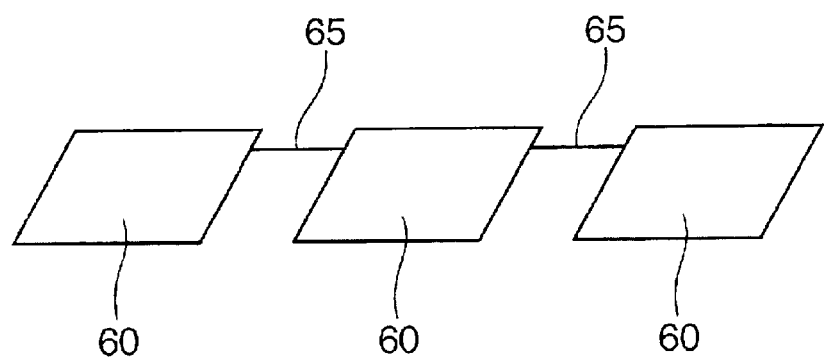
FIG. 22 is a schematic perspective view for explaining a second example of a circuit board according to the present invention.

FIG. 22 is a drawing showing a tenth embodiment (circuit board) of the present invention.

The present embodiment is characterized in that a plurality of devices 60 that have been transferred with gaps therebetween onto any of various final substrates using the transfer method described in one of the embodiments above are electrically connected together by wiring 65 made of a conductor, thus manufacturing a circuit board. The plurality of devices 60 may be unit circuits having the same function and size as one another, or alternatively various devices having different functions and sizes to one another can be combined.

As with the wiring 63 and 64 in the ninth embodiment described above, the wiring 65 can be formed using any of various thin film formation means, or a printing method or ink jet coating method using a conductive coating liquid. In this way, a circuit board is manufactured by transferring a plurality of devices 60 onto a final substrate, and then carrying out electrical connection through wiring 65 made of a conductor, and hence the circuit board manufacture becomes easy. Furthermore, there is no need to form wiring on the substrate in advance, and hence the devices can be transferred onto the surfaces of various articles that, unlike electronic displays and electrical circuits, do not have wiring, and thus novel apparatuses that have not existed hitherto can be constituted.

Eleventh Embodiment

Figure 23:
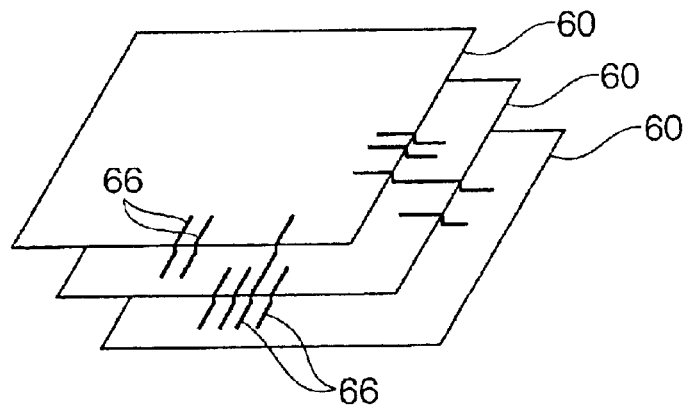
FIG. 23 is a schematic perspective view for explaining a third example of a circuit board according to the present invention.
Figure 24:
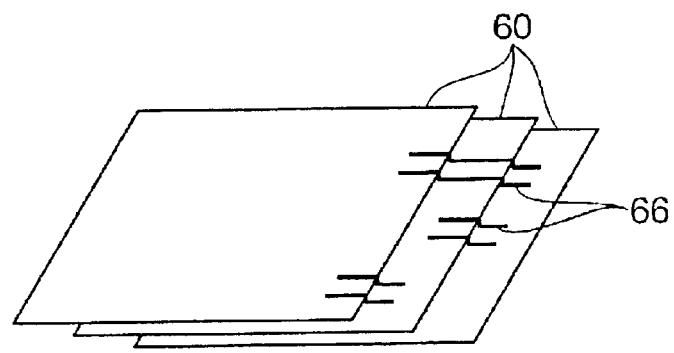
FIG. 24 is a schematic perspective view for explaining a fourth example of a circuit board according to the present invention.

FIGS. 23 and 24 are drawings showing an eleventh embodiment (circuit board) of the present invention.

The present embodiment is characterized in that second and third devices 60 are placed in staggered fashion on top of a first device 60 that has been transferred onto any of various final substrates using the transfer method described in one of the embodiments above, and the respective devices are then electrically connected together by wiring 66 made of a conductor, thus manufacturing a circuit board. The plurality of devices 60 may be unit circuits having the same function and size as one another, or alternatively various devices having different functions and sizes to one another can be combined.

As with the wiring 63 and 64 in the ninth embodiment described earlier, the wiring 66 can be formed using any of various thin film formation means, or a printing method or ink jet coating method using a conductive coating liquid. In this way, by placing a plurality of devices 60 on top of one another in staggered fashion on a final substrate, and then electrically connecting the respective devices 60 together, the packing density of the devices 60 can be raised. Moreover, it becomes possible to build three-dimensional semiconductor devices having various functions.

Twelfth Embodiment

Figure 25:
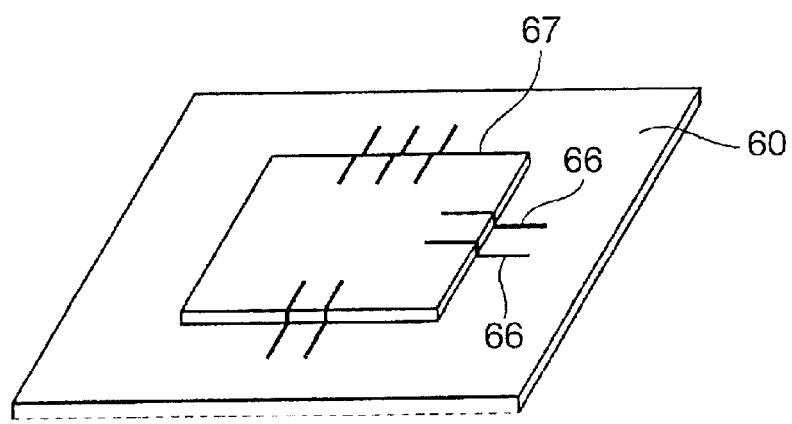
FIG. 25 is a schematic perspective view for explaining a fifth example of a circuit board according to the present invention.

FIG. 25 is a drawing showing a twelfth embodiment (circuit board) of the present invention.

The present embodiment is characterized in that, on top of a first device 60 that has been transferred onto any of various final substrates using the transfer method described in one of the embodiments above, is mounted a device 67 that is smaller than the device 60, and then the devices 60 and 67 are electrically connected together by wiring 66 made of a conductor, thus manufacturing a circuit board. There are no particular limitations on the combination of devices 60 and 67, but, for example, composite circuits such as LSI+IC or LSI+TFT can easily be constructed.

As with the wiring 63 and 64 in the ninth embodiment described earlier, the wiring 66 can be formed using any of various thin film formation means, or a printing method or ink jet coating method using a conductive coating liquid. In this way, by constructing a composite circuit in which are combined devices 60 and 67 having different functions to one another, devices that are manufactured under different process conditions to one another can be combined, and hence devices having a layered structure for which manufacture has been difficult hitherto can be provided, and moreover devices having a three-dimensional structure can be manufactured easily.

Thirteenth Embodiment

Figure 26:
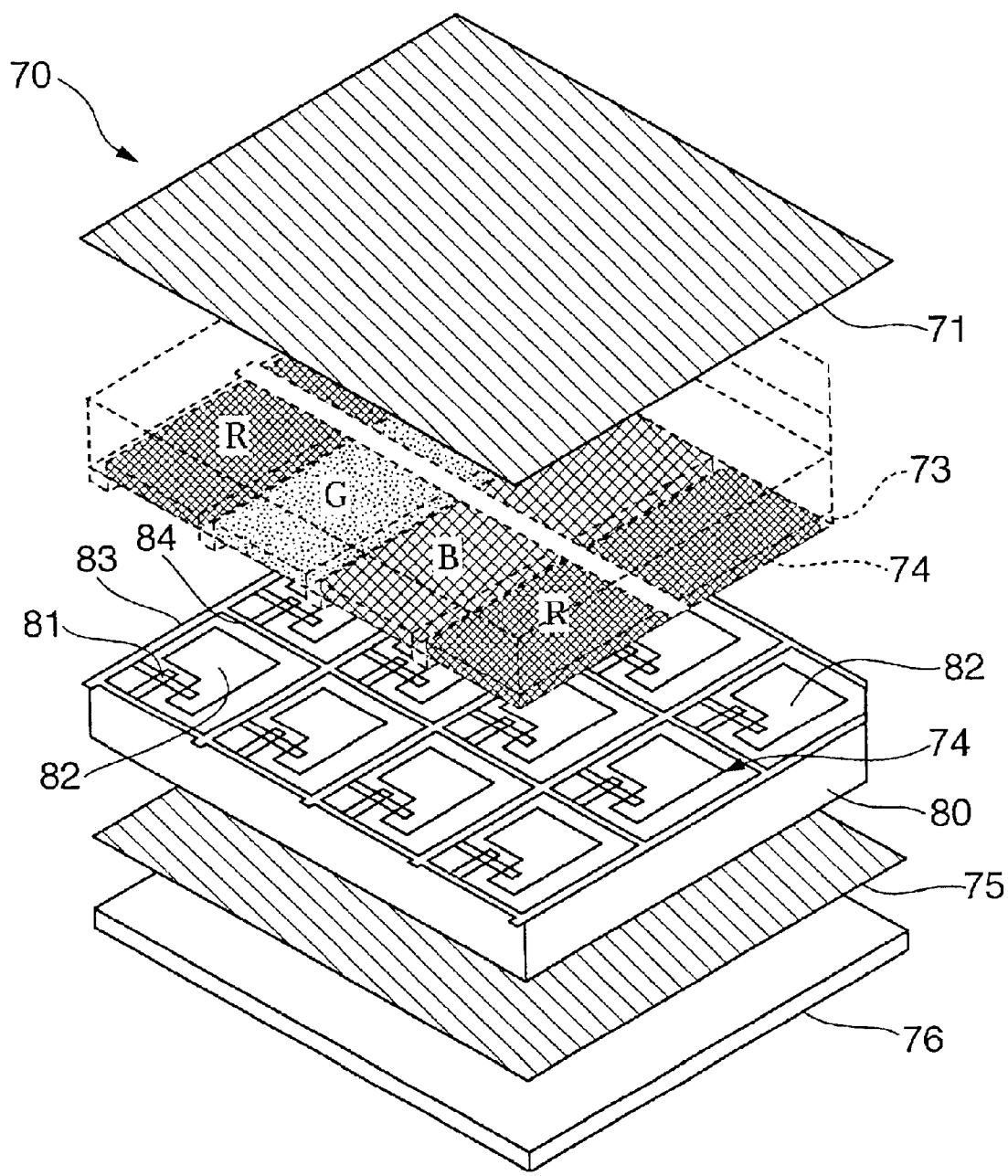
FIG. 26 is a schematic perspective view of a liquid crystal electro-optical apparatus for explaining an electro-optical apparatus and an active matrix board, which is an example of the circuit board according to the present invention.
Figure 27:
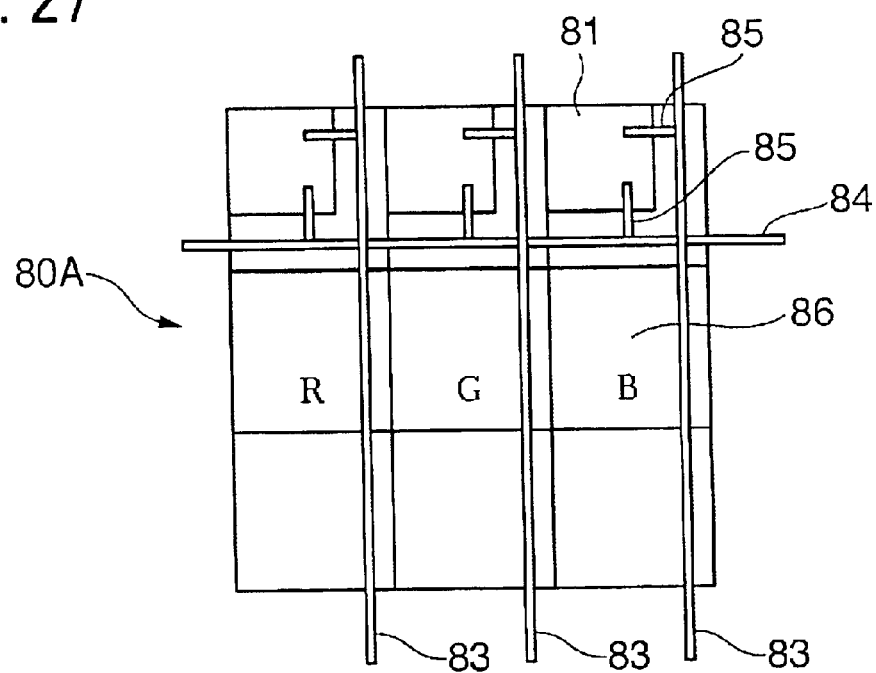
FIG. 27 is a top view showing a first example of the active matrix board.

FIGS. 26 and 27 are drawings for explaining a thirteenth embodiment (circuit board, electro-optical apparatus) of the present invention; the present embodiment illustrates a case of applying the present invention to an active matrix type liquid crystal electro-optical apparatus as the electro-optical apparatus.

FIG. 26 is a figure showing schematically the constitution of a liquid crystal electro-optical apparatus using a circuit board (active matrix board) according to the present invention; the liquid crystal electro-optical apparatus 70 has as principal constituent elements thereof the active matrix board 80, a color filter 73, and a liquid crystal material, which is provided in a space 74 between the active matrix board 80 and the color filter 73. Regarding the active matrix board 80, a polarizing plate 75 is provided on the outside of a glass substrate, driving circuitry 80A is provided on the inside of the glass substrate, and an oriented film (not shown) is provided on the driving circuitry 80A. The color filter 73 has a structure in which a polarizing plate 71 is provided on the outside of a glass substrate 72, and a black matrix, an RGB color filter layer, an overcoat layer, transparent electrodes, and an oriented film are built up in this order on the inside of the glass substrate 72, although the details are not shown in the drawing. A backlight 76 is provided on the outside of the lower polarizing plate 75.

Regarding the constitution of the active matrix board 80, as shown in FIGS. 26 and 27, the driving circuitry 80A formed on the glass substrate includes pixel electrodes 82 each formed in a region corresponding to one of a plurality of pixels 86, data lines 83 and gate lines 84 which run lengthwise and crosswise, devices 81, which are transferred using the transfer method described earlier in either the first or second embodiment, and wiring 85, which electrically connects the devices 81 to the data lines 83 and the gate lines 84. The pixel electrodes 82 are formed from a transparent electrode material made of ITO. Regarding the devices 81, one or more types of circuit unit such as shift registers, DA converters, SRAMs, DRAMs, current compensation circuits and so on can be used.

With the active matrix board according to the present invention, a large number of devices that are to be disposed in scattered locations with spaces therebetween on a final substrate can be manufactured concentrated together on a first substrate, and the devices can then be transferred accurately into prescribed positions on the final substrate; consequently, compared with an active matrix board that is manufactured by forming the devices on the substrate directly, the area efficiency in the manufacture of the devices can be greatly improved, and a large active matrix board in particular can be provided cheaply.

Moreover, because manufacture is carried out by manufacturing a large number of devices concentrated together on a first substrate and then transferring the devices onto a final substrate, it is possible to mount on high-performance devices, and hence the performance of the active matrix board can be improved. Furthermore, it becomes easy to carry out selection and elimination before the transfer of the devices, and hence the product yield can be improved.

Moreover, because the electro-optical apparatus according to the present embodiment is manufactured using a circuit board according to the present invention as described above, the cost can be reduced and the product quality can be improved compared with an electro-optical apparatus manufactured using a conventional active matrix board. Note that, in the present embodiment, a liquid crystal electro-optical apparatus was given as an example of the electro-optical apparatus, but application to other electro-optical apparatuses such as organic electroluminescence apparatuses and electrophoretic displays is of course also possible. Moreover, according to the present invention, due to accurately disposing the minute devices in prescribed positions on the final substrate, the ability to follow curvature of the substrate is improved, and by using a flexible substrate, an active matrix board that is flexible, light, and strong against impact when dropped can be provided. Furthermore, an active matrix board having a curved surface such as that of a curved display can be provided.

Fourteenth Embodiment

Figure 28:
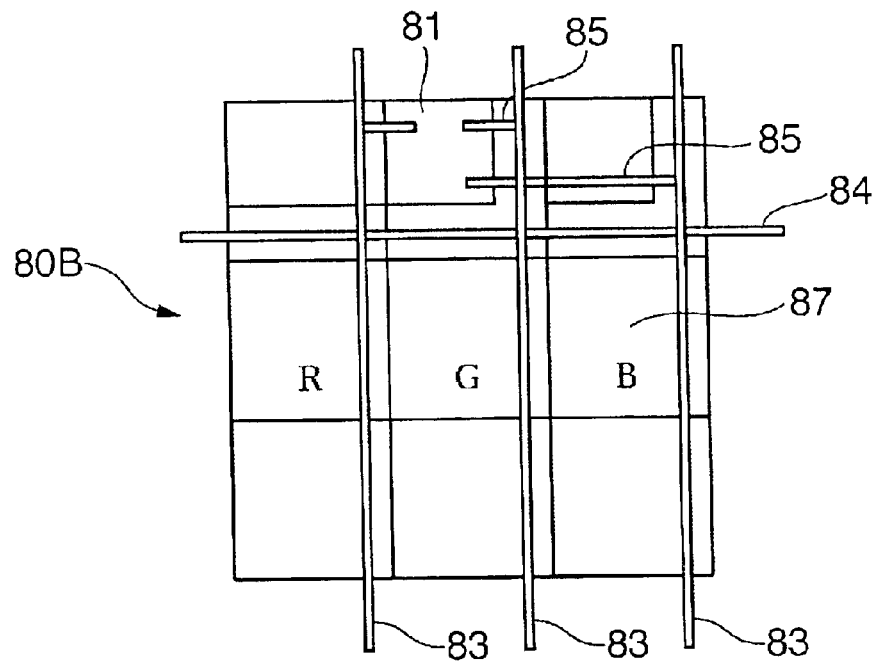
FIG. 28 is a top view showing a second example of the active matrix board.
Figure 29:
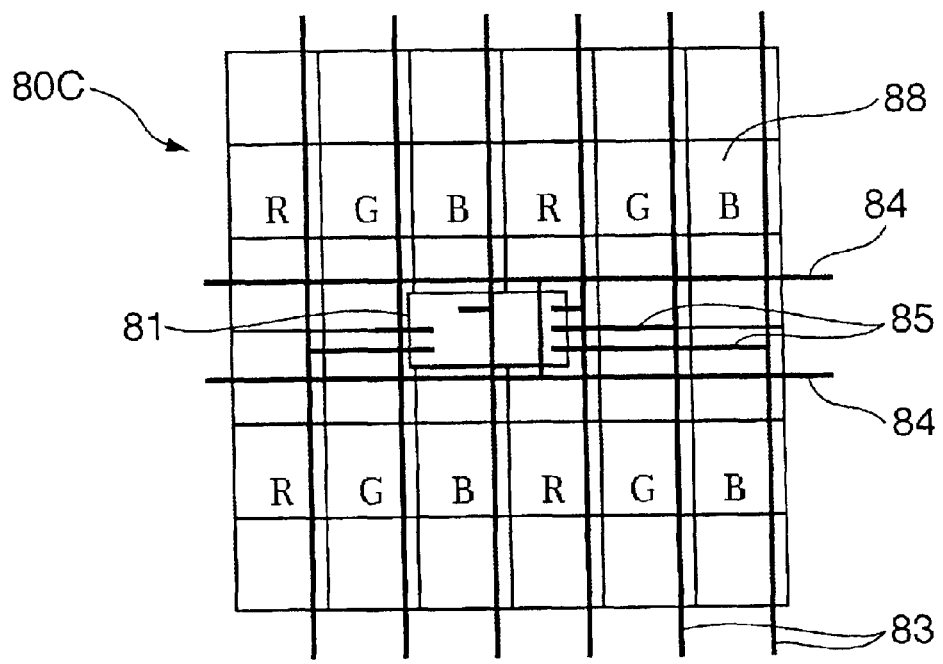
FIG. 29 is a top view showing a third example of the active matrix board.

FIGS. 28 and 29 are drawings for explaining a fourteenth embodiment (circuit board, electro-optical apparatus) of the present invention. In the thirteenth embodiment described above, the driving circuitry 80A was formed by providing a device 81 for each of the RGB pixels 86, but, as shown in FIGS. 28 and 29, by using devices 81 capable of controlling the driving of an RGB unit (FIG. 28) or a plurality of RGB units (FIG. 29) as the devices 81, it is possible to constitute driving circuitry 80B or 80C for which the proportion of the display surface area taken up by the devices 81 is reduced, and hence the display performance of the display can be improved.

Fifteenth Embodiment

Figure 30:
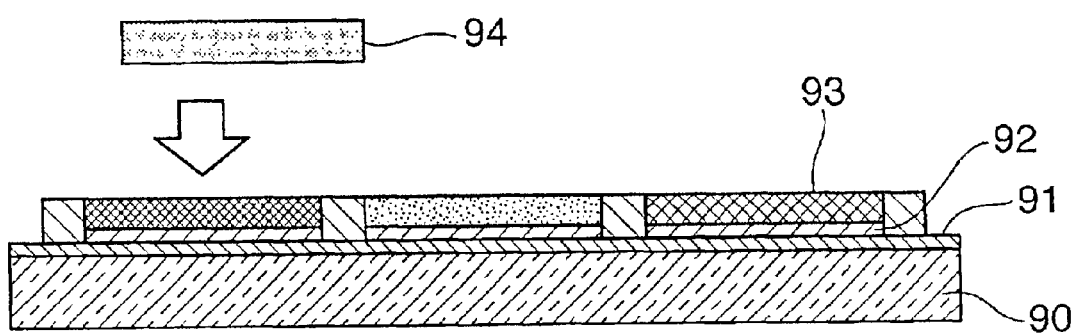
FIG. 30 is a drawing for explaining the structure of an organic electroluminescence apparatus, which is an example of the electro-optical apparatus according to the present invention; it is a sectional view showing a state in which devices are being transferred onto the rear surfaces of EL pixels that have been formed on a final substrate.
Figure 31:
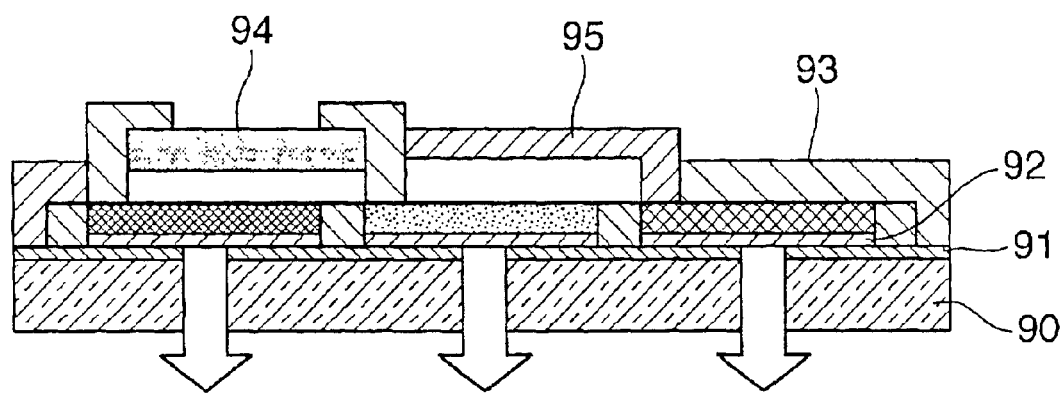
FIG. 31 is a sectional view showing a state in which wiring between the EL pixels and the devices transferred onto the rear surfaces of the EL pixels has been formed.

FIGS. 30 and 31 are drawings for explaining a fifteenth embodiment (electro-optical apparatus (organic electroluminescence apparatus)) of the present invention.

In the present embodiment, an organic electroluminescence apparatus is manufactured by forming EL (electroluminescence) pixels on a final substrate 90, then transferring devices 94 onto the rear surfaces of the pixel parts using the transfer method described earlier in either the first or second embodiment, and then electrically connecting the EL pixels to the devices 94 by wiring 95.

In the present embodiment, the EL pixels are constituted by forming a transparent electrode 91 made of ITO on the final substrate, which comprises a glass substrate, and forming banks that partition the pixels from one another, and then forming luminescent layers 92 comprising a desired luminescent material between the banks, and further forming reflecting electrodes comprising a metal such as aluminum on the luminescent layers 92. The luminescent layers 92 are organic EL devices that use an organic fluorescent material. The luminescent layers 92 may be made to have a single layer structure comprising the organic EL material, or may be made to have a multilayer structure in which the luminescent layer is sandwiched between an electron transporting layer and a hole transporting layer.

Organic EL devices can be driven at a lower voltage than inorganic EL devices, and are characterized in that a high brightness can be obtained, and moreover luminescence of a large variety of colors can be obtained. Examples of organic fluorescent materials that can be used in the luminescent layers 92 include cyanopolyphenylenevinylene, polyphenylenevinylene, polyalkylphenylenes, 2,3,6,7-tetrahydro-11-oxo-1H,5H,11H (1 )benzopyrano[6,7,8-ij]-quinolizine-10-carboxylic acid, 1,1 -bis-(4-N,N-ditolylaminophenyl)cyclohexane, 2-(3',4'-dihydroxyphenyl)-3,5,7-trihydroxy-1-benzopyrylium perchlorate, tris(8-hydroxyquinolinol)aluminum, 2,3,6,7-tetrahydro-9-methyl-11-oxo-1H,5H,11H(1)benzopyrano[6,7,8-ij]-quinolizine, an aromatic diamine derivative (TDP), an oxydiazole dimer (OXD), an oxydiazole derivative (PBD), a distyryl arylene derivative (DSA), quinolinol metal complexes, a beryllium benzoquinolinol complex (Bebq), a triphenylamine derivative (MTDATA), distyryl derivatives, a pyrazoline dimer, rubrene, quinacridone, triazole derivatives, polyphenylene, polyalkylfluorenes, polyalkylthiophenes, an azomethine zinc complex, a porphyrin zinc complex, a benzoxazole zinc complex, and a phenanthroline europium complex.

Conventionally, to manufacture such an organic electroluminescence apparatus, driving circuitry comprising devices has been formed on a glass substrate, and then the EL pixels have been formed in positions not overlapping the devices. However, with this constitution, there is a problem in that the devices are an obstruction, and hence the EL pixel parts become small in area. To resolve this problem, a structure has been proposed in which reflecting electrodes are replaced with transparent electrodes, the reflecting electrodes, luminescent layers and transparent electrodes are formed in this order on the substrate, and light is emitted from the transparent electrode side. However, a transparent electrode material such as ITO must be deposited using sputtering, which requires heat treatment at a high temperature, and hence there is a problem that the organic fluorescent material in the luminescent layers is degraded through the heat treatment during the formation of the transparent electrodes on the luminescent layers. According to the present invention, after forming the EL pixel parts on the glass substrate, the devices can be transferred onto the reflecting electrodes easily and in precise positions, and moreover the devices and the EL pixels can easily be connected together using an ink jet coating method or the like as described in earlier embodiments; it is thus possible to provide the devices on the rear side of the EL pixels so as not to obstruct the luminescent surfaces of the EL pixels, without bringing about degradation of the EL pixel parts, in particular the luminescent layers. The EL pixel parts can thus be made larger in area without the devices obstructing the EL pixels, and hence the display performance is improved.

Sixteenth Embodiment

In the present embodiment, a description is given of a case in which the transfer method of the present invention is used in the manufacture of a memory such as a FeRAM (ferroelectric RAM). The memory according to the present invention is manufactured using a technique like that of the fifteenth embodiment described above, by forming memory parts containing ferroelectric layers of PZT, SBT or the like on a final substrate, then transferring devices containing writing/reading circuitry or the like onto the rear side using the transfer method of one of the embodiments described earlier, and then electrically connecting the memory parts and the devices together by wiring.

A FeRAM has ferroelectric films of PZT, SBT or the like which require a high temperature for deposition, and the deposition must be carried out using sputtering, which requires a high heat treatment temperature; it has thus been the case that, if one attempts to deposit ferroelectric films of PZT, SBT or the like after devices such as TFTs have been formed on the substrate, then there will be a risk of the devices being degraded by the heat. Conventionally, it has thus been difficult to manufacture a FeRAM having an embedded structure in which the memory devices are disposed on top of the circuitry for memory reading/writing. According to the present invention, it is possible to manufacture the FeRAM on the substrate, and then dispose the devices for reading/writing on the rear surface, and hence a memory having an embedded structure for which manufacture has been difficult hitherto can be manufactured easily. Note that the memory is not limited to being a FeRAM as described above, but rather application to various other memories such as SRAMs, DRAMs, NOR type ROMs, NAND type ROMS, floating gate type nonvolatile memories, and magnetic RAMs (MRAMs) is also possible.

Seventeenth Embodiment

Figure 32:
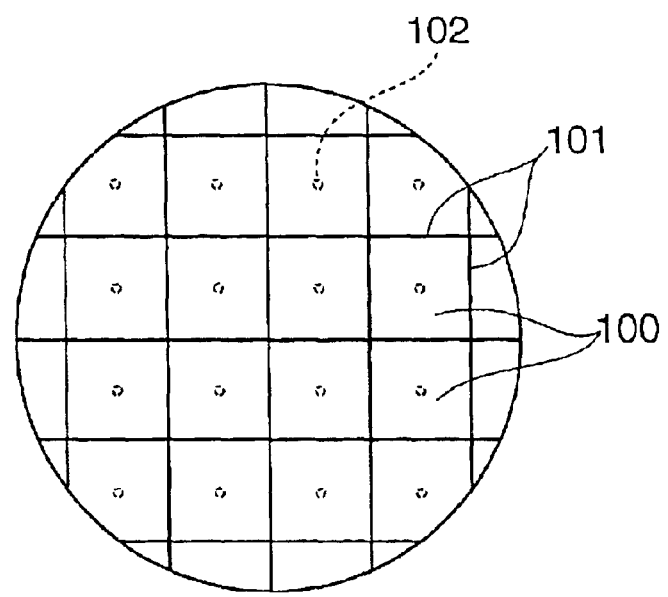
FIG. 32 is an enlarged top view showing monocrystalline silicon blocks that can be used for manufacturing devices used in the present invention.

FIG. 32 is an enlarged view showing schematically thin film monocrystalline silicon minute blocks that can be used for manufacturing devices that use a semiconductor film, which are an example of transferred bodies that can be used in the present invention; in FIG. 32, reference numeral 100 represents the thin film monocrystalline silicon minute blocks (hereinafter referred to as the 'monocrystalline silicon blocks'), and reference numeral 101 represents the grain boundaries dividing the monocrystalline silicon blocks. The monocrystalline silicon blocks 100 are formed in approximately square shapes of side 0.1 to 10 $\mu$m, preferably about 3 $\mu$m.

The monocrystalline silicon blocks 100 can be manufactured using a method called the $\mu$CZ ($\mu$-Czochralski) method (see R. Ishihara et al., Proceedings of SPIE, vol. 4925 (2001), p. 14). In this method, firstly a thin film of amorphous silicon (a-silicon) is deposited using CVD or the like on a substrate that is made of quartz glass or the like and has had formed therein recessed holes 102 at suitable intervals. Next, the amorphous silicon layer is irradiated with excimer laser light, thus temporarily melting the amorphous silicon, and then cooling is allowed to take place, whereupon a thin film of polysilicon (polycrystalline silicon) is formed on the substrate. Next, the polysilicon layer is once again irradiated with laser light, thus melting most of the polysilicon. During this melting, the intensity and irradiation time of the laser light are controlled as appropriate, and hence irradiation with the light is carried out such that only the polysilicon crystal grains in the deepest parts of the holes 102 formed in the substrate remain, whereupon, when the molten silicon recrystallizes after the irradiation with the light, the crystal grains remaining in the deepest parts of the holes act as seed crystals, and monocrystals grow following the crystal orientation of these seed crystals. By optimizing conditions such as the time and temperature during the growth of the monocrystals, it is possible to form on the substrate a silicon thin film in which are gathered together monocrystalline blocks of side a few $\mu$m. Next, using a selective silicon etching technique that is well-known in the field in question, the grain boundaries of the monocrystalline silicon blocks 100 that have been formed are selectively etched, and hence, as shown in FIG. 32, a large number of approximately square-shaped monocrystalline silicon blocks 100 that are separated from one another through the selectively etched grain boundaries 101 are obtained.

Regarding the monocrystalline silicon blocks 100 manufactured in this way, the crystal orientation in each of the blocks is uniform, and there is no degradation of electrical properties caused by the presence of grain boundaries, and hence the monocrystalline silicon blocks 100 have excellent electrical properties as semiconductors. Consequently, by forming devices using blocks comprising one or a plurality of these monocrystalline silicon blocks 100, devices such as TFTs having a higher performance than conventionally can be manufactured. Moreover, according to the present invention, minute devices that have been manufactured using such minute monocrystalline silicon blocks can be transferred accurately and efficiently into desired positions on a final substrate.

For example, by manufacturing the semiconductor film 18 of the TFT (FIGS. 7A and 8) described earlier in the first embodiment using $\mu$-CZ method described above, the semiconductor film 18 can be made to be a monocrystalline semiconductor film, and hence a high-performance TFT device can be provided.

Eighteenth Embodiment

The present eighteenth embodiment relates to an electronic appliance manufactured using the transfer method according to one of the embodiments described above.

FIGS. 33A to 33F show examples of the electronic appliance of the present embodiment.

Figure 33A:
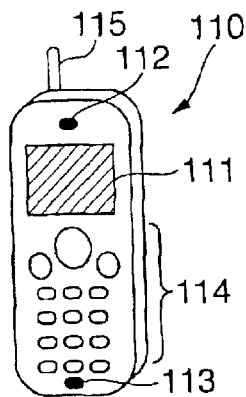
FIG. 33A shows an example of application to a mobile telephone.

FIG. 33A shows an example of a mobile telephone manufactured using the transfer method of the present invention; the mobile telephone 110 comprises an electro-optical apparatus (display panel) 111, a voice output part 112, a voice input part 113, an operating part 114, and an antenna part 115. The transfer method of the present invention is applied, for example, to the display panel 111 and built-in circuit boards.

Figure 33B:
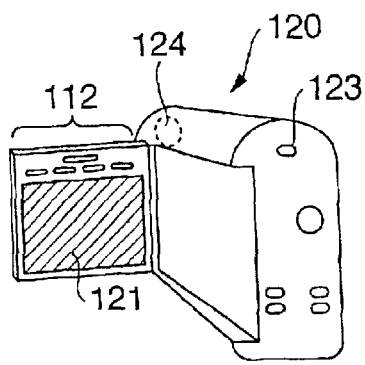
FIG. 33B shows an example of application to a video camera.

FIG. 33B shows an example of a video camera manufactured using the transfer method of the present invention; the video camera 120 comprises an electro-optical apparatus (display panel) 121, an operating part 122, a voice input part 123, and an image-receiving part 124. The transfer method of the present invention is applied, for example, to the display panel 121 and built-in circuit boards.

Figure 33C:
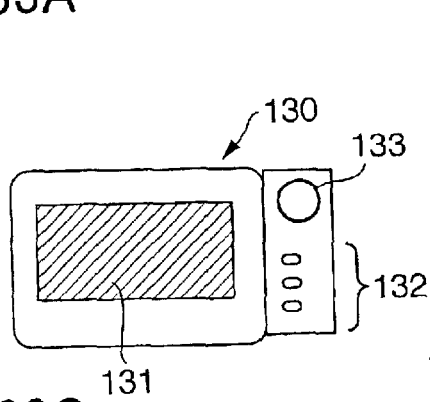
FIG. 33C shows an example of application to a portable personal computer.

FIG. 33C shows an example of a portable personal computer manufactured using the transfer method of the present invention; the computer 130 comprises an electro-optical apparatus (display panel) 131, an operating part 132, and a camera part 133. The transfer method of the present invention is applied, for example, to the display panel 131 and built-in circuit boards.

Figure 33D:
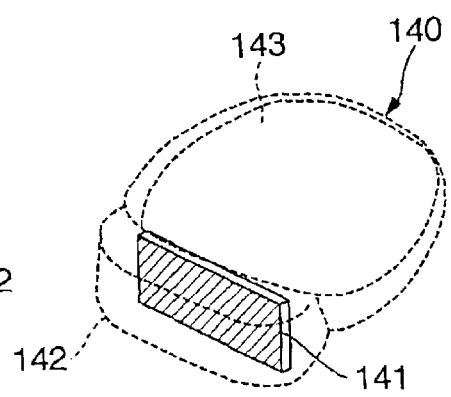
FIG. 33D shows an example of application to a head-mounted display.

FIG. 33D shows an example of a head-mounted display; the head-mounted display 140 comprises an electro-optical apparatus (display panel) 141, an optical system housing part 142, and a band part 143. The transfer method of the present invention is applied, for example, to the display panel 141 and built-in circuit boards.

Figure 33E:
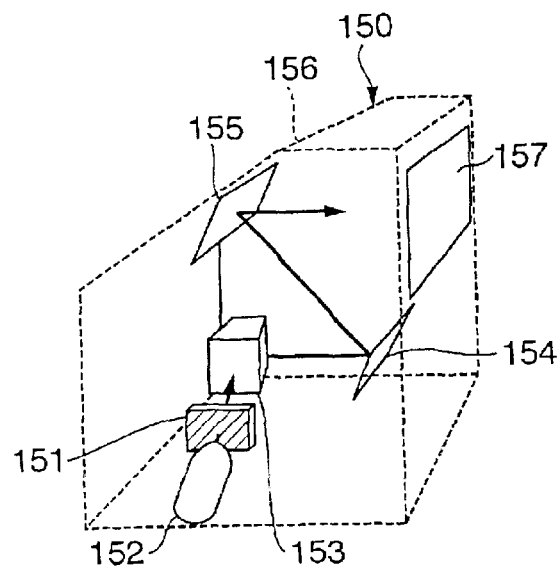
FIG. 33E shows an example of application to a rear type projector.

FIG. 33E shows an example of a rear type projector manufactured using the transfer method of the present invention; the projector 150 comprises an electro-optical apparatus (optical modulator) 151, a light source 152, a composite optical system 153, mirrors 154 and 155, and a screen 157, all housed in a casing 156. The transfer method of the present invention is applied, for example, to the optical modulator 151 and built-in circuit boards.

Figure 33F:
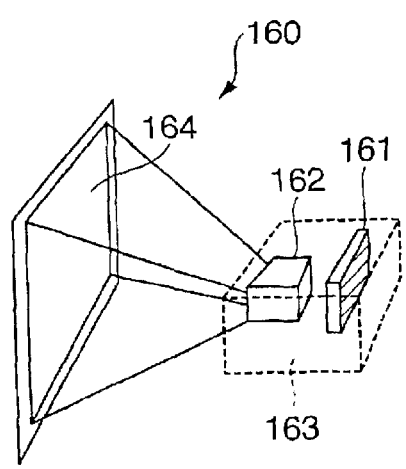
FIG. 33F shows an example of application to a front type projector.

FIG. 33F shows an example of a front type projector manufactured using the transfer method of the present invention; the projector 160 comprises an electro-optical apparatus (image display source) 161 and an optical system 162, which are housed in a casing 163, and is such that images can be displayed on a screen 164. The transfer method of the present invention is applied, for example, to the image display source 161 and built-in circuit boards.

The transfer method according to the present invention can be applied to all kinds of electronic appliances that use devices or circuits, with there being no limitation to the above examples. For example, in addition to the above, the transfer method according to the present invention can also be applied to fax machines having a display function, digital camera viewfinders, portable TVs, DSP apparatuses, PDAs, electronic organizers, electric signboards, displays for advertisements/announcements, and so on.

According to the transfer method of the present invention, various devices can be transferred onto various final substrates. In particular, by using minute devices, it is possible to constitute an electronic appliance for which the ability to follow curvature of the final substrate is excellent. By utilizing these characteristics, regarding the electronic appliance of the present invention, application is also possible to various articles in addition to the electro-optical apparatuses and memories described above.

Nineteenth Embodiment

The present nineteenth embodiment relates to an IC card, this being a preferable example of the electronic appliance in the eighteenth embodiment described above.

Figure 34:
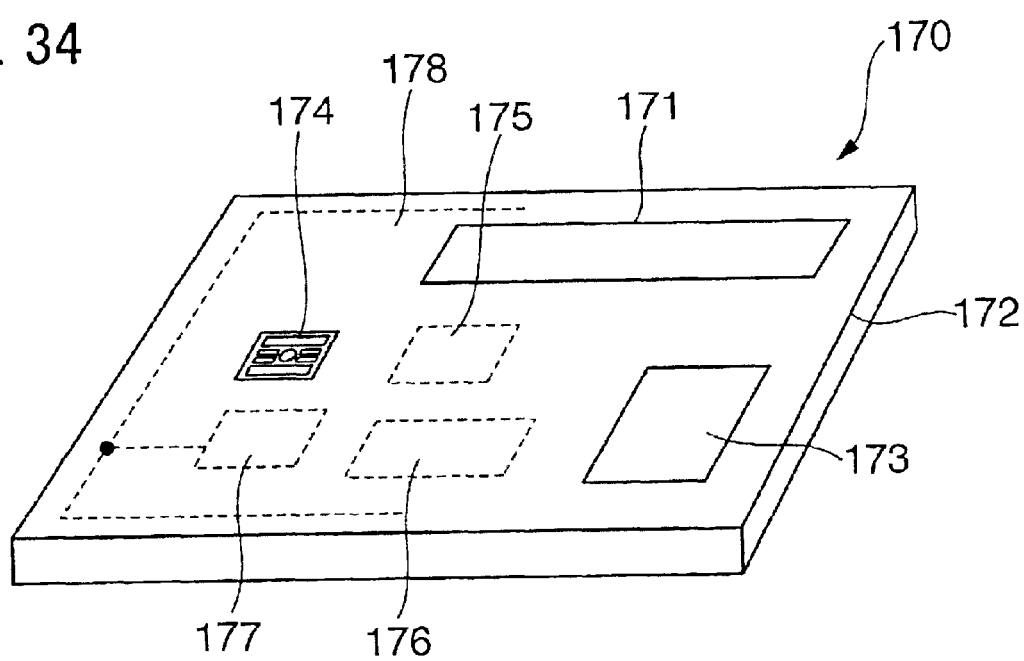
FIG. 34 is a schematic perspective view for explaining the structure of an IC card according to the present invention.

FIG. 34 shows a schematic perspective view of the IC card of the present embodiment. As shown in FIG. 34, the IC card 170 comprises, on a circuit board built into a main body 172, a display panel 171, a fingerprint detector 173, an external terminal 174, a microprocessor 175, a memory 176, communication circuitry 177, and an antenna part 178.

The built-in circuit board is manufactured using the transfer method of the present invention. Specifically, the display panel 171, the fingerprint detector 173, the external terminal 174, the microprocessor 175, the memory 176, the communication circuitry 177 and so on are each made to be chips, and all or some of them are formed in integrated fashion on transfer origin substrates. The chips are transferred from the transfer origin substrates on which the chips have been formed into corresponding positions on the circuit board using the transfer method of the present invention.

The IC card of the present embodiment is thus manufactured by transferring onto a single circuit board chips that have been manufactured efficiently on respectively different substrates.

Note that the transfer method of the present invention can be used in the transfer of various chips, with there being no limitation to the IC card described above.

For example, application is also possible to the mounting of security ICS for preventing forgery on articles such as banknotes, credit cards and prepaid cards.

Moreover, it is also possible to transfer ICs onto a ribbon-like sheet, feed this ribbon-like sheet into a stamp-like small mounting apparatus, and then stick ICs wherever one wishes as with a stamp.

Furthermore, if minute IC chips are transferred onto any of various articles such as the tip of an optical fiber to form a structure able to function as a sensor, then novel electronic appliances can be provided in the medical and biotechnology fields.

Moreover, according to the present invention, if devices having excellent ability to follow curvature are transferred onto a substrate having a curved surface, then mounting on curved displays, bodies of automobiles and aircraft, and so on is possible.

Furthermore, in the case of a non-contact type data communication system that uses microwaves, if minute ICs are transferred onto a cheap tag, then a non-contact type tag can be manufactured with a low manufacturing cost.

Moreover, by transferring minute ICs or the like onto fibers, wearable functional wear can also be constituted.

(Industrial Applicability)

According to the transfer method of the present invention, a large number of transferred bodies that are to be disposed on a transfer destination substrate in scattered locations with spaces therebetween can be manufactured concentrated together on a transfer origin substrate, and hence compared with the case that the transferred bodies are formed on the transfer destination substrate directly, the area efficiency in the manufacture of the transferred bodies can be greatly improved, and a transfer destination substrate on which a large number of transferred bodies are disposed in scattered locations can be manufactured efficiently and cheaply.

Moreover, according to the transfer method of the present invention, it becomes easy to carry out selection and elimination before transfer on a large number of transferred bodies that have been manufactured concentrated together on a transfer origin substrate, and hence the product yield can be improved.

Furthermore, according to the transfer method of the present invention, transferred bodies that are either the same as or different to one another can be built up on one another and combined, and hence by combining transferred bodies that are manufactured under different process conditions to one another, it is possible to provide transferred bodies having a layered structure for which manufacture has been difficult hitherto, and moreover devices having a three-dimensional structure can be manufactured easily.

What is claimed is:

1. A transfer method for transferring a transferred body, comprising:

forming a transfer layer on a transfer origin substrate;

forming a plurality of transferred bodies on the transfer layer, each of the plurality of transferred bodies including a circuit device;

applying energy to a partial region of the transfer layer corresponding to each of said transferred bodies to be transferred; and transferring said transferred bodies corresponding to the partial region onto a transfer destination substrate.

2. The transfer method according to claim 1, further comprising dividing the plurality of said transferred bodies into a plurality of regions, and the transferring of said transferred bodies comprising applying said energy to one or more of said plurality of regions.

3. The transfer method according to claim 1, the transferring of said transferred bodies onto said transfer destination substrate comprising making said transfer origin substrate face the transfer destination substrate, and forming an adhesive layer on at least either said said transferred bodies or said transfer destination substrate.

4. The transfer method according to claim 1, further comprising:

before the forming of said transferred bodies, forming a peeling layer on said transfer origin substrate; and after the forming of said transferred bodies, dividing at least either said transferred bodies or said peeling layer into a plurality of regions.

5. The transfer method according to claim 1, transferring of said transferred bodies onto said transfer destination substrate comprising irradiating light as said energy.

6. The transfer method according to claim 1, further comprising:

shifting the relative position between nozzles that discharge a material and said substrate; and discharging said material from said nozzles.

7. The transfer method according to claim 1, the forming of said transferred bodies comprising forming region dividing sections that guide said transferred bodies during said transfer such that said transferred bodies are divided along outer peripheries of said partial regions.

8. The transfer method according to claim 7, the forming of said transferred bodies further comprising forming a projecting structure that demarcates the regions of said transferred bodies as said region dividing sections.

9. The transfer method according to claim 7, the forming of said transferred bodies further comprising forming grooves at boundaries between the regions of said transferred bodies as said region dividing sections.

10. The transfer method according to claim 1, the forming of said transferred bodies comprising forming devices or circuits having the same constitution as one another as said plurality of said transferred bodies.

11. The transfer method according to claim 1, the forming of said transferred bodies comprising forming devices or circuits having a different constitution to one another as said plurality of said transferred bodies.

12. A method of manufacturing thin film devices comprising the transfer method according to claim 1, the thin film devices including thin film devices as said transferred bodies.

13. A method of manufacturing integrated circuits comprising the transfer method according to claim 1, the integrated circuits including integrated circuits as said transferred bodies.

14. A method of manufacturing a circuit board, comprising the transfer method according to claim 1.

15. A method of manufacturing an electro-optical apparatus, comprising the transfer method according to claim 1.

16. A transfer method for transferring a transferred body, comprising:

forming a transfer layer on a transfer origin substrate;

forming a plurality of transferred bodies on the transfer layer, each of the plurality of transferred bodies including a circuit device;

applying energy to partial regions of the transfer layer corresponding to said transferred bodies to be transferred; and transferring said transferred bodies corresponding to the partial regions onto transfer destination substrates;

the transferring onto said transfer destination substrates comprising, after transferring said transferred bodies onto one of said transfer destination substrates, repeating the applying of energy to other partial regions corresponding to other said transferred bodies on said transfer origin substrate, and transferring said other said transferred bodies corresponding to the other partial regions onto other said transfer destination substrates.

17. A transfer method for transferring transferred bodies, comprising:

forming a transfer layer on a transfer origin substrate;

forming a plurality of transferred bodies on the transfer layer, each of the plurality of transferred bodies including a circuit device;

transferring said transferred bodies from said transfer origin substrate onto an intermediate transfer substrate; and transferring said transferred bodies from said intermediate transfer substrate onto a transfer destination substrate;

at least either the transferring of said transferred bodies onto said intermediate transfer substrate or the transferring of said transferred bodies onto said transfer destination substrate, comprising applying energy to partial regions of the transfer layer corresponding to said transferred bodies to be transferred, and transferring said transferred bodies formed in the partial regions.

18. The transfer method according to claim 17, further comprising:

dividing the plurality of said transferred bodies into a plurality of regions, and at least either the transferring onto said intermediate transfer substrate or the transferring onto said transfer destination substrate comprising applying said energy to one or more of said plurality of regions.

19. The transfer method according to claim 17, the transferring of said transferred bodies onto said intermediate transfer substrate comprising making said transfer origin substrate face said intermediate transfer substrate, and forming an adhesive layer on at least either said transferred bodies or said intermediate transfer substrate.

20. The transfer method according to claim 17, the transferring of said transferred bodies onto said transfer destination substrate comprising making said intermediate transfer substrate face said transfer destination substrate, and forming an adhesive layer on at least either said transferred bodies or said transfer destination substrate.

21. The transfer method according to claim 17, further comprising:

before the forming of said transferred bodies, forming a peeling layer on said transfer origin substrate; and after the forming of said transferred bodies, dividing at least either said transferred bodies or said peeling layer into said plurality of regions.

22. The transfer method according to claim 17, at least either the transferring onto said intermediate transfer substrate or the transferring onto said transfer destination substrate comprising irradiating light is as said energy.

23. The transfer method according to claim 17, further comprising:

shifting the relative position between nozzles that discharge a material and said substrate; and discharging said material from said nozzles.

24. The transfer method according to claim 17, the forming of said transferred bodies comprising forming region dividing sections that guide said transferred bodies during said transfer such that said transferred bodies are divided along outer peripheries of said partial regions.

25. The transfer method according to claim 24, the forming of said transferred bodies further comprising forming a projecting structure that demarcates the regions of said transferred bodies as said region dividing sections.

26. The transfer method according to claim 24, the forming of said transferred bodies further comprising forming grooves at boundaries between the regions of said transferred bodies as said region dividing sections.

27. The transfer method according to claim 17, the forming of said transferred bodies comprising forming devices or circuits having the same constitution as one another as said transferred bodies.

28. The transfer method according to claim 17, the forming of said transferred bodies comprising forming devices or circuits having a different constitution to one another as said transferred bodies.

29. A method of manufacturing thin film devices comprising the transfer method according to claim 17, the thin film devices including thin film devices as said transferred bodies.

30. A method of manufacturing integrated circuits comprising the transfer method according to claim 17, the integrated circuits including integrated circuits as said transferred bodies.

31. A method of manufacturing a circuit board, comprising the transfer method according to claim 17.

32. A method of manufacturing an electro-optical apparatus, comprising the transfer method according to claim 17.

33. A transfer method for transferring transferred bodies, comprising:

forming a transfer layer on a transfer origin substrate;

forming a plurality of transferred bodies on the transfer layer, each of the plurality of transferred bodies including a circuit device;

transferring said transferred bodies from said transfer origin substrate onto an intermediate transfer substrate; and transferring said transferred bodies from said intermediate transfer substrate onto transfer destination substrates;

at least either the transferring of said transferred bodies onto said intermediate transfer substrate or the transferring of said transferred bodies onto said transfer destination substrates, comprising applying energy to partial regions of the transfer layer corresponding to said transferred bodies to be transferred, and transferring said transferred bodies formed in the partial regions; and the transferring onto said transfer destination substrates comprising, after transferring said transferred bodies onto one of said transfer destination substrates, repeating the applying of energy to other partial regions corresponding to other said transferred bodies on said transfer origin substrate, and transferring said other transferred bodies corresponding to the other partial regions onto another one of said transfer destination substrates.

34. A transfer method for transferring a transferred body, comprising:

forming a transfer layer on a transfer origin substrate;

forming a plurality of transferred bodies by patterning the transfer layer on the transfer origin substrate;

applying energy to a partial region of the transfer layer corresponding to each of said transferred bodies to be transferred; and transferring said transferred bodies corresponding to the partial region onto a transfer destination substrate.

35. A transfer method for transferring a transferred body, comprising:

forming a transfer layer on a transfer origin substrate;

forming a plurality of transferred bodies by patterning the transfer layer on the transfer origin substrate; and applying energy to partial regions of the transfer layer corresponding to said transferred bodies to be transferred; and transferring said transferred bodies corresponding to the partial regions onto transfer destination substrates;

the transferring onto said transfer destination substrates comprising, after transferring said transferred bodies onto one of said transfer destination substrates, repeating the applying of energy to other partial regions corresponding to other said transferred bodies on said transfer origin substrate, and transferring said other said transferred bodies corresponding to the other partial regions onto other said transfer destination substrates.

* * * * *